United States Patent
Hoshino et al.

(10) Patent No.: US 12,204,200 B2
(45) Date of Patent: Jan. 21, 2025

(54) POLARIZER AND IMAGE DISPLAY DEVICE

(71) Applicant: FUJIFILM Corporation, Tokyo (JP)

(72) Inventors: Wataru Hoshino, Kanagawa (JP); Yoshiaki Takada, Kanagawa (JP); Yuzo Fujiki, Kanagawa (JP); Kengo Saito, Kanagawa (JP); Yasuhiro Ishiwata, Kanagawa (JP); Takashi Katou, Kanagawa (JP); Keisuke Ushirogata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/421,734

(22) Filed: Jan. 24, 2024

(65) Prior Publication Data

US 2024/0241403 A1 Jul. 18, 2024

Related U.S. Application Data

(63) Continuation of application No. 17/028,153, filed on Sep. 22, 2020, now Pat. No. 11,921,369, which is a
(Continued)

(30) Foreign Application Priority Data

Mar. 30, 2018 (JP) .................................. 2018-067687

(51) Int. Cl.
*G02F 1/1335* (2006.01)
*C09K 19/04* (2006.01)
(Continued)

(52) U.S. Cl.
CPC ........ *G02F 1/133528* (2013.01); *C09K 19/04* (2013.01); *C09K 19/0403* (2013.01);
(Continued)

(58) Field of Classification Search
CPC ............... C09K 19/04; C09K 19/0403; C09K 2323/031; G02B 1/08; G02F 1/133528
See application file for complete search history.

(56) References Cited

U.S. PATENT DOCUMENTS

2006/0182902 A1  8/2006  Yonehama et al.
2007/0024970 A1  2/2007  Lub et al.
(Continued)

FOREIGN PATENT DOCUMENTS

CN  102171592 A  8/2011
CN  102822704 A  12/2012
(Continued)

OTHER PUBLICATIONS

International Search Report issued in PCT/JP2019/013156 on Jul. 2, 2019.
(Continued)

*Primary Examiner* — Sophie Hon
(74) *Attorney, Agent, or Firm* — Edwards Neils LLC; Jean C. Edwards, Esq.

(57) ABSTRACT

A polarizer with a high degree of alignment and an image display device including the polarizer. The polarizer is formed of a polarizer-forming composition containing a liquid crystal compound, a first dichroic material, and a second dichroic material, in which the polarizer has an array structure formed of the first dichroic material and the second dichroic material.

13 Claims, 6 Drawing Sheets

Related U.S. Application Data continuation of application No. PCT/JP2019/013156, filed on Mar. 27, 2019.

(51) Int. Cl.
  *G02B 1/08* (2006.01)
  *G02B 5/30* (2006.01)
(52) U.S. Cl.
  CPC ........ *G02B 1/08* (2013.01); *C09K 2019/0444* (2013.01); *C09K 2323/031* (2020.08); *G02B 5/3016* (2013.01)

(56) References Cited

U.S. PATENT DOCUMENTS

| | | | |
|---|---|---|---|
| 2011/0177315 | A1 | 7/2011 | Iwahashi et al. |
| 2012/0075568 | A1 | 3/2012 | Chang et al. |
| 2013/0070899 | A1 | 3/2013 | Morishima et al. |
| 2018/0346633 | A1 | 12/2018 | Hoshino et al. |
| 2021/0055604 | A1 | 2/2021 | Hoshino et al. |

FOREIGN PATENT DOCUMENTS

| | | |
|---|---|---|
| CN | 111902752 B | 6/2022 |
| JP | 2011-237513 A | 11/2011 |
| JP | 2013-205741 A | 10/2013 |
| JP | 2013-210624 A | 10/2013 |
| JP | 2018-022152 A | 2/2018 |
| JP | 2018-036516 A | 3/2018 |
| JP | 6778353 B2 | 10/2020 |
| JP | 7280229 B2 | 5/2023 |
| KR | 102501060 B1 | 2/2023 |
| WO | 2005/035667 A1 | 4/2005 |
| WO | 2010/038817 A1 | 4/2010 |
| WO | 2017/154907 A1 | 9/2017 |

OTHER PUBLICATIONS

Written Opinion issued in PCT/JP2019/013156 on Jul. 2, 2019.
International Preliminary Report on Patentability completed by WIPO on Oct. 6, 2020 in connection with International Patent Application No. PCT/JP2019/013156.
Office Action, issued by the Japanese Patent Office on Jun. 2, 2020, in connection with Japanese Patent Application No. 2020-509186.
Notice of Reasons for Revocation issued by the Japanese Patent Office on Jul. 2, 2021, in connection with Japanese Patent Application No. 2020-509186.
Office Action, issued by the State Intellectual Property Office on Oct. 19, 2021, in connection with Chinese Patent Application No. 201980022056.8.
Office Action, issued by the Korean Intellectual Property Office on Jul. 20, 2022, in connection with corresponding Korean Patent Application No. 10-2020-7027282.
Wikipedia, Complementary colors, Dec. 2022, Wikipedia Foundation, Inc. [online], [retrieved on Jan. 8, 2023]. Retrieved from the Internet <URL: https://en.wikipedia.org/wiki/Complementary_colors> (Year: 2022).
Complementary Colors, Electromagnetic Spectrum, Atomic Spectroscopy and Light, Virtual Chemistry Lab, Harper College [online], [retrieved on Jan. 8, 2023]. Retrieved from the Internet <URL:http://dept.harpercollege.edu/chemistry/chm/100/dgodambe/thedisk/spec/complem.htm> (Year: 2023).
Non-Final Office Action issued in U.S. Appl. No. 17/028,153 on Jan. 26, 2023.
Final Office Action issued in U.S. Appl. No. 17/028,153 on Aug. 1, 2023.

POLARIZER AND IMAGE DISPLAY DEVICE

CROSS-REFERENCE TO RELATED APPLICATIONS

The present application is a Continuation of U.S. application Ser. No. 17/028,153, filed Sep. 22, 2020, which is a Continuation of PCT International Application No. PCT/JP2019/013156 filed on Mar. 27, 2019, which claims priority under 35 U.S.C. § 119(a) to Japanese Patent Application No. 2018-067687 filed on Mar. 30, 2018. The above applications are hereby expressly incorporated by reference, in their entirety, into the present application.

BACKGROUND OF THE INVENTION

1. Field of the Invention

The present invention relates to a polarizer and an image display device.

2. Description of the Related Art

In the related art, in a case where an attenuation function, a polarization function, a scattering function, a light-shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode (OLED) to prevent reflection of external light.

In the related art, iodine has been widely used as a dichroic material in these polarizers, but a polarizer that uses an organic coloring agent in place of iodine as a dichroic material has also been examined.

For example, WO2017/154907A discloses a polarizer-forming composition which contains a polymer liquid crystal compound and a dichroic material.

SUMMARY OF THE INVENTION

As a result of preparation of a polarizer with reference to the examples of WO2017/154907A and evaluation of the degree of alignment thereof which are conducted by the present inventors under the above-described circumstance, it was clarified that further improvement of the degree of alignment is desirable in consideration of improvement of the performance of an image display device or the like expected in the future.

Further, in consideration of the above-described circumstances, an object of the present invention is to provide a polarizer with a high degree of alignment and an image display device including the polarizer.

As a result of intensive examination conducted by the present inventors in order to achieve the above-described object, it was found that the degree of alignment is improved in a case where a polarizer which is formed of a polarizer-forming composition containing a liquid crystal compound, a first dichroic material, and a second dichroic material has an array structure formed of the first dichroic material and the second dichroic material, thereby completing the present invention.

That is, the present inventors found that the above-described problems can be solved by employing the following configurations.

[1] A polarizer which is formed of a polarizer-forming composition containing a liquid crystal compound, a first dichroic material, and a second dichroic material, in which the polarizer has an array structure formed of the first dichroic material and the second dichroic material.

[2] The polarizer according to [1], in which the first dichroic material and the second dichroic material in the array structure form an associate.

[3] The polarizer according to [1] or [2], in which an absolute value of a difference between a maximum absorption wavelength $\lambda 2$ in an absorption spectrum of a film formed of a composition that contains the second dichroic material and the liquid crystal compound but does not contain the first dichroic material and a maximum absorption wavelength $\lambda$ in a difference spectrum between an absorption spectrum of the polarizer and an absorption spectrum of the film formed of the composition that contains the first dichroic material and the liquid crystal compound but does not contain the second dichroic material is greater than 2 nm.

[4] The polarizer according to any one of [1] to [3], in which an absolute value of a difference between a maximum absorption wavelength $\lambda 4$ in an absorption spectrum of a film formed of the composition that contains the first dichroic material and the liquid crystal compound but does not contain the second dichroic material and a maximum absorption wavelength $\lambda 1$ in an absorption spectrum of the polarizer is greater than 2 nm.

[5] The polarizer according to any one of [1] to [4], in which, in the array structure, the first dichroic material and the second dichroic material form a crystal structure.

[6] The polarizer according to any one of [1] to [5], in which an intensity of a peak O1 of a periodic structure derived from the second dichroic material in an X-ray diffraction spectrum of the polarizer is different from an intensity of a peak O2 of the periodic structure derived from the second dichroic material in an X-ray diffraction spectrum of a film formed of the composition that contains the second dichroic material and the liquid crystal compound but does not contain the first dichroic material.

[7] The polarizer according to [6], in which a ratio of the intensity of the peak O1 to the intensity of the peak O2 is less than 1.

[8] The polarizer according to any one of [1] to [7], in which in a case where an X-ray diffraction spectrum of the polarizer is measured, a peak OM of a periodic structure derived from the first dichroic material and the second dichroic material is detected at a diffraction angle which is different from both a diffraction angle at which a peak M2 of the periodic structure derived from the first dichroic material is detected in the X-ray diffraction spectrum of the film formed of the composition that contains the first dichroic material and the liquid crystal compound but does not contain the second dichroic material and a diffraction angle at which the peak O2 of the periodic structure derived from the second dichroic material is detected in the X-ray diffraction spectrum of the film formed of the composition that contains the second dichroic material and the liquid crystal compound but does not contain the first dichroic material.

[9] The polarizer according to any one of [1] to [8], in which a stabilization energy indicating an energy loss in a case where one dichroic material of the first dichroic material and the second dichroic material is incorporated into a structure singly formed of the other dichroic material that is arranged therein is less than 72 kcal/mol.

[10] The polarizer according to [9], in which the stabilization energy is 55 kcal/mol or less.

[11] The polarizer according to [9] or [10], in which the stabilization energy is 35 kcal/mol or less.

[12] The polarizer according to any one of [1] to [11], in which the first dichroic material is a dichroic material having a maximum absorption wavelength in a range of 560 nm to 700 nm, and the second dichroic material is a dichroic material having a maximum absorption wavelength at 455 nm or greater and less than 560 nm.

[13] The polarizer according to any one of [1] to [12], in which an absolute value of a difference between a log P value of a side chain of the first dichroic material and a log P value of a side chain of the second dichroic material is 2.30 or less.

[14] The polarizer according to any one of [1] to [13], in which the polarizer further contains a third dichroic material having a maximum absorption wavelength at 380 nm or greater and less than 455 nm.

[15] An image display device comprising: the polarizer according to any one of [1] to [14].

As described below, according to the present invention, it is possible to provide a polarizer with a high degree of alignment and an image display device including the polarizer.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Respective components may be used alone or in combination of two or more kinds thereof. Here, in a case where two or more kinds of respective components are used in combination, the content of the components indicates the total content unless otherwise specified.

Further, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Polarizer]

A polarizer according to the embodiment of the present invention is a polarizer formed of a polarizer-forming composition containing a liquid crystal compound, a first dichroic material, and a second dichroic material, in which the polarizer has an array structure formed of the first dichroic material and the second dichroic material.

The present inventors found that the degree of alignment may be increased in a case where a polarizer containing the first dichroic material and the second dichroic material is produced. As a result of examining the details of this reason, it was found that the positional relationship between the first dichroic material and the second dichroic material in the polarizer is closely related to the degree of alignment, and thus the degree of alignment is increased in a case where the first dichroic material and the second dichroic material form an array structure.

In the present invention, the array structure formed of the first dichroic material and the second dichroic material indicates a state in which one or more molecules of the first dichroic material and one or more molecules of the second dichroic material are aggregated to form an aggregate in the polarizer and a plurality of molecules of the dichroic materials are periodically arranged in the aggregate.

Figure 1:
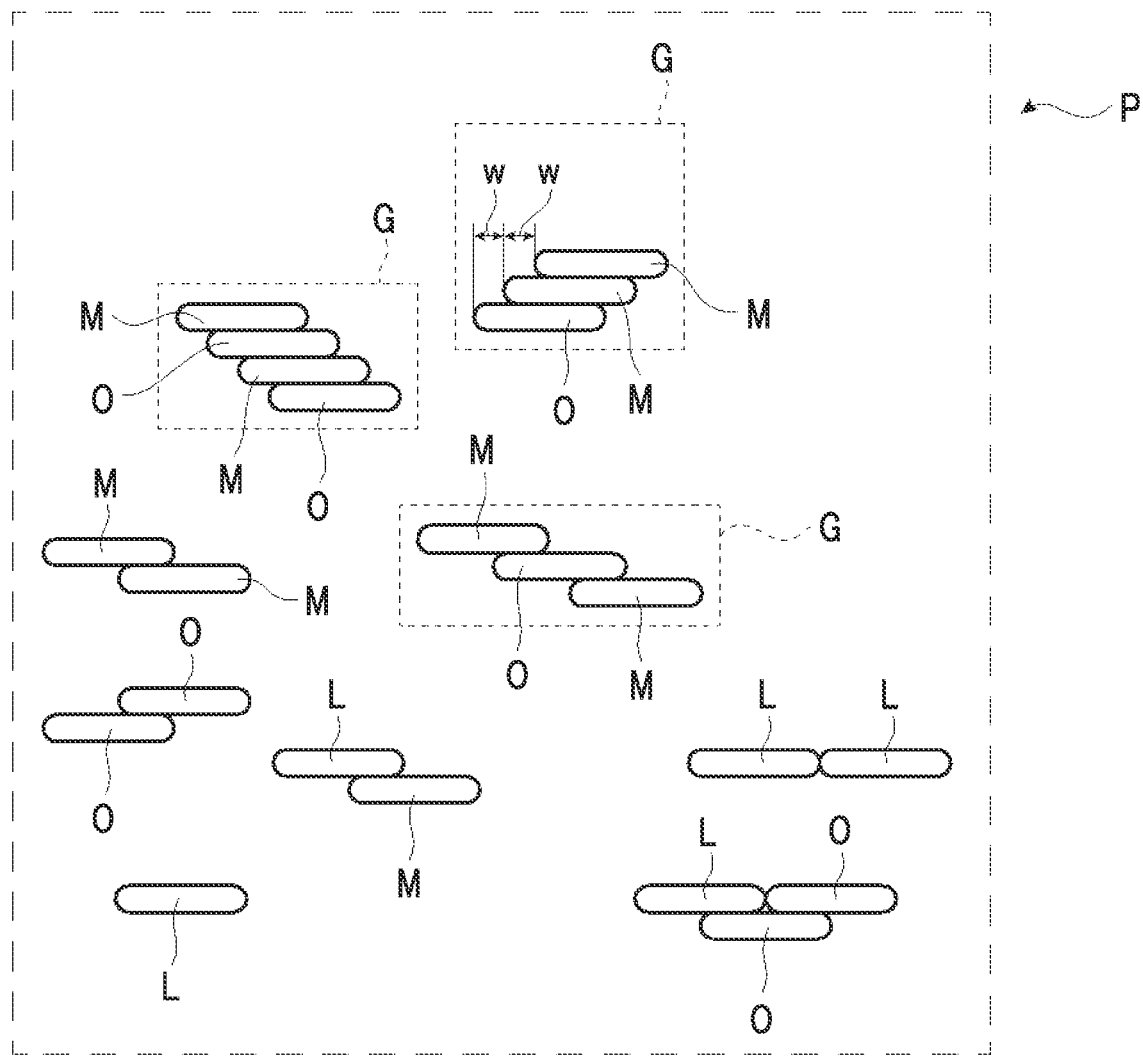
FIG. 1 is a conceptual view showing an example of a state in which a first dichroic material and a second dichroic material form an array structure.

FIG. 1 is a conceptual view showing an example of the state in which the first dichroic material and the second dichroic material form an array structure. A polarizer P has a molecule M of the first dichroic material, a molecule O of the second dichroic material, and a molecule L of the liquid crystal compound. As shown in FIG. 1, an aggregate G having the molecule M and the molecule O is formed, the major axis directions of the molecule M and the molecule O are aligned along the same direction in the aggregate G, and the molecule M and the molecule O are arranged so as to be shifted in a period of a width w.

Figure 2:
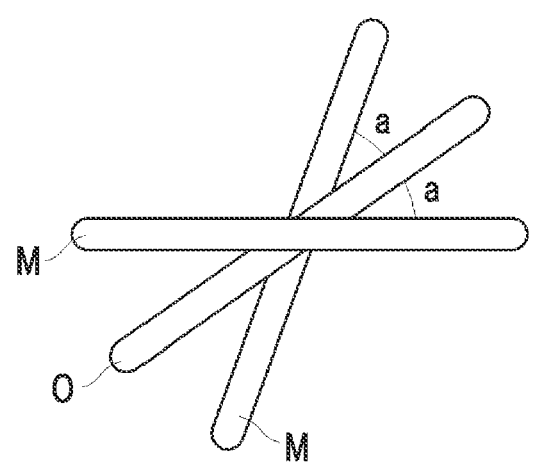
FIG. 2 is a conceptual view showing an example of the array structure formed of the first dichroic material and the second dichroic material.

The array structure formed of the first dichroic material and the second dichroic material is not limited to the array structure shown in FIG. 1. For example, as shown in FIG. 2, the molecule M and the molecule O may be arranged so as to be shifted in a period of an angle a.

Further, the first dichroic material may be polymerized in the polarizer. Similarly, the second dichroic material may also be polymerized in the polarizer.

[Polarizer-Forming Composition]

The polarizer-forming composition (hereinafter, also referred to as the "present composition") used for forming the polarizer according to the embodiment of the present invention contains a liquid crystal compound, a first dichroic material, and a second dichroic material. The present composition may contain a third dichroic material, a solvent, a polymerization initiator, an interface modifier or other components other than those described above as necessary.

Hereinafter, each component will be described.

<Liquid Crystal Compound>

The present composition contains a liquid crystal compound. In a case where the composition contains a liquid crystal compound, the dichroic materials can be aligned with a high degree of alignment while the precipitation of the dichroic materials is suppressed.

The liquid crystal compound is a liquid crystal compound that does not exhibit dichroism.

As the liquid crystal compound, any of a low-molecular-weight liquid crystal compound and a polymer liquid crystal compound can be used. Here, the "low-molecular-weight liquid crystal compound" indicates a liquid crystal compound having no repeating unit in the chemical structure. The "polymer liquid crystal compound" indicates a liquid crystal compound having a repeating unit in the chemical structure.

Examples of the low-molecular-weight liquid crystal compound include liquid crystal compounds described in JP2013-228706A.

Examples of the polymer liquid crystal compound include thermotropic liquid crystal polymers described in JP2011-237513A. Further, the polymer liquid crystal compound may have a crosslinkable group (such as an acryloyl group or a methacryloyl group) at a terminal.

The liquid crystal compound may be used alone or in combination of two or more kinds thereof.

The content of the liquid crystal compound is preferably in a range of 25 to 2000 parts by mass, more preferably in a range of 33 to 1000 parts by mass, and still more preferably in a range of 50 to 500 parts by mass with respect to 100 parts by mass which is the content of the dichroic materials in the present composition. In a case where the content of the liquid crystal compound is in the above-described range, the degree of alignment of the polarizer is further improved.

From the viewpoint that the effects of the present invention are more excellent, it is preferable that the liquid crystal compound is a polymer liquid crystal compound having a repeating unit represented by Formula (1) (hereinafter, also referred to as a "repeating unit (1)").

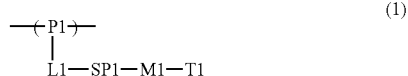
(1)

In Formula (1), P1 represents a main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

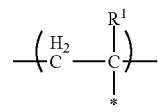
(P1-A)

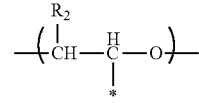
(P1-B)

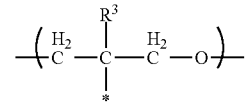
(P1-C)

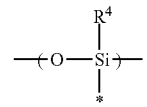
(P1-D)

In Formulae (P1-A) to (P1-D), "*" represents a bonding position with respect to L1 in Formula (1). In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound having the epoxy group.

It is preferable that the group represented by Formula (P1-C) is a propylene glycol unit formed by ring-opening polymerization of an oxetane group of a compound having the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^4(OR^5)_2$—. In the formula, $R^4$ has the same definition as that for $R^4$ in (P1-D), and a plurality of $R^5$'s each independently represent a hydrogen atom or an alkyl group having 1 to 10 carbon atoms.

L1 represents a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent.

In a case where P1 represents a group represented by Formula (P1-A), from the viewpoint that the effects of the present invention are more excellent, it is preferable that L1 represents a group represented by —C(O)O—.

In a case where P1 represents a group represented by any of Formulae (P1-B) to (P1-D), from the viewpoint that the effects of the present invention are more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—$(CH_2—CH_2O)_{n1}$—* is preferable. In the formula, n1 represents an integer of 1 to 20, and "*" represents a bonding position with respect to L1 or M1 in Formula (1). From the viewpoint that the effects of the present invention are more excellent, n1 represents preferably an integer of 2 to 10, more preferably an integer of 2 to 4, and most preferably 3.

Further, from the viewpoint that the effects of the present invention are more excellent, a group represented by *—$(CH(CH_3)—CH_2O)_{n2}$—* is preferable as the oxypropylene structure represented by SP1. In the formula, n2 represents an integer of 1 to 3, and "*" represents a bonding position with respect to L1 or M1.

Further, from the viewpoint that the effects of the present invention are more excellent, a group represented by *—$(Si(CH_3)_2—O)_{n3}$—* is preferable as the polysiloxane structure represented by SP1. In the formula, n3 represents an integer of 6 to 10, and "*" represents a bonding position with respect to L1 or M1.

Further, from the viewpoint that the effects of the present invention are more excellent, a group represented by *—$(CF_2—CF_2)_{n4}$—* is preferable as the alkylene fluoride structure represented by SP1. In the formula, n4 represents an integer of 6 to 10, and "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and can refer to, for example, description on pages 7 to 16 of "FlussigeKristalle in Tabellen II" (VEB Deutsche Verlag fur Grundstoff Industrie, Leipzig, 1984) and the description in Chapter 3 of "Liquid Crystal Handbook" (Maruzen, 2000) edited by Liquid Crystals Handbook Editing Committee.

As the mesogen group, for example, a group having at least one cyclic structure selected from the group consisting of an aromatic hydrocarbon group, a heterocyclic group, and an alicyclic group is preferable.

From the viewpoint that the effects of the present invention are more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group, a group represented by Formula (M1-A) or Formula (M1-B) is preferable, and a group represented by Formula (M1-B) is more preferable.

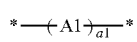
(M1-A)

(M1-B)

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

The divalent group represented by A1 is preferably a 4- to 6-membered ring. Further, the divalent group represented by A1 may be a single ring or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

The atoms other than carbon constituting the divalent aromatic heterocyclic group include a nitrogen atom, a sulfur atom and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention are more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention are more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint that the effects of the present invention are more excellent, —C(O)O— is preferable. LA1 may represent a group obtained by combining two or more of these groups.

Specific examples of M1 include the following structures. In the following specific examples, "Ac" represents an acetyl group.

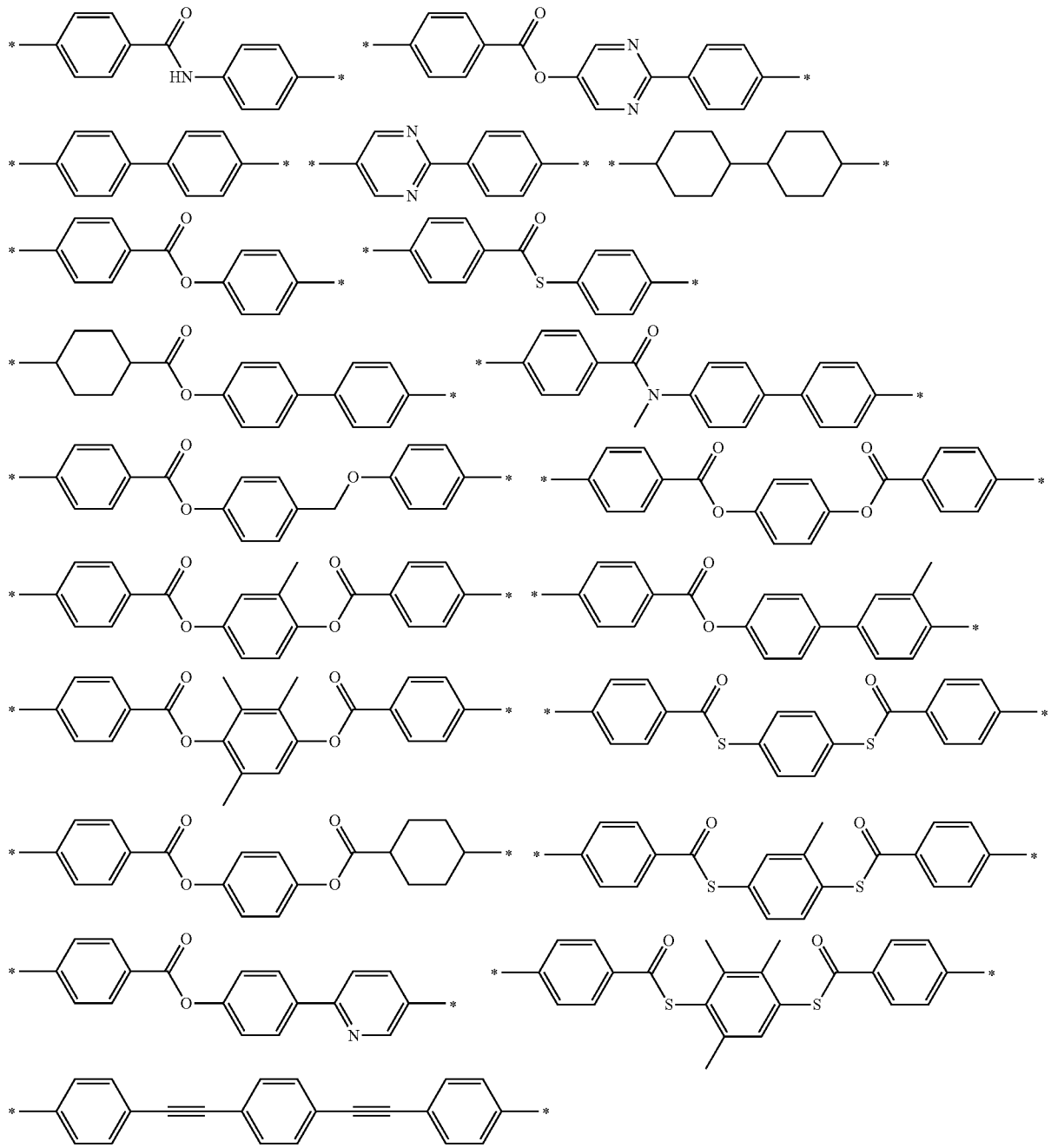

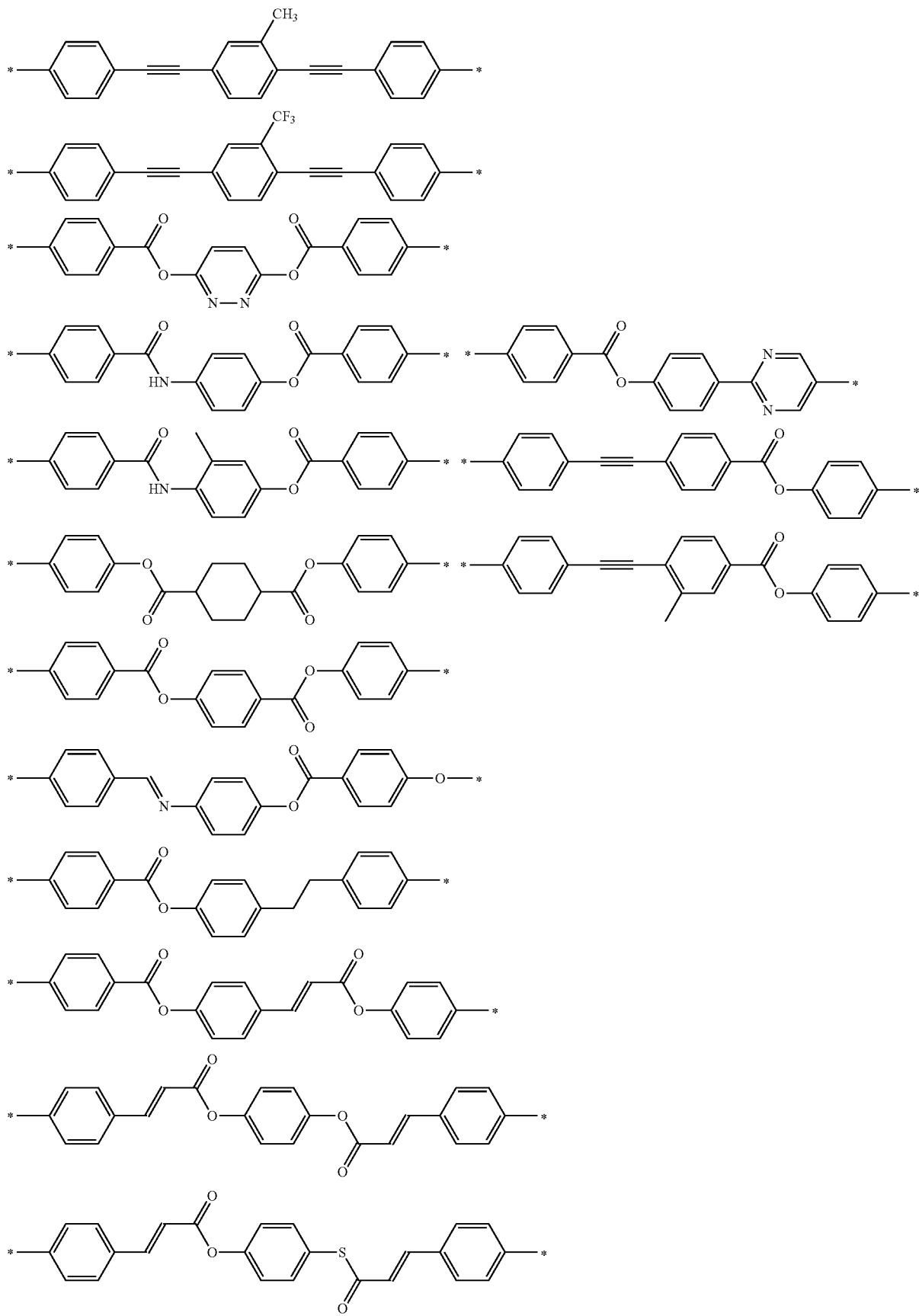

-continued
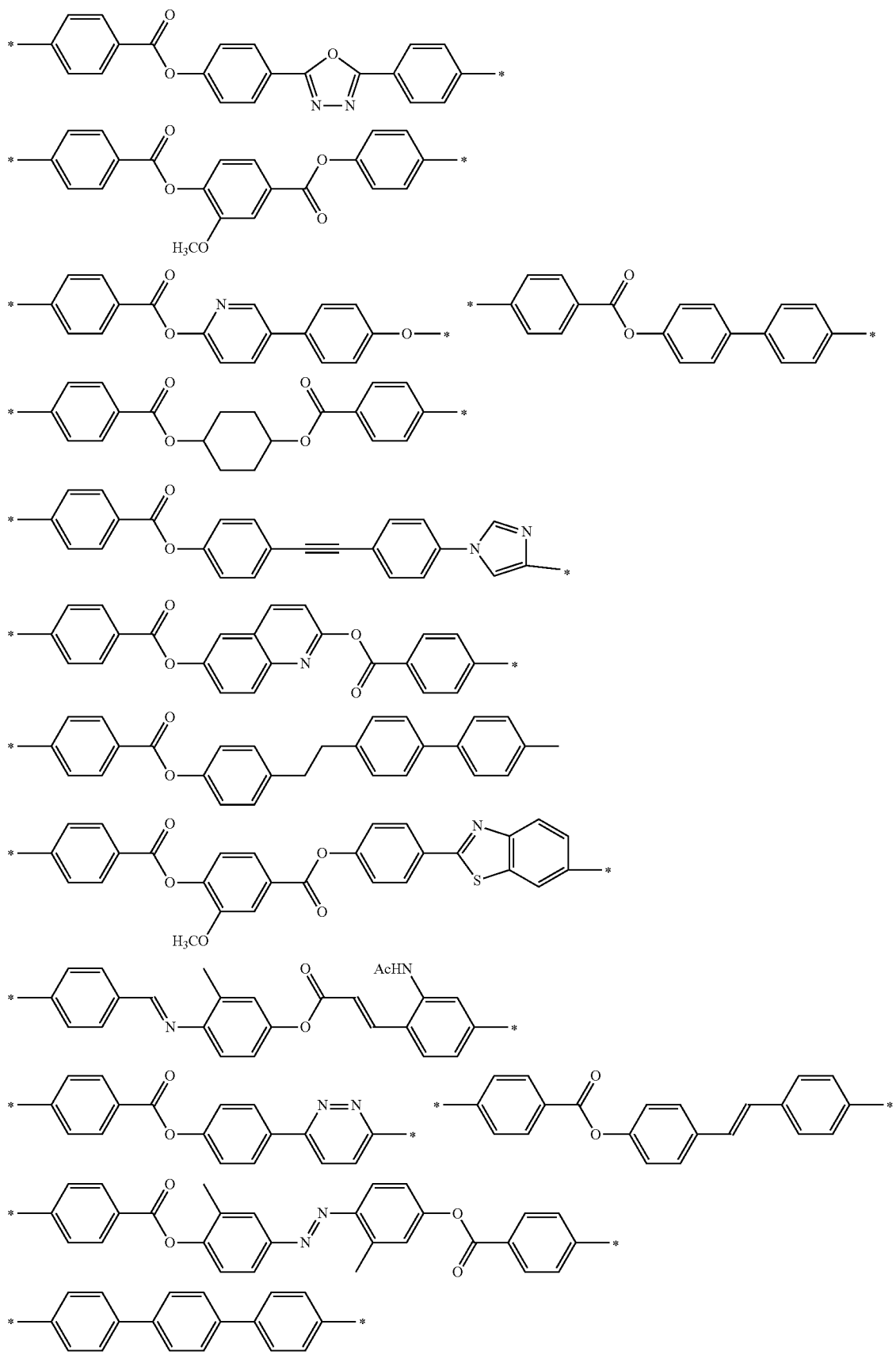

-continued
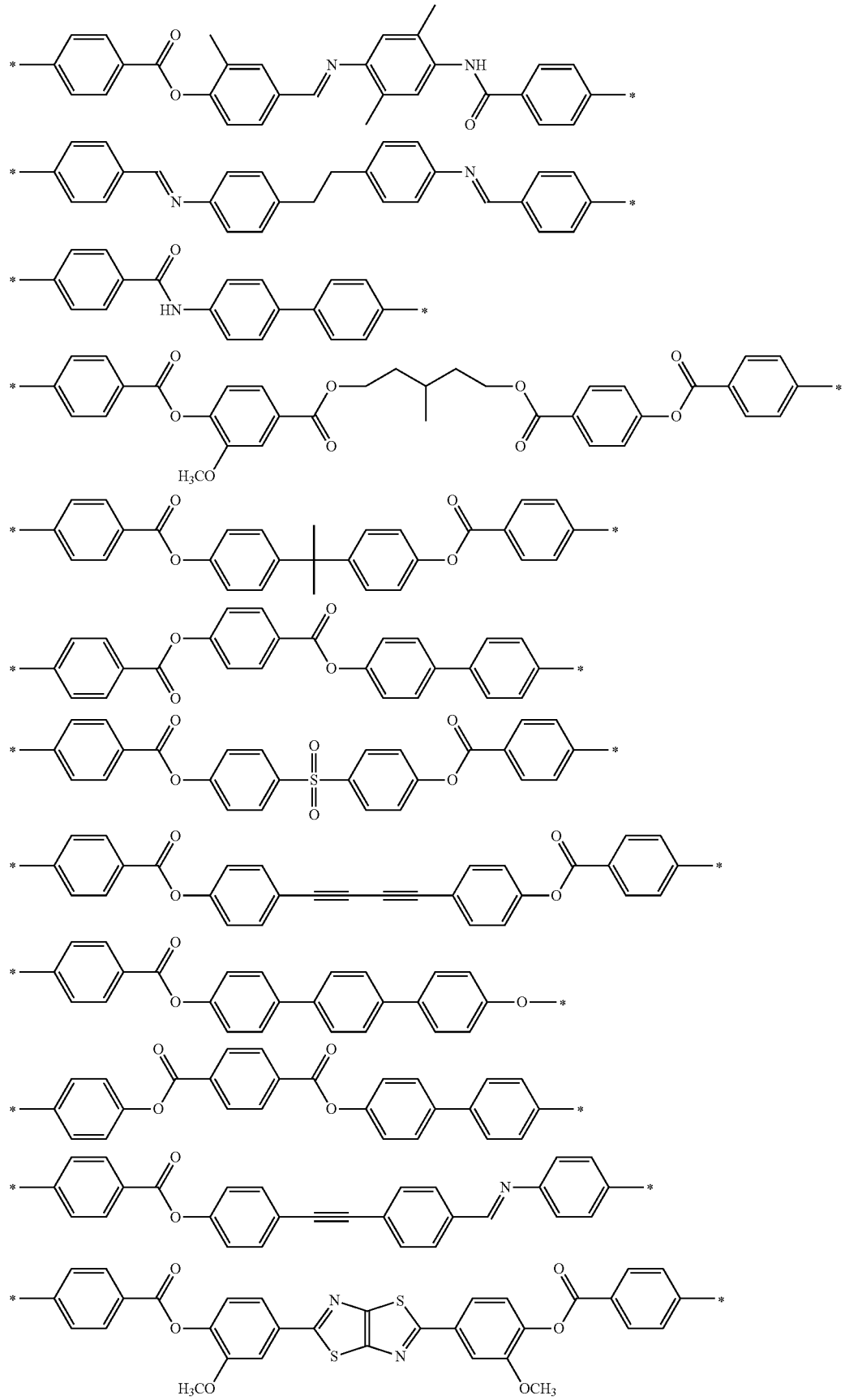

-continued

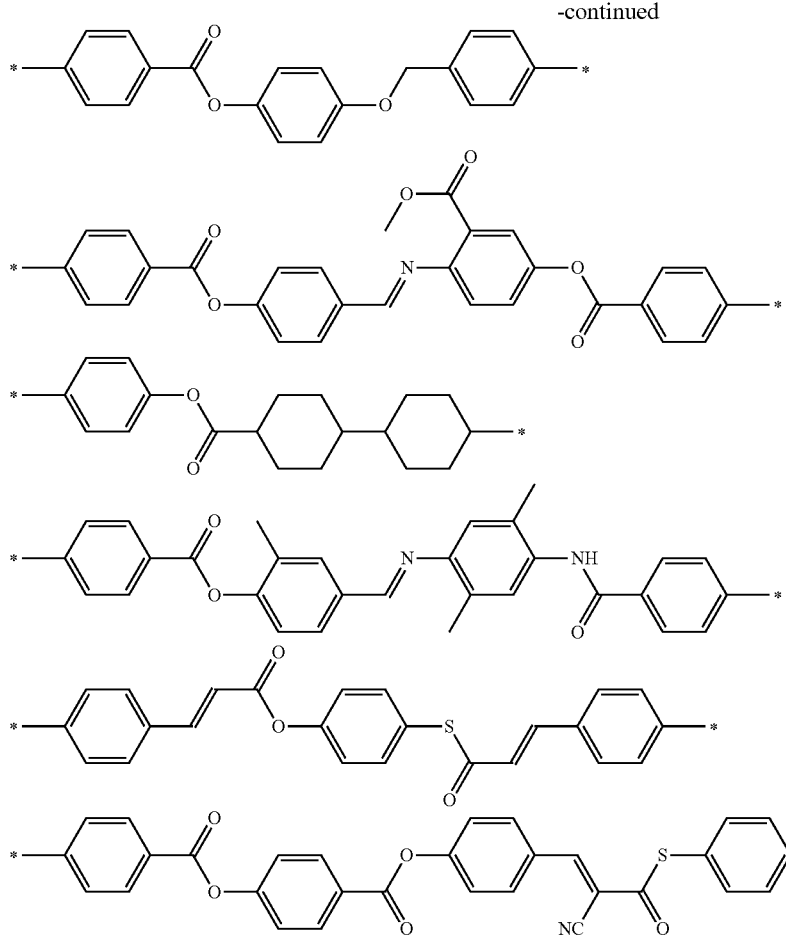

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group. Specific examples of the linking group are the same as those for L1 and SP1 described above, and A represents a (meth)acryloyloxy group).

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the polarizer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint that the effects of the present invention are more excellent, the content of the repeating unit (1) is preferably in a range of 20% to 100% by mass with respect to 100% by mass of all the repeating units of the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of the repeating units (1). Among these, from the viewpoint that the effects of the present invention are more excellent, the polymer liquid crystal compound may have two kinds of the repeating units (1).

In a case where the polymer liquid crystal compound has two kinds of the repeating units (1), from the viewpoint that the effects of the present invention are more excellent, it is preferable that the terminal group represented by T1 in one (repeating unit A) is an alkoxy group and the terminal group represented by T1 in the other (repeating unit B) is a group other than the alkoxy group.

From the viewpoint that the effects of the present invention are more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the effects of the present invention are more excellent, the ratio (A/B) of the content of the repeating unit A in the polymer liquid crystal compound to the content of the repeating unit B in the polymer liquid crystal compound is preferably in a range of 50/50 to 95/5, more preferably in a range of 60/40 to 93/7, and still more preferably in a range of 70/30 to 90/10.

(Weight-Average Molecular Weight)

From the viewpoint that the effects of the present invention are more excellent, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the degree of alignment, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

<First Dichroic Material>

The present composition contains a first dichroic material. The first dichroic material is not particularly limited as long as the first dichroic material can form an array structure with the second dichroic material, but it is preferable that the first dichroic material is a compound having a chromophore which is a nucleus of a dichroic material and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic ring group and an azo group is preferable, and a bisazo structure containing an aromatic heterocyclic group (preferably a thienothiazole group) and two azo groups is more preferable.

The side chain is not particularly limited, and examples thereof include a group represented by R1, R2, or R3 in Formula (1).

From the viewpoint of adjusting the tint of the polarizer, it is preferable that the first dichroic material is a dichroic material having a maximum absorption wavelength in a range of 560 nm to 700 nm (more preferably in a range of 560 to 650 nm and particularly preferably in a range of 560 to 640 nm).

The maximum absorption wavelength (nm) of the dichroic material in the present specification is acquired from a UV visible spectrum in a wavelength range of 380 to 800 nm measured by a spectrophotometer using a solution prepared by dissolving the dichroic material in a good solvent.

From the viewpoint of further improving the degree of alignment of the polarizer, it is preferable that the first dichroic material is a compound represented by Formula (1).

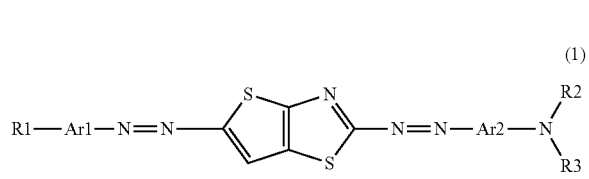

In Formula (1), Ar1 and Ar2 each independently represent a phenylene group which may have a substituent or a naphthylene group which may have a substituent. Among these, a phenylene group is preferable.

In Formula (1), R1 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, and an alkylsilyl group.

The carbon atoms of the alkyl group may be substituted with —O—, —CO—, —C(O)—O—, —O—C(O)—, —Si (CH$_3$)$_2$—O—Si(CH$_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O—.

In a case where R1 represents a group other than a hydrogen atom, the hydrogen atom in each group may be substituted with a halogen atom, a nitro group, a cyano group, —N(R1')$_2$, an amino group, —C(R1')=C(R1')—NO$_2$, —C(R1')=C(R1')—CN, or —C(R1')—C(CN)$_2$.

R1' represents a hydrogen atom or a linear or branched alkyl group having 1 to 6 carbon atoms. In a case where a plurality of (R1')'s are present in each group, these may be the same as or different from one another.

In Formula (1), R2 and R3 each independently represent a hydrogen atom, a linear or branched alkyl group having 1 to 20 carbon atoms which may have a substituent, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

The carbon atoms of the alkyl group may be substituted with —O—, —S—, —C(O)—, —C(O)—O—, —O—C (O)—, —C(O)—S—, —S—C(O)—, —Si(CH₃)₂—O—Si(CH₃)₂—, —NR2'—, —NR2'—CO—, —CO—NR2'—, —NR2'—C(O)—O—, —O—C—(O)—NR2'—, —NR2'—C(O)—NR2'—, —CH=CH—, —C≡C—, —N=N—, —C(R2')=CH—C(O)—, or —O—C(O)—O—.

In a case where R2 and R3 represent a group other than a hydrogen atom, the hydrogen atom of each group may be substituted with a halogen atom, a nitro group, a cyano group, a —OH group, —N(R2')₂, an amino group, —C(R2')—C(R2')—NO₂, —C(R2')=C(R2')—CN, or —C(R2')=C(CN)₂.

R2' represents a hydrogen atom or a linear or branched alkyl group having 1 to 6 carbon atoms. In a case where a plurality of (R2')'s are present in each group, these may be the same as or different from one another.

R2 and R3 may be bonded to each other to form a ring, or R2 or R3 may be bonded to Ar2 to form a ring.

From the viewpoint of the light fastness, it is preferable that R1 represents an electron-withdrawing group and R2 and R3 represent a group having a low electron-donating property.

Specific examples of such groups as R1 include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and examples of such a group as R2 and R3 include groups having the following structures. In addition, the groups having the following structures are shown in the form having a nitrogen atom to which R2 and R3 are bonded in Formula (1).

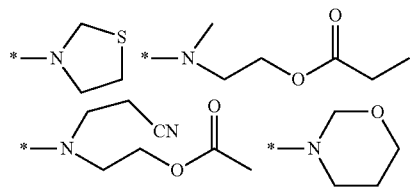

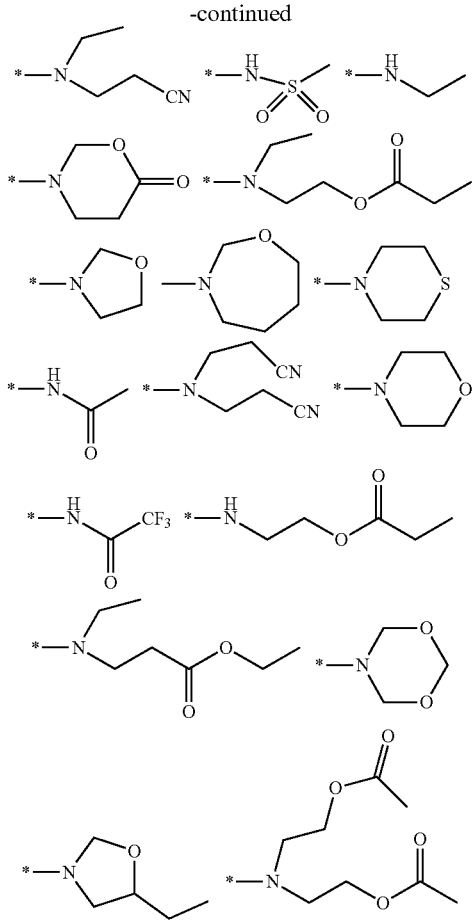

Specific examples of the first dichroic material are shown below, but the present invention is not limited thereto.

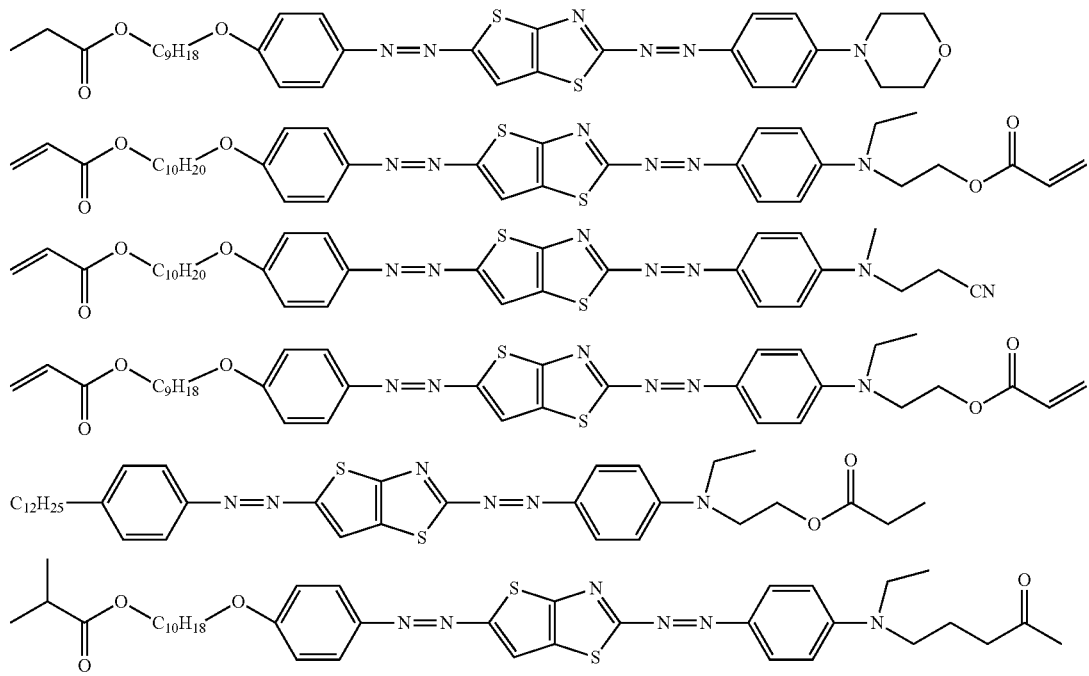

-continued
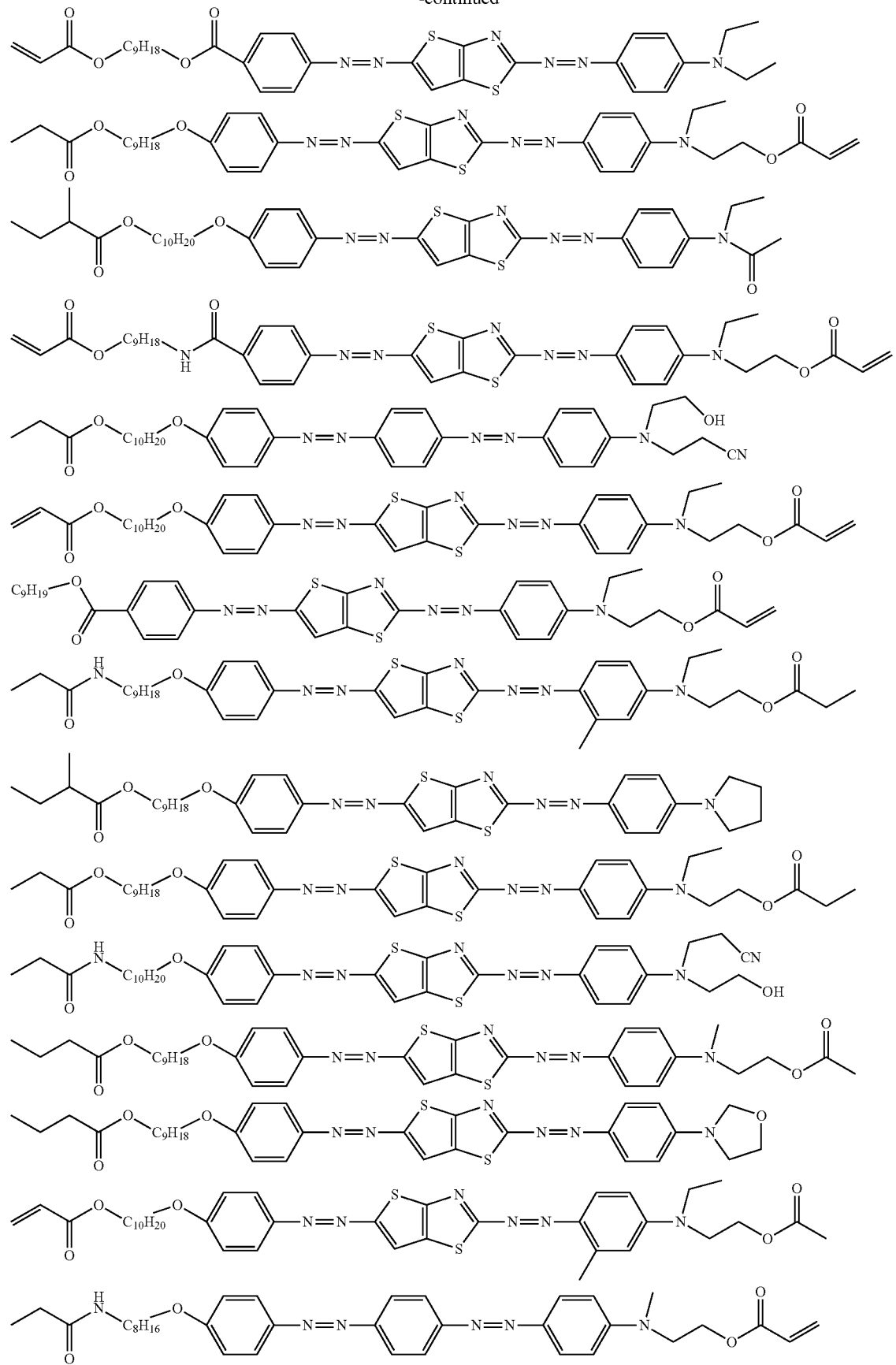

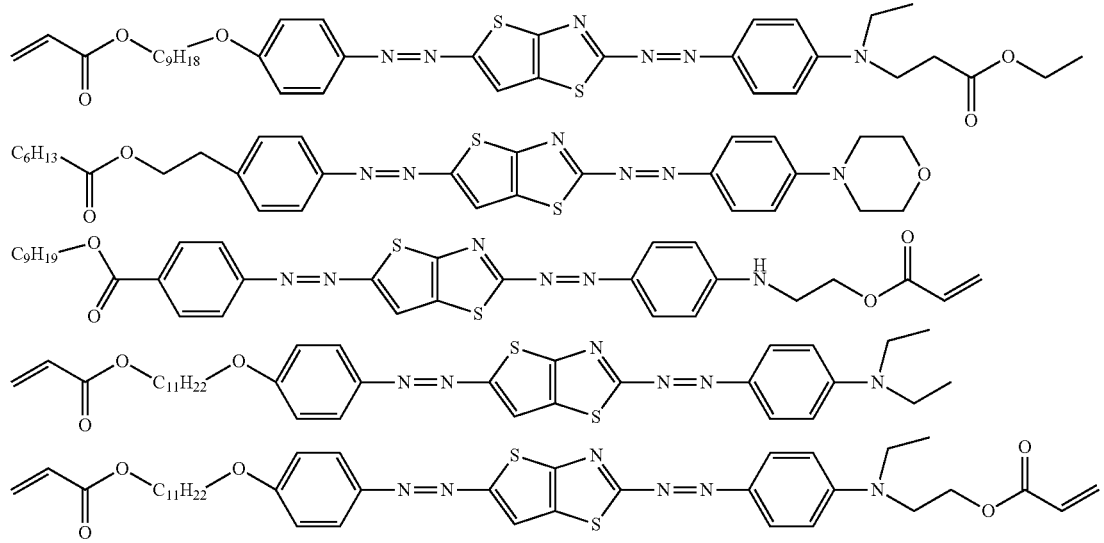

<Second Dichroic Material>

The present composition contains a second dichroic material. The second dichroic material is a compound different from the first dichroic material. Specifically, the chemical structure of the second dichroic material is different from the chemical structure of the first dichroic material.

The second dichroic material is not particularly limited as long as the second dichroic material can form an array structure with the first dichroic material, but it is preferable that the second dichroic material is a compound having a chromophore which is a nucleus of a dichroic material and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic hydrocarbon group and an azo group is preferable, and a bisazo or trisazo structure containing an aromatic hydrocarbon group and two or three azo groups is more preferable.

The side chain is not particularly limited, and examples thereof include a group represented by R4, R5, or R6 in Formula (2).

From the viewpoint of adjusting the tint of the polarizer, it is preferable that the second dichroic material is a dichroic material having a maximum absorption wavelength in a range of 455 nm to 560 nm (more preferably in a range of 455 to 555 nm and particularly preferably in a range of 455 to 550 nm).

In particular, the tint of the polarizer can be more easily adjusted in a case of using the first dichroic material having a maximum absorption wavelength of 560 to 700 nm and the second dichroic material having a maximum absorption wavelength of 455 nm or greater and less than 560 nm.

From the viewpoint that the degree of alignment of the polarizer is further improved, it is preferable that the second dichroic material is a compound represented by Formula (2).

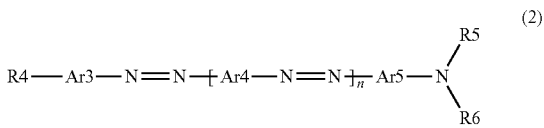

In Formula (2), n represents 1 or 2.

In Formula (2), Ar3, Ar4, and Ar5 each independently represent a phenylene group which may have a substituent, a naphthylene group which may have a substituent, or a heterocyclic group which may have a substituent.

The heterocyclic group may be aromatic or non-aromatic.

Examples of atoms other than the carbon atoms constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the aromatic heterocyclic group include a pyridylene group (pyridine-diyl group), a pyridazine-diyl group, an imidazole-diyl group, a thienylene (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

In Formula (2), R4 has the same definition as that for R1 in Formula (1).

In Formula (2), R5 and R6 each have the same definition as that for R2 and R3 in Formula (1).

From the viewpoint of the light fastness, it is preferable that R4 represents an electron-withdrawing group and R5 and R6 represent a group having a low electron-donating property.

Among such groups, specific examples of the electron-withdrawing group as R4 are the same as the specific examples of the electron-withdrawing group as R1, and specific examples of the group having a low electron-donating property as R5 and R6 are the same as the specific examples of the group having a low-electron-donating property as R2 and R3.

Specific examples of the second dichroic material are described below, but the present invention is not limited thereto.

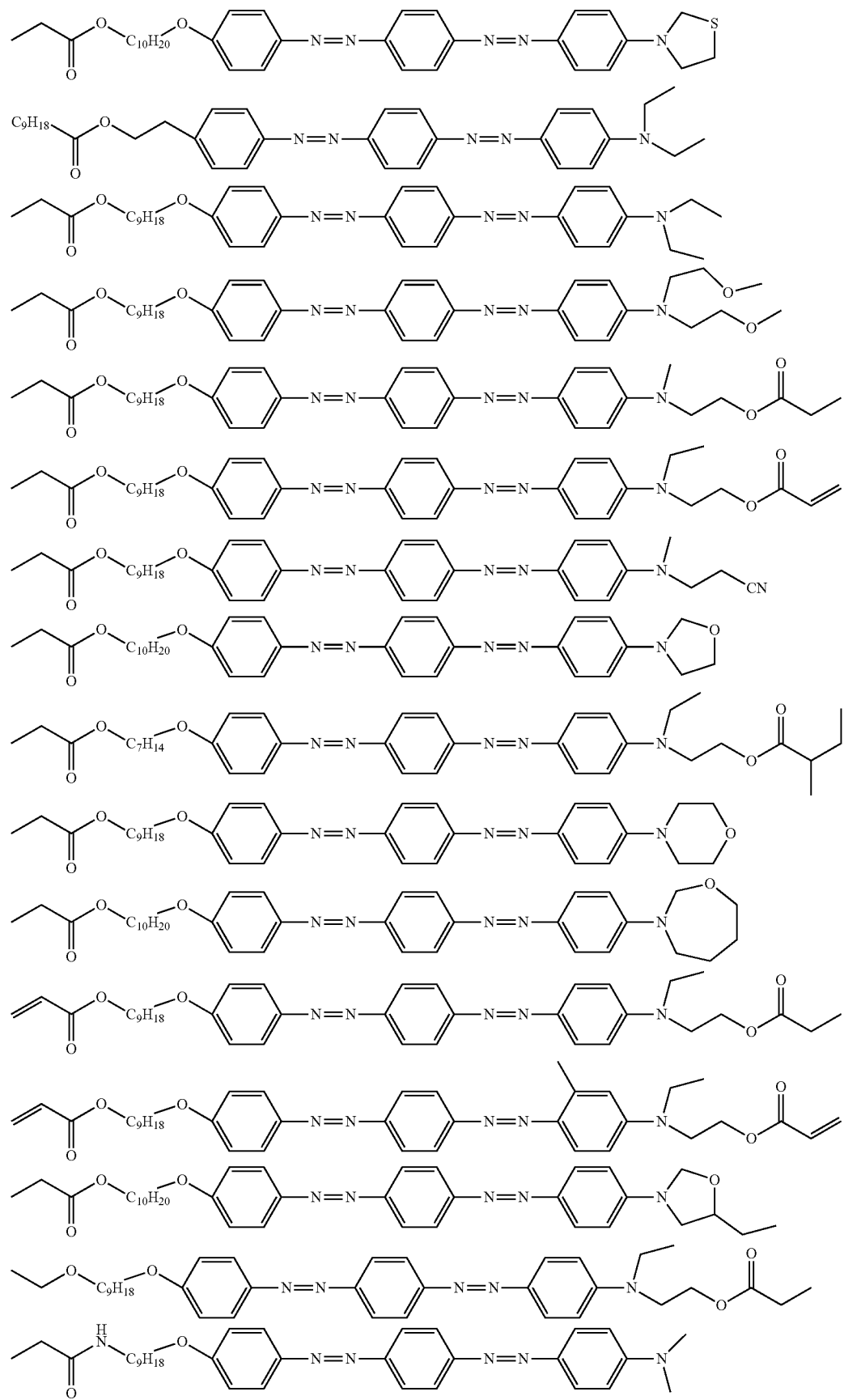

-continued
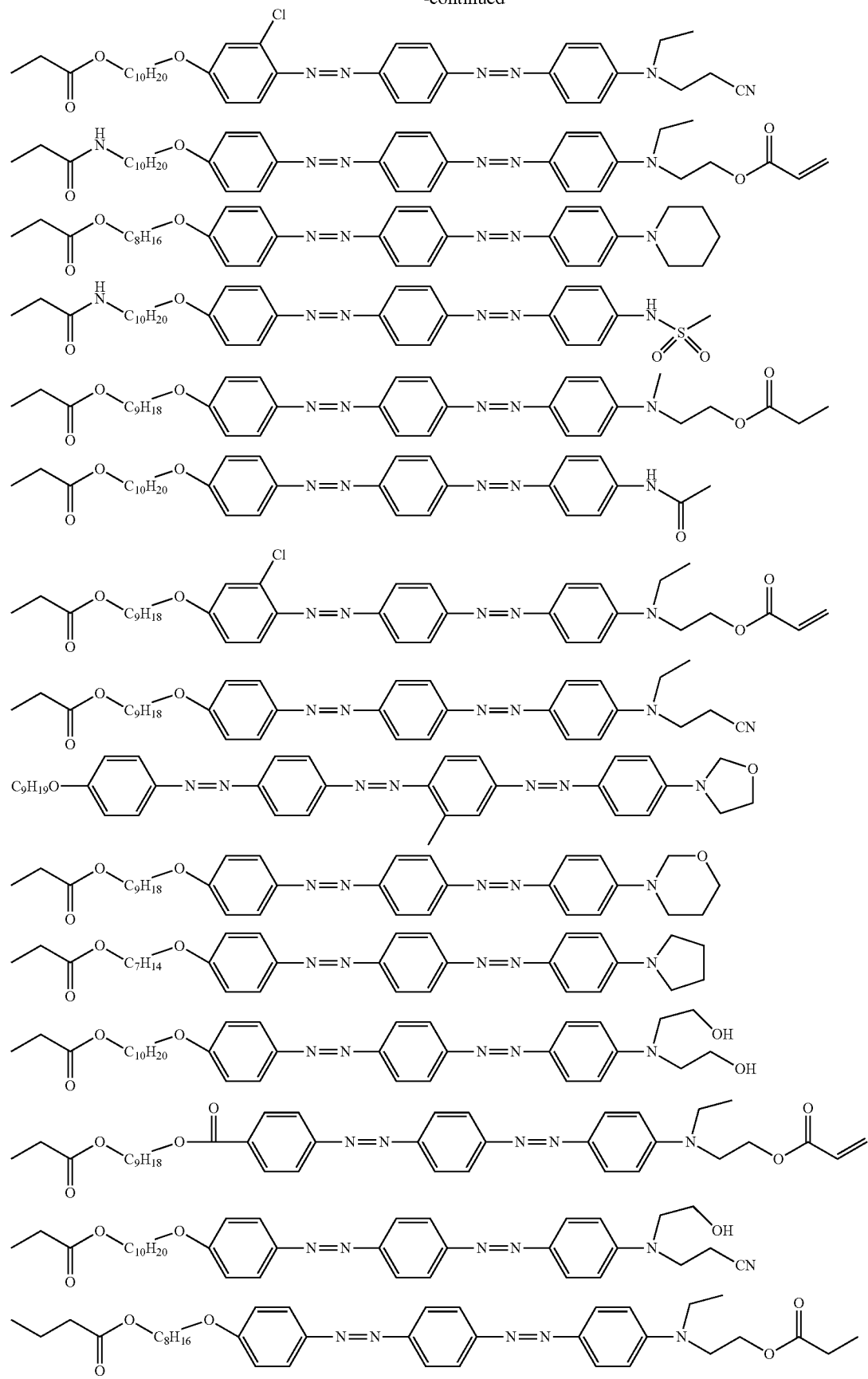

-continued
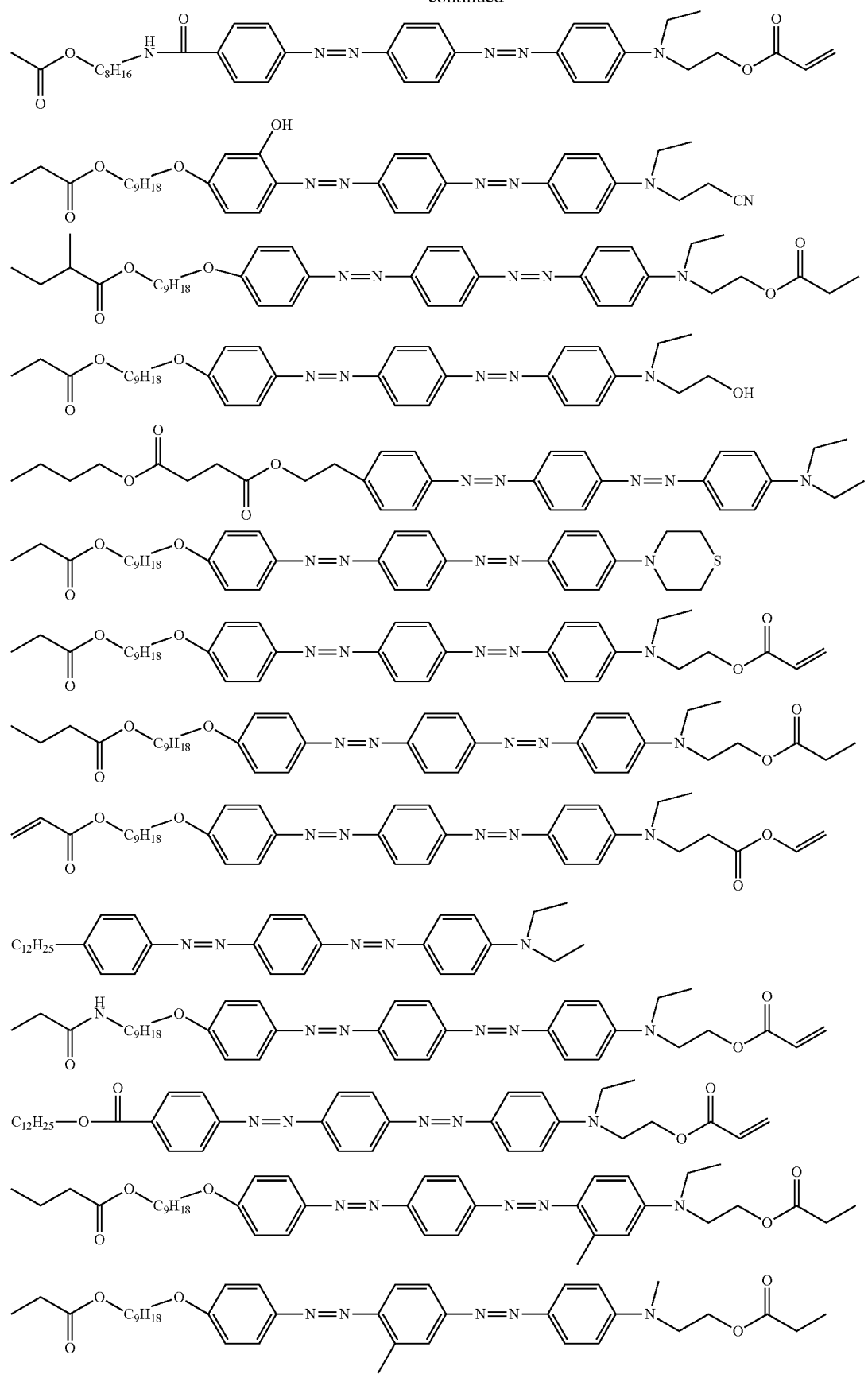

-continued

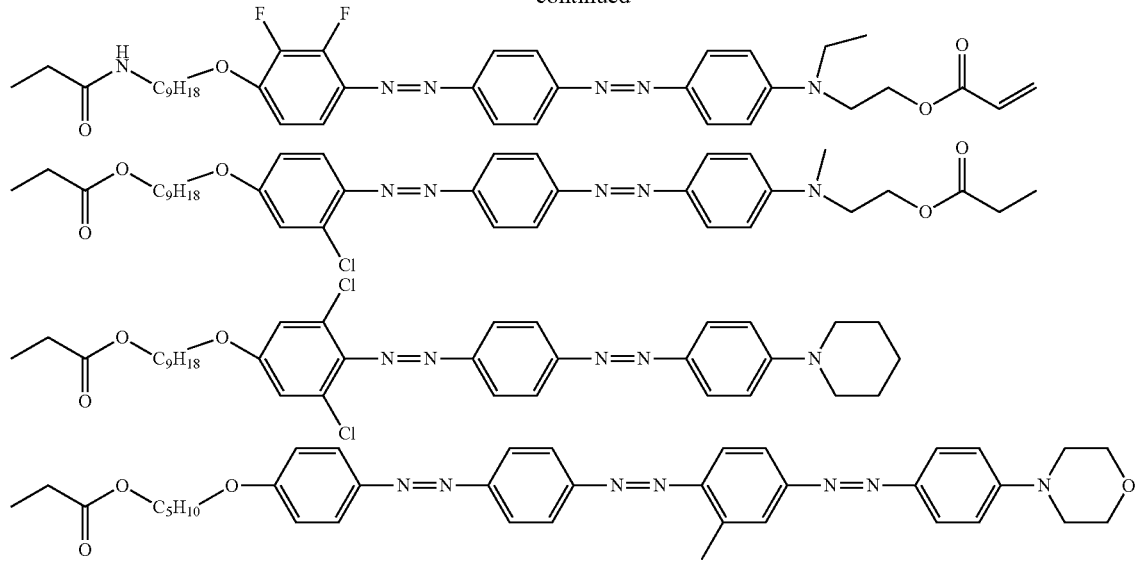

(Difference in Log P Value)

An absolute value of a difference between a log P value of a side chain of the first dichroic material and a log P value of a side chain of the second dichroic material (hereinafter, also referred to as the "difference in log P value") is preferably 2.30 or less, more preferably 2.0 or less, still more preferably 1.5 or less, and particularly preferably 1.0 or less. In a case where the difference in log P value is 2.30 or less, since the affinity between the first dichroic material and the second dichroic material is increased and the array structure can be more easily formed, the degree of alignment of the polarizer is further improved.

Further, in a case where the first dichroic material or the second dichroic material has a plurality of side chains, it is preferable that at least one difference in log P value satisfies the above-described value.

Here, the side chains of the first dichroic material and the second dichroic material indicate groups bonded to the terminal of the chromophore described above. For example, R1, R2, and R3 in Formula (1) are side chains in a case where the first dichroic material is a compound represented by Formula (1) and R4, R5, and R6 in Formula (2) are side chains in a case where the second dichroic material is a compound represented by Formula (2). In particularly, in a case where the first dichroic material is a compound represented by Formula (1) and the second dichroic material is a compound represented by Formula (2), it is preferable that at least one difference in log P value from among a difference in log P value between R1 and R4, a difference in log P value between R1 and R5, a difference in log P value between R2 and R4, or a difference in log P value between R2 and R5 satisfies the above-described value.

Here, the log P value is an index for expressing the properties of the hydrophilicity and hydrophobicity of a chemical structure and is also referred to as a hydrophilic-hydrophobic parameter. The log P value can be calculated using software such as ChemBioDrawUltra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

<Third Dichroic Material>

It is preferable that the present composition contains a third dichroic material. The third dichroic material is a dichroic material other than the first dichroic material and the second dichroic material. Specifically, the chemical structure of the third dichroic material is different from the chemical structures of the first dichroic material and the second dichroic material. It is advantageous that the present composition contains the third dichroic material in terms that the tint of the polarizer can be easily adjusted.

The maximum absorption wavelength of the third dichroic material is preferably 380 nm or greater and less than 455 nm and more preferably in a range of 385 to 454 nm.

Specific examples of the third dichroic material include compounds other than the first dichroic material and the second dichroic material among the compounds represented by Formula (1) described in WO2017/195833A.

(Content of Dichroic Material)

The content of the dichroic materials in the present composition is preferably in a range of 0.1 to 99 parts by mass, more preferably in a range of 1 to 60 parts by mass, and particularly preferably in a range of 1.5 to 30 parts by mass with respect to 100 parts by mass which is the total amount of the dichroic materials and the liquid crystal compound.

The content of the first dichroic material is preferably in a range of 40 to 90 parts by mass and more preferably in a range of 55 to 85 parts by mass with respect to 100 parts by mass which is the content of the dichroic materials in the present composition.

The content of the second dichroic material is preferably in a range of 6 to 50 parts by mass and more preferably in a range of 8 to 45 parts by mass with respect to 100 parts by mass which is the content of the dichroic materials in the present composition.

In a case where the present composition contains a third dichroic material, the content of the third dichroic material is preferably in a range of 3 to 30 parts by mass and more preferably in a range of 5 to 25 parts by mass with respect to 100 parts by mass which is the content of the dichroic materials in the present composition.

Further, the content of the dichroic materials indicates the total amount of the first dichroic material and the second dichroic material. In a case where the present composition contains the third dichroic material, the content of the third dichroic material is included in the total amount.

The content ratio of the first dichroic material, the second dichroic material, and the third dichroic material used as necessary can be optionally set in order to adjust the tint of the polarizer. However, the content ratio of the second dichroic material to the first dichroic material (the second dichroic material/the first dichroic material) is preferably in a range of 0.1 to 10, more preferably in a range of 0.2 to 5, and particularly preferably in a range of 0.3 to 0.8 in terms of the molar ratio. In a case where the content ratio of the second dichroic material to the first dichroic material is in the above-described range, the first dichroic material and the second dichroic material can more easily form an array structure.

<Solvent>

From the viewpoint of workability and the like, it is preferable that the present composition contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, tetrahydropyran, dioxolane, tetrahydrofurfuryl alcohol, and cyclopentyl methyl ether), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, butyl acetate, and diethyl carbonate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), and heterocyclic compounds (such as pyridine), and water. These solvents may be used alone or in combination of two or more kinds thereof.

Among these solvents, it is preferable to use an organic solvent and more preferable to use halogenated carbons or ketones from the viewpoint that the effects of the present invention are more excellent.

In a case where the present composition contains a solvent, the content of the solvent is preferably in a range of 70% to 99.5% by mass, more preferably in a range of 80% to 99% by mass, and still more preferably in a range of 85% to 98% by mass with respect to the total mass of the present composition from the viewpoint that the effects of the present invention are more excellent.

<Interface Modifier>

It is preferable that the present composition contains an interface modifier. In a case where the composition contains an interface modifier, the smoothness of the coated surface is improved, the degree of alignment is improved, and cissing and unevenness are suppressed so that the in-plane uniformity is expected to be improved.

As the interface modifier, interface modifiers that allow liquid crystal compounds to be horizontally aligned are preferable, and compounds (horizontal alignment agents) described in paragraphs to of JP2011-237513A can be used. Further, fluorine(meth)acrylate-based polymers described in to of JP2007-272185A can also be used. Compounds other than the compounds described above may be used as the interface modifier.

In a case where the present composition of the present invention contains an interface modifier, from the viewpoint that the effects of the present invention are more excellent, the content of the interface modifier is preferably in a range of 0.001 to 5 parts by mass and more preferably in a range of 0.01 to 3 parts by mass with respect to 100 parts by mass which is the total amount of the liquid crystal compound and the dichroic materials in the present composition.

<Polymerization Initiator>

From the viewpoint that the effects of the present invention are more excellent, it is preferable that the present composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-040799A (JP-S63-040799A), JP1993-029234B (JP-H05-029234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the present composition contains a polymerization initiator, from the viewpoint that the effects of the present invention are more excellent, the content of the polymerization initiator is preferably in a range of 0.01 to 30 parts by mass and more preferably in a range of 0.1 to 15 parts by mass with respect to 100 parts by mass which is the total amount of the liquid crystal compound and the dichroic materials in the present composition. The durability of the polarizer is excellent in a case where the content of the polymerization initiator is 0.01 parts by mass or greater, and the alignment of the polarizer is more excellent in a case where the content of the polymerization initiator is 30 parts by mass or less.

<Substituent>

The substituent in the present specification will be described.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholino group, a maleimide group, a benzoxazolyl group, a benzimidazolyl group, and a benzthiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a carboxy group, a sulfonic acid group, and a phosphoric acid group.

[Associate in Polarizer]

In the array structure formed of the first dichroic material and the second dichroic material in the present invention, it is preferable that the first dichroic material and the second dichroic material form an associate. The formation of an associate has advantages that the degree of alignment and light fastness of the polarizer are further improved and the tint of the polarizer is easily adjusted.

As a method of verifying that the first dichroic material and the second dichroic material form an associate, a method based on the maximum absorption wavelength measured using the film formed in the following manner is exemplified.

In the production of each film (polarizer), it should be noted that the kinds of underlayers (for example, substrates), the concentrations of compositions, and the conditions for applying the compositions are set to be uniform except that the kind of the dichroic material to be contained in each film is changed, to obtain the same areas of the films and the same film thicknesses.

Specifically, the present composition (at least a composition containing the first dichroic material, the second dichroic material, and the liquid crystal compound) is cast on a substrate (for example, blue plate glass), and the composition is heated on a hot plate until the composition enters a liquid crystal state and cooled to room temperature to form a film 1 (corresponding to the polarizer according to the embodiment of the invention). Further, the absorption spectrum of the film 1 is measured at a pitch of 1 nm in a wavelength range of 380 to 800 nm. A maximum absorption wavelength $\lambda 1$ is acquired by heating the film 1 again for every 10° C. and measuring the absorption spectrum.

Further, a composition 4 (a composition that contains at least the liquid crystal compound and the first dichroic material but does not contain the second dichroic material) containing the same components as those in the present composition except that the second dichroic material is not contained is prepared. Further, the absorption spectrum of a film 1-4 formed using the composition 4 is acquired in the same manner as in the measurement of the absorption spectrum of the film 1 (the polarizer according to the embodiment of the present invention).

Further, the difference spectrum is acquired by subtracting the absorption spectrum of the film 1-4 from the absorption spectrum of the film 1, and the maximum absorption wavelength $\lambda$ of the obtained difference spectrum is acquired.

Next, a composition 2 (a composition that contains at least the liquid crystal compound and the second dichroic material but does not contain the first dichroic material) having the same composition as that in the present composition except that the first dichroic material is not contained is prepared. Further, the maximum absorption wavelength $\lambda 2$ of a film 1-2 formed using the composition 2 is acquired in the same manner as in the measurement of the maximum absorption wavelength $\lambda 1$ of the film 1 (the polarizer according to the embodiment of the present invention).

Figure 3:
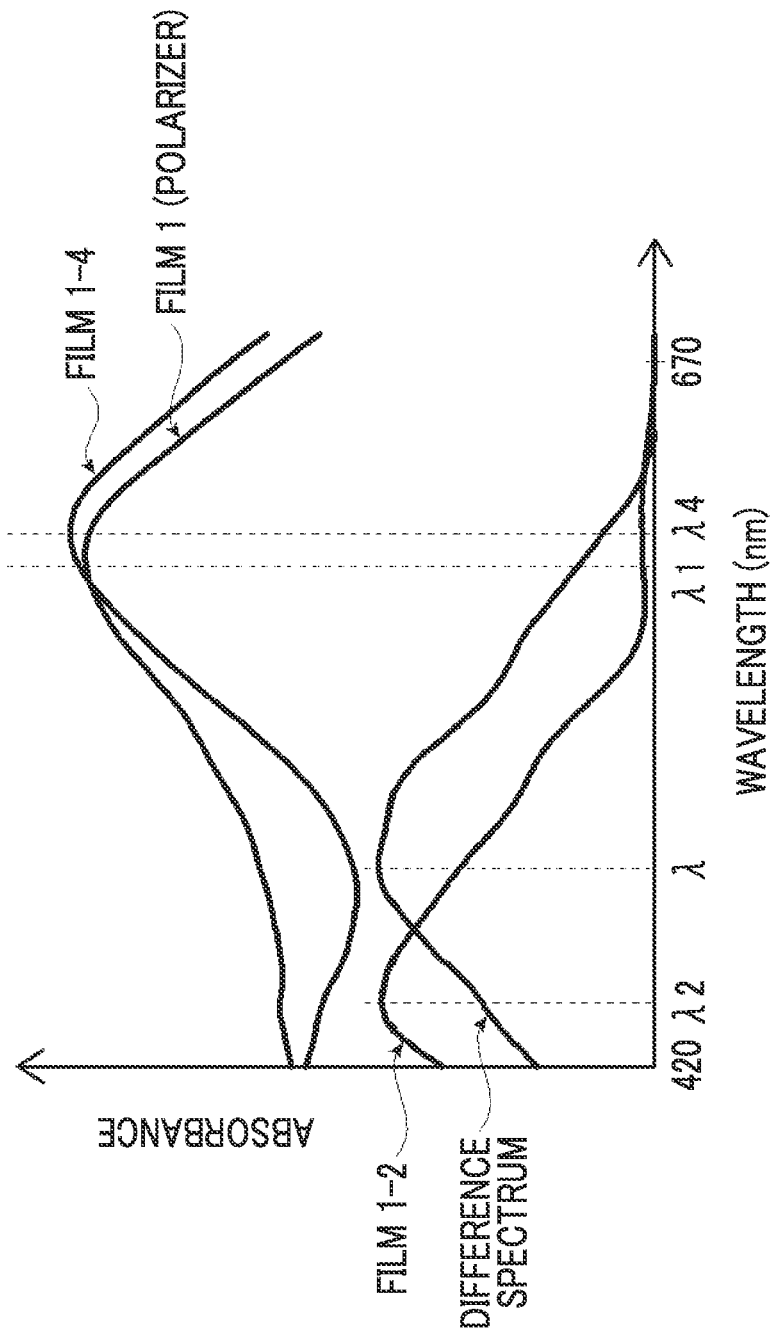
FIG. 3 is a graph schematically showing an example of an absorption spectrum of a polarizer of the present invention.

FIG. 3 is a graph schematically showing the absorption spectrum of each film prepared in the above-described manner. As shown in FIG. 3, in the polarizer of the present invention, it is preferable that the maximum absorption wavelength $\lambda$ and the maximum absorption wavelength $\lambda 2$ are different from each other. Here, in the present invention, the expression "the maximum absorption wavelength $\lambda$ and the maximum absorption wavelength $\lambda 2$ are different from each other" means that the absolute value of the difference between the maximum absorption wavelength $\lambda$ and the maximum absorption wavelength $\lambda 2$ is greater than 2 nm. Further, the absolute value of the difference between the maximum absorption wavelength $\lambda$ and the maximum absorption wavelength $\lambda 2$ is preferably 5 nm or greater and more preferably 10 nm or greater. The upper limit of the absolute value of the difference between the maximum absorption wavelength $\lambda$ and the maximum absorption wavelength $\lambda 2$ is preferably 100 nm or less.

As described above, in a case where the maximum absorption wavelength $\lambda$ and the maximum absorption wavelength $\lambda 2$ are different from each other, it can be said that the first dichroic material and the second dichroic material are associated with each other. The reason will be described below.

The difference in composition between the film 1 and the film 1-4 is the presence or absence of the second dichroic material. Therefore, it is expected that the difference spectrum between the absorption spectrum of the film 1 and the absorption spectrum of the film 1-4 is substantially the same as the absorption spectrum derived from the second dichroic material. Therefore, in a case where the maximum absorption wavelength $\lambda$ of the difference spectrum matches the maximum absorption wavelength $\lambda 2$ of the absorption spectrum of the film 2 (that contains the second dichroic material but does not contain the first dichroic material), it can be said that the second dichroic material is present in the film (polarizer) without being incorporated into the first dichroic material.

On the contrary, as shown in FIG. 3, the expression "the maximum absorption wavelength $\lambda$ and the maximum absorption wavelength $\lambda 2$ are different from each other" indicates that the absorption spectrum derived from the second dichroic material is unlikely to be detected from the difference spectrum. That is, it is considered that since the first dichroic material and the second dichroic material are associated with each other in the film 1 (for example, a phenomenon in which one dichroic material is incorporated into the other dichroic material occurs), the absorption spectrum of the second dichroic material is no longer detected from the difference spectrum. In this case, the waveform of the absorption spectrum of the film 1 is different from the waveform of the absorption spectrum of the film 2.

As shown in FIG. 3, in the polarizer according to the embodiment of the present invention, it is preferable that the maximum absorption wavelength $\lambda 1$ is different from the maximum absorption wavelength $\lambda 4$. Here, in the present invention, the expression "the maximum absorption wavelength $\lambda 1$ is different from the maximum absorption wavelength $\lambda 4$" means that the absolute value of the difference between the maximum absorption wavelength $\lambda 1$ and the maximum absorption wavelength $\lambda 4$ is greater than 2 nm. Further, the absolute value of the difference between the maximum absorption wavelength $\lambda 1$ and the maximum absorption wavelength $\lambda 4$ is preferably 5 nm or greater and more preferably 7 nm or greater. The upper limit of the absolute value of the difference between the maximum absorption wavelength $\lambda 1$ and the maximum absorption wavelength $\lambda 4$ is preferably 40 nm or less.

In particular, in a case where the maximum absorption wavelength of the first dichroic material is greater than the maximum absorption wavelength of the second dichroic material, it is preferable that the maximum absorption wavelength $\lambda 1$ is smaller than the maximum absorption wavelength $\lambda 4$. That is, a value of ($\lambda 4-\lambda 1$) obtained by subtracting $\lambda 1$ from $\lambda 4$ is preferably greater than 2 nm and more preferably 5 nm or greater. The upper limit of the value obtained by subtracting $\lambda 1$ from $\lambda 4$ is preferably 40 nm or less.

As described above, in the case where the maximum absorption wavelength $\lambda 1$ is different from the maximum absorption wavelength $\lambda 4$, it can be said that the first dichroic material and the second dichroic material are associated with each other. The reason will be described below.

The difference in composition between the film 1 and the film 1-4 is the presence or absence of the second dichroic material. In a case where the maximum absorption wavelength of the first dichroic material is greater than the maximum absorption wavelength of the second dichroic material, since the maximum absorption wavelength of the first dichroic material is detected, the maximum absorption wavelength λ1 of the film 1 is expected to match the maximum absorption wavelength λ4 of the film 1-4. Therefore, in a case where the maximum absorption wavelength λ1 matches the maximum absorption wavelength λ4, it can be said that the first dichroic material is present in the film (polarizer) without being incorporated into the second dichroic material.

On the contrary, as shown in FIG. 3, the expression "the maximum absorption wavelength λ1 is smaller than the maximum absorption wavelength λ4" indicates that the absorption spectrum derived from the first dichroic material is weakened. That is, it is considered that since the first dichroic material and the second dichroic material are associated with each other in the film 1 (for example, a phenomenon in which one dichroic material is incorporated into the other dichroic material occurs), the maximum absorption wavelength has shifted to the smaller wavelength side which is the maximum absorption wavelength of the second dichroic material.

[Crystal Structure in Polarizer]

In the array structure formed of the first dichroic material and the second dichroic material in the present invention, it is preferable that the first dichroic material and the second dichroic material form a crystal structure. The formation of a crystal structure has advantages that the degree of alignment and light fastness of the polarizer are further improved and the tint of the polarizer is easily adjusted.

In addition, the first dichroic material and the second dichroic material may form a crystal structure while forming an associate.

As a method of verifying that the first dichroic material and the second dichroic material form a crystal structure, a method of using an X-ray diffraction (XRD) method is exemplified.

In a case where the dichroic materials form a crystal structure, a peak corresponding to the crystal structure is observed by X-ray diffraction. In the polarizer according to the embodiment of the present invention, a crystal structure of the first dichroic material and a crystal structure of the second dichroic material may be observed in addition to the crystal structure of the first dichroic material and the second dichroic material. The crystallinity thereof can be observed by the intensity of the X-ray peak derived from each crystal structure.

Specifically, in consideration of a case where a crystal structure containing the first dichroic material and the second dichroic material and formed of the first dichroic material and the second dichroic material is formed, a peak intensity (referred to as $P_{OM}$) derived from the crystal structure formed of the first dichroic material and the second dichroic material, a peak intensity (referred to as $P_M$) derived from the crystal structure formed of the first dichroic material, and a peak intensity (referred to as $P_O$) derived from the crystal structure of the second dichroic material are considered to be present.

Further, a peak intensity (referred to as $P_{M1}$) derived from the crystal structure formed of the first dichroic material in a case of containing the first dichroic material but not containing the second dichroic material and a peak intensity (referred to as $P_{O1}$) derived from the crystal structure formed of the second dichroic material in a case of containing the second dichroic material but not containing first dichroic material are considered.

In the case where the first dichroic material and the second dichroic material form a crystal structure, $P_M$ is different from $P_{M1}$ and $P_O$ is different from $P_{O1}$. The peak of $P_M$ and the peak of $P_O$ may not be detected in a case where $P_M$ is smaller than $P_{M1}$ and a case where $P_O$ is smaller than $P_{O1}$, and the peak of $P_{M1}$ and the peak of $P_{O1}$ may not be detected in a case where $P_M$ is greater than $P_{M1}$ and a case where $P_O$ is greater than $P_{O1}$. For example, in a case where $P_O$ is smaller than $P_{O1}$, the crystallinity of the crystal structure derived from the second dichroic material is considered to be degraded (the size of the crystal structure or the number of crystal structures is decreased).

As the method of verifying that the first dichroic material and the second dichroic material form a crystal structure, an example of the method of using an X-ray diffraction (XRD) method will be described in more detail below. First, the film 1 (the polarizer according to the embodiment of the present invention) and the film 1-2 used for measuring the maximum absorption wavelength are prepared.

Further, a composition 3 (a composition that contains at least the liquid crystal compound but does not contain the first dichroic material nor the second dichroic material) containing the same components as those in the present composition except that the first dichroic material and the second dichroic material are not contained is prepared. A film 1-3 is obtained in the same manner as in the method of producing the film 1 (the polarizer according to the embodiment of the present invention) except that the prepared composition 3 is used.

Further, the X-ray diffraction measurement is performed on the film 1 (the polarizer according to the embodiment of the present invention), the film 1-2, and the film 3 using an X-ray diffractometer for evaluating a thin film (trade name: "SmartLab" in-plane optical system, manufactured by Rigaku Corporation). Hereinafter, the X-ray diffraction analysis performed using the in-plane method is also described as "in-plane XRD". The in-plane XRD is performed by irradiating the surface of the polarizer layer with X-rays using an X-ray diffractometer for evaluating a thin film under the following conditions. Further, a direction in which the liquid crystal and the dichroic material are aligned in a major axis direction is set as an azimuthal angle (φ) of 0°, and in-plane XRD is performed in all directions for every 15°, and the orientation in the substrate plane where the peak intensity is the maximum is determined by q scan performed with respect to the observed peak. XRD spectra described below are compared using the spectra for in-plane measurement in the obtained orientation. For the peak intensity, a value standardized as a film thickness corresponding to the X-ray penetration length at an X-ray incidence angle of 0.2° is used.

Since the film 1, the film 1-2, and the film 1-3 contain the liquid crystal compound, a peak (peak A) having a half-width less than 2° (a peak derived from a crystal) and a peak (halo) (peak B) having a half-width of 2° or greater (a peak derived from a liquid crystal) are observed in the XRD spectra measured as described above.

Further, from the viewpoint that the effects of the present invention are more excellent, the diffraction angle of the peak A is preferably less than 17°.

Further, from the viewpoint that the effects of the present invention are more excellent, the diffraction angle of the peak B is preferably 17° or greater.

In a case where the following condition (i) or (ii) is satisfied in a case of comparing the XRD spectra of the film 1, the film 1-2, the film 1-3, and the film 1-4, it is determined that the first dichroic material and the second dichroic material form a crystal structure. On the contrary, in a case where neither of the following conditions (i) and (ii) is satisfied, it is determined that the first dichroic material and the second dichroic material do not form a crystal structure.

Condition (i): Among peaks A of the film 1-2, in a case where a peak (also referred to as a peak O2) at a diffraction angle that is not observed in the XRD spectrum of the film 1-3 is not observed in the XRD spectrum of the film 1 or is observed in the XRD spectrum of the film 1, the peak intensity of the peak O2 is greater than the peak intensity of a peak (also referred to as a peak O1) at the same diffraction angle as that of the peak O2. That is, the ratio of the intensity of the peak O1 to the intensity of the peak O2 is less than 1.

Condition (ii): Among peaks A of the film 1, a peak at a diffraction angle (also referred to as a peak OM) that is not observed in the XRD spectrum of the film 1-3 is not observed in the XRD spectra of the film 1-2 and the film 1-4. That is, in a case where the peak at the diffraction angle that is not observed in the XRD spectrum of the film 1-3 among peaks A of the film 1-2 is set as the peak O2 and the peak at the diffraction angle that is not observed in the XRD spectrum of the film 1-3 among peaks A of the film 1-4 is set as a peak M2, the position of the diffraction angle at which the peak O2 and the peak M2 are detected is different from the position of the diffraction angle at which the peak OM is detected.

As described above, since the conditions of preparing the film 1, the film 1-2, the film 1-3, and the film 1-4 and the XRD measurement conditions are made uniform, the peaks of the XRD spectra can be compared with each other.

First, the reason why it can be determined that the first dichroic material and the second dichroic material form a crystal structure in a case where the condition (i) is satisfied will be described.

The peak O2 is a peak corresponding to the second dichroic material. Therefore, it is considered that the peak O2 (peak O1) is usually detected also in the film 1 (the polarizer according to the embodiment of the present invention) containing the second dichroic material.

Meanwhile, it is assumed that the phenomenon in which the peak O1 is not detected or the intensity of the peak O1 is decreased even though the polarizer contains the second dichroic material occurs because the second dichroic material interacts with the first dichroic material in the polarizer to form a structure in which the first dichroic material and the second dichroic material are periodically arranged (more specifically, a crystal structure).

Hereinafter, the description will be made using the XRD spectrum in the condition (i). Further, the composition used for forming each film will be described in the description of the XRD spectrum of Example 1 below.

Figure 4:
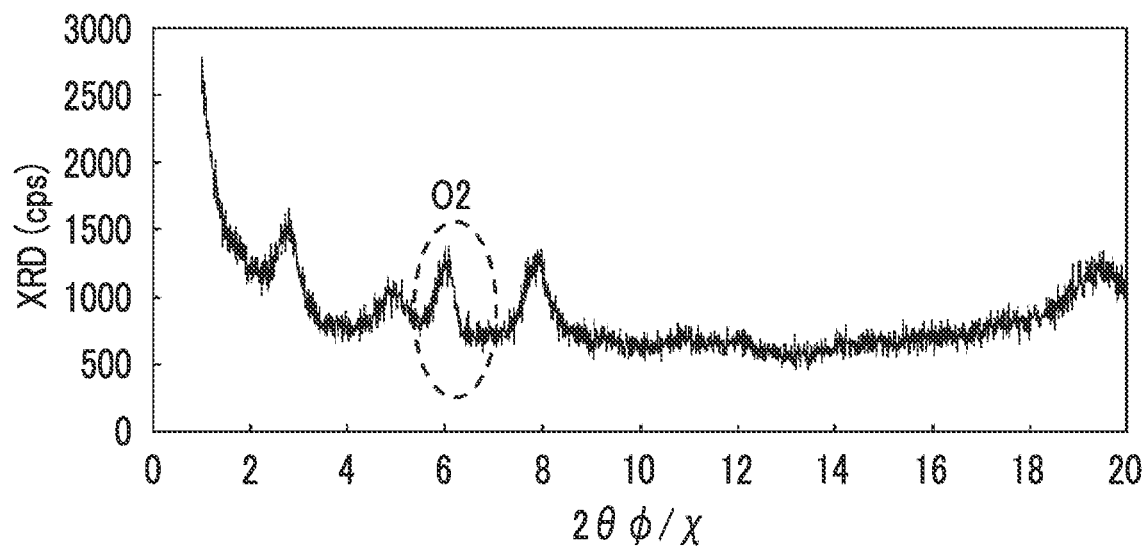
FIG. 4 is a graph showing an X-ray diffraction (XRD) spectrum corresponding to a film 1-2.

FIG. 4 shows the XRD spectrum of the film 1-2 obtained by using a polymer liquid crystal compound L1 described below as the liquid crystal compound and a second dichroic material O1 as the second dichroic material.

Figure 5:
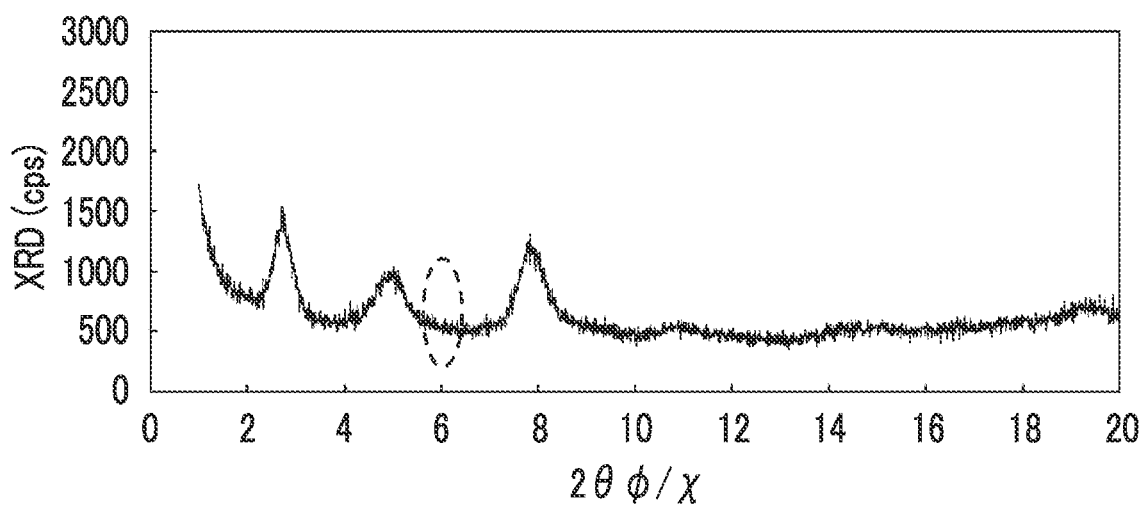
FIG. 5 is a graph showing an XRD spectrum corresponding to a film 1-3.

FIG. 5 shows the XRD spectrum of the film (film 1-3) formed of only the polymer liquid crystal compound L1.

Figure 6:
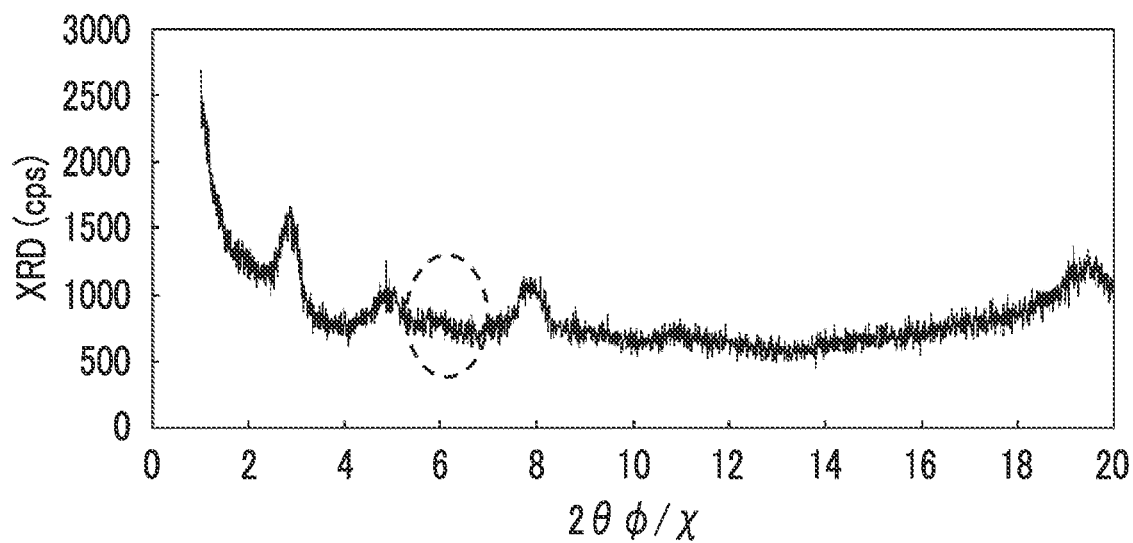
FIG. 6 is a graph showing an XRD spectrum corresponding to a polarizer (film 1) of Example 1.

FIG. 6 shows the XRD spectrum of the film 1 (corresponding to a polarizer of Example 1 described below) obtained by using the polymer liquid crystal compound L1, a first dichroic material M1 described below as the first dichroic material, and the second dichroic material O1.

As can be seen from the comparison between FIGS. 4 to 6, among the peaks of the XRD spectra of the film 1-2 of FIG. 4, the peak O2 at a diffraction angle that is not observed in the XRD of the film 1-3 of FIG. 5 is not observed in the XRD spectrum of the film 1 of FIG. 6. Therefore, it is determined that the above-described condition (i) is satisfied and the first dichroic material and the second dichroic material form a crystal structure.

Next, the reason why it can be determined that the first dichroic material and the second dichroic material form a crystal structure in a case where the condition (ii) is satisfied will be described.

The peak O2 is a peak corresponding to the second dichroic material, and the peak M2 is a peak corresponding to the first dichroic material. Therefore, it is considered that only the peak O2 and the peak M2 are detected as peaks derived from the dichroic materials in the film 1 (the polarizer according to the embodiment of the present invention) containing the first dichroic material and the second dichroic material.

Meanwhile, it is assumed that the phenomenon in which the peak OM that is not observed in the XRD spectra of the film 1-2 and the film 1-4 is detected in the film 1 occurs because the second dichroic material interacts with the first dichroic material in the polarizer to form a structure in which the first dichroic material and the second dichroic material are periodically arranged (more specifically, a crystal structure).

Next, the condition (ii) will be described in detail using the XRD spectrum. The following film 2, film 2-2, film 2-3, and film 2-4 respectively correspond to the above-described film 1, film 1-2, film 1-3, and film 1-4. Further, the composition used for forming each film will be described in the description of the XRD spectrum of Example 2 below.

Figure 7:
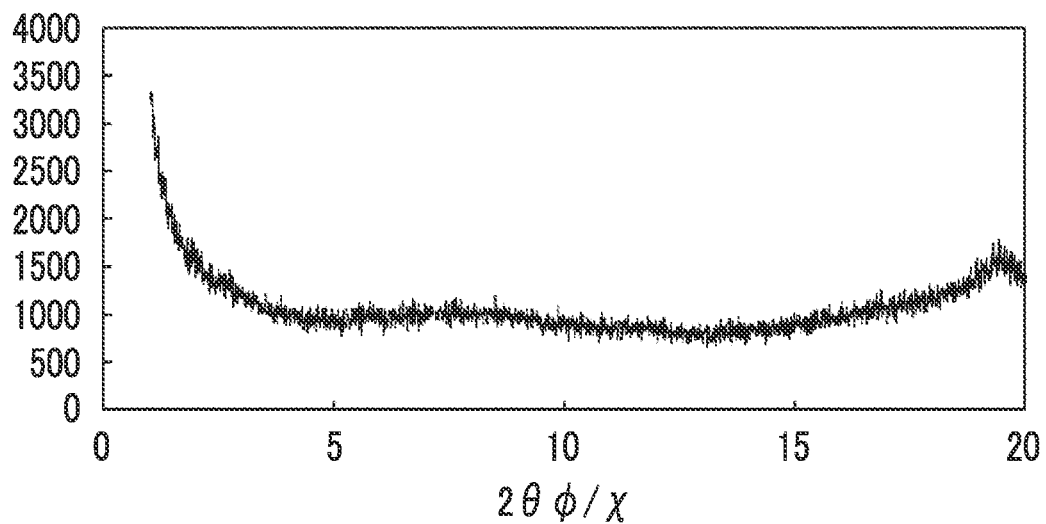
FIG. 7 is a graph showing an XRD spectrum corresponding to a film 2-4.

FIG. 7 shows the XRD spectrum of the film 2-4 obtained by using the polymer liquid crystal compound L1 described below as the liquid crystal compound and the first dichroic material M1.

Figure 8:
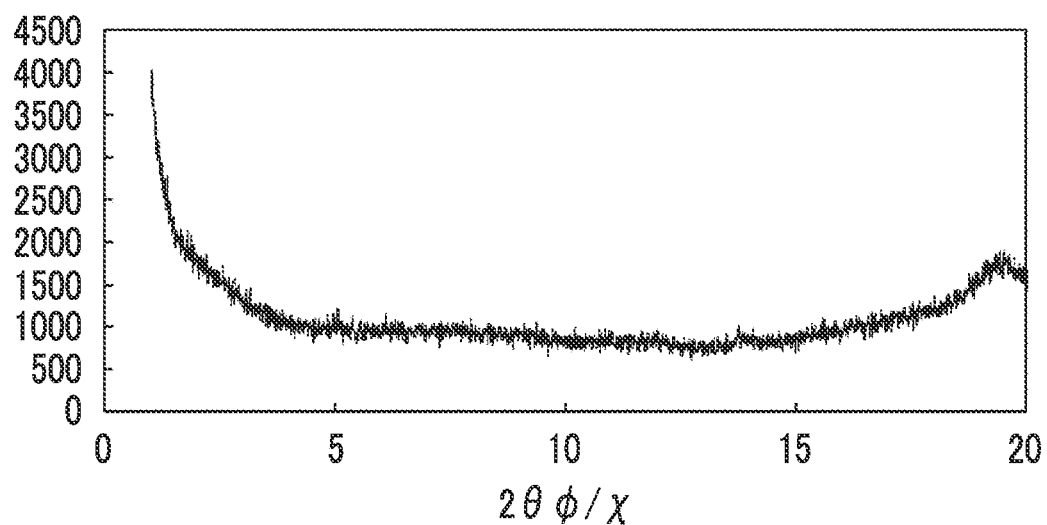
FIG. 8 is a graph showing an XRD spectrum corresponding to a film 2-2.

FIG. 8 shows the XRD spectrum of the film 2-2 obtained by using the polymer liquid crystal compound L1 described below as the liquid crystal compound and the second dichroic material O1 as the second dichroic material.

Figure 9:
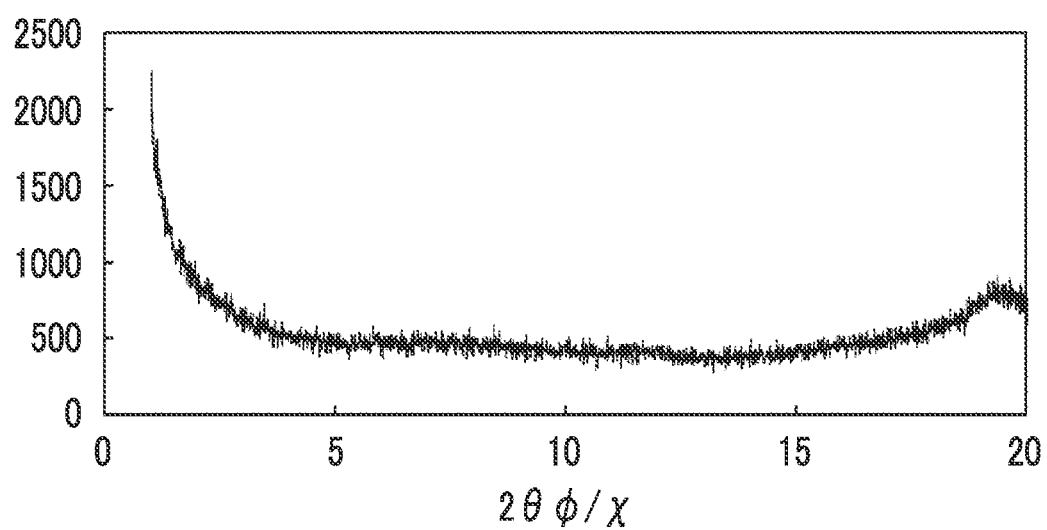
FIG. 9 is a graph showing an XRD spectrum corresponding to a film 2-3.

FIG. 9 shows the XRD spectrum of the film 2-3 formed of only the polymer liquid crystal compound L1.

Figure 10:
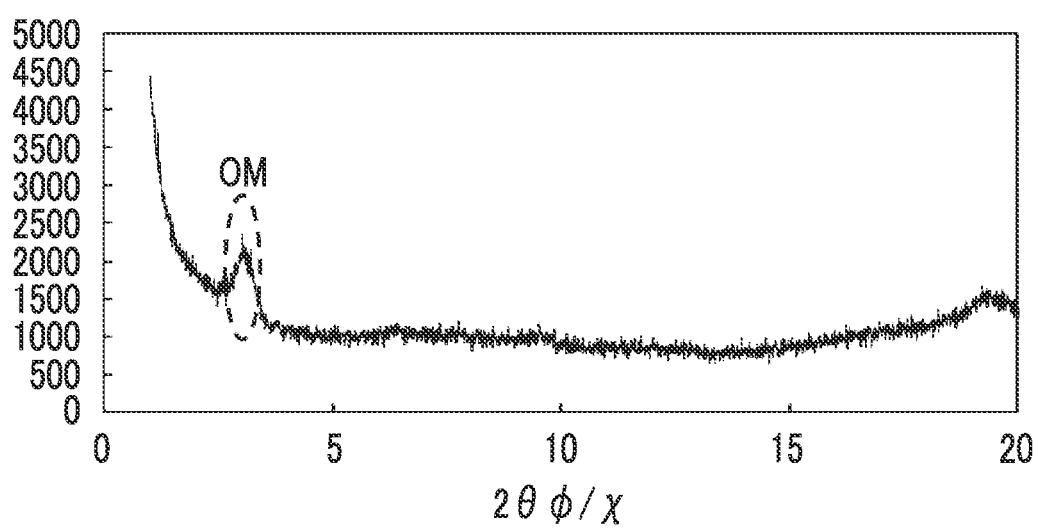
FIG. 10 is a graph showing an XRD spectrum corresponding to a polarizer (film 2) of Example 2.

FIG. 10 shows the XRD spectrum of the film 2 obtained by using the polymer liquid crystal compound L1, the first dichroic material M1 described below as the first dichroic material, and the second dichroic material O1.

As can be seen from the comparison between FIGS. 7, 8, 9, and 10, among the peaks of the XRD spectra of the film 2 of FIG. 10, the peak at a diffraction angle that is not observed in the XRD spectra of FIGS. 7, 8, and 9 is observed in the XRD spectrum of the film 2 of FIG. 10. Therefore, it is determined that the above-described condition (ii) is satisfied and the first dichroic material and the second dichroic material form a crystal structure.

The formation of the crystal structure in the polarizer according to the embodiment of the present invention can be confirmed by, for example, observing the surface or the cross section of the polarizer using a scanning electron microscope (SEM) or a transmission electron microscope (TEM). The size of the crystal structure is preferably 1 μm to 500 μm, more preferably 3 μm to 400 μm.

[Stabilization Energy]

In order for the first dichroic material and the second dichroic material to form a crystal structure, it is preferable that the stabilization energy obtained by theoretical calculation has a constant value. The stabilization energy indicates the energy loss (energy difference) in a case where one dichroic material between the first dichroic material and the second dichroic material enters the structure in which the other dichroic material is independently arranged. Since the other dichroic material is likely to enter the structure as the value decreases due to the reason that the loss is small. Therefore, the array structure is considered to be easily formed. The following method is exemplified as an example of a method of calculating the above-described stabilization energy.

The stabilization energy can be calculated using calculation software capable of calculating a molecular force field such as AMBER11 that is commercially available. More specifically, using the crystal structure information of one dichroic material (hereinafter, also referred to as a "dichroic material A") obtained by a crystal structure analysis method such as XRD, the stabilization energy is calculated as the energy in a case of replacing one molecule with the other dichroic material (hereinafter, also referred to as a "dichroic material B") from a super cell containing a plurality of unit cells based on the structure optimization calculation. Here, as the super cell, a cell containing the dichroic material A present in a range of 10 Å or greater from the center of gravity starting from the center of gravity of one molecule of the dichroic material A present at the replacement position.

The force field information referred to as General AMBER Force Field (GAFF) and charge information referred to as Restrained Electro Static Potential (RESP) are used as the calculation conditions. Here, GAFF can be set using software such as AmberTools bundled with AMBER11, and RESP can be set by calculating each molecule of the dichroic material under conditions of HF/6-31G(d) using software such as Gaussian09 that is commercially available and allowing AmberTools to read the results. Specifically, the stabilization energy is calculated as a value (X1−X2) obtained by subtracting a sum X2 of the "energy of the super cell formed of only the dichroic material A before being replaced with one molecule of the dichroic material B" and the "energy of one molecule of the dichroic material B" from a sum X1 of the "energy in a state in which one molecule of the dichroic material A in the super cell of the dichroic material A is replaced with one molecule of the dichroic material B" and the "energy of one molecule of the dichroic material A" obtained using the above-described calculation conditions.

From the viewpoint that the first dichroic material and the second dichroic material easily form the array structure and a polarizer having a higher degree of alignment is obtained, the stabilization energy (X1−X2) calculated by the above-described method is preferably less than 72 kcal/mol, preferably 55 kcal/mol or less, and more preferably 35 kcal/mol or less. Further, the lower limit of the stabilization energy is preferably −13 kcal/mol or greater.

Further, from the viewpoint that the first dichroic material and the second dichroic material easily form the array structure and a polarizer having a higher degree of alignment is obtained, the ratio (X1/X2) of the above-described sum X1 to the above-described sum X2 (hereinafter, also referred to as the "stabilization energy ratio") is preferably 0.22 or greater, more preferably 0.40 or greater, and particularly preferably 0.60 or greater. Further, the upper limit of the stabilization energy ratio is not particularly limited, but is typically 1.50 or less and preferably 1.30 or less.

[Method of Producing Polarizer]

The method of producing the polarizer according to the embodiment of the present invention is not particularly limited, but a method comprising a step of forming a coating film by coating an alignment film with the above-described present composition (hereinafter, also referred to as a "coating film forming step") and a step of aligning a dichroic material contained in the coating film (hereinafter, also referred to as an "aligning step") in this order (hereinafter, also referred to as the "present production method") is preferable from the viewpoint that the degree of alignment of the polarizer to be obtained is increased. Hereinafter, "the degree of alignment of the polarizer to be obtained is increased" will also be referred to as "the effects of the present invention are more excellent".

Hereinafter, each step will be described.

<Coating Film Forming Step>

The coating film forming step is a step of forming a coating film by coating the alignment film with the above-described present composition. The liquid crystal compound in the coating film is horizontally aligned due to an interaction between the alignment film and an interface modifier (in a case where the present composition contains an interface modifier).

The alignment film can be easily coated with the present composition of the present invention by using the composition of the present invention which contains the above-described solvent or using a liquid such as a melt obtained by heating the composition of the present invention.

Examples of the method of coating the film with the present composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Alignment Film)

An alignment film may be any film as long as the film allows the liquid crystal compound contained in the present composition to be horizontally aligned.

An alignment film can be provided by means such as a rubbing treatment performed on a film surface of an organic compound (preferably a polymer), oblique vapor deposition of an inorganic compound, formation of a layer having microgrooves, or accumulation of an organic compound (such as ω-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-076839A, JP2007-138138A, JP2007-

094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In this specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic material polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0 to 90° (vertical) and more preferably in a range of 40 to 90°.

In a case where light to be applied is non-polarized light, the alignment film is irradiated with non-polarized light obliquely. The incidence angle is preferably in a range of 10 to 80°, more preferably in a range of 20 to 60°, and still more preferably in a range of 30 to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of aligning the dichroic material contained in the coating film. In this manner, the polarizer according to the embodiment of the present invention is obtained. In the aligning step, the dichroic material is considered to be aligned along the liquid crystal compound aligned by the alignment film.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the dichroic material contained in the present composition may be aligned by performing the above-described coating film forming step or drying treatment. For example, in a form in which the present composition is prepared as a coating solution containing a solvent, the polarizer according to the embodiment of the present invention may be obtained by drying the coating film and removing the solvent from the coating film so that the dichroic material contained in the coating film is aligned.

It is preferable that the aligning step includes a heat treatment. In this manner, the dichroic material contained in the coating film is further aligned, and the degree of alignment of the polarizer to be obtained becomes higher.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the dichroic material contained in the coating film is further fixed, and the degree of alignment of the polarizer to be obtained is further increased. The cooling means is not particularly limited and can be performed according to a known method.

The polarizer according to the embodiment of the present invention can be obtained by performing the above-described steps.

[Other Steps]

The production method described below may include a step of curing the polarizer after the aligning step (hereinafter, also referred to as a "curing step").

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate of the present invention includes a base material, an alignment film provided on the base material, and the above-described polarizer according to the embodiment of the present invention provided on the alignment film.

Further, the laminate of the present invention may include a λ/4 plate on the polarizer according to the embodiment of the present invention.

Further, the laminate of the present invention may include a barrier layer between the polarizer according to the embodiment of the present invention and the λ/4 plate.

Hereinafter, each layer constituting the laminate of the present invention will be described.

[Base Material]

The base material can be appropriately selected, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph of JP2002-022942A can be applied. Further, even in a case of a polymer easily exhibiting the birefringence such as polycarbonate and polysulfone which has been known in the related art, a polymer with the exhibiting property which has been decreased by modifying the molecules described in WO2000/026705A can be used.

[Alignment Film]

The alignment film is as described above, and thus the description thereof will not be repeated.

[Polarizer]

The polarizer according to the embodiment of the present invention is as described above, and thus the description will not be repeated.

[λ/4 Plate]

A "λ/4 plate" is a plate having a λ/4 function, specifically, a plate having a function of converting linearly polarized light having a specific wavelength into circularly polarized light (or converting circularly polarized light into linearly polarized light).

For example, specific examples of a form in which a λ/4 plate has a single-layer structure include a stretched polymer film and a phase difference film in which an optically anisotropic layer having a λ/4 function is provided on a support. Further, specific examples of a form in which a λ/4 plate has a multilayer structure include a broadband λ/4 plate obtained by laminating a λ/4 plate and a λ/2 plate.

The λ/4 plate and the polarizer according to the embodiment of the present invention may be provided by coming into contact with each other, or another layer may be provided between the λ/4 plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate of the present invention comprises a barrier layer, the barrier layer is provided between the polarizer according to the embodiment of the present invention and the λ/4 plate. Further, in a case where a layer other than the barrier layer (for example, a pressure sensitive adhesive layer or an adhesive layer) is comprised between the polarizer according to the embodiment of the present invention and the λ/4 plate, the barrier layer can be provided, for example, between the polarizer according to the embodiment of the present invention and the layer other than the barrier layer.

The barrier layer is also referred to as a gas barrier layer (oxygen barrier layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate of the present invention can be used as a polarizing element (polarizing plate) or the like, for example, as a linear polarizing plate or a circularly polarizing plate.

In a case where the laminate of the present invention does not include an optically anisotropic layer such as the λ/4 plate, the laminate can be used as a linear polarizing plate.

Meanwhile, in a case where the laminate of the present invention includes the λ/4 plate, the laminate can be used as a circularly polarizing plate.

[Image Display Device]

An image display device according to the embodiment of the present invention includes the above-described polarizer according to the embodiment of the present invention or the above-described laminate of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate of the present invention (here, the laminate does not include a λ/4 plate) and a liquid crystal cell is more suitable.

In the present invention, between the polarizing elements provided on both sides of the liquid crystal cell, it is preferable that the laminate of the present invention is used as a front-side polarizing element and more preferable that the laminate of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystalline molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystalline molecules are substantially vertically aligned at the time of no voltage application. The concept of the liquid crystal cell in a VA mode includes (1) a liquid crystal cell in a VA mode in a narrow sense where rod-like liquid crystalline molecules are aligned substantially vertically at the time of no voltage application and substantially horizontally at the time of voltage application (described in JP1990-176625A (JP-H02-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, and a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Synthesis Example 1

The first dichroic material M1 was synthesized in the following manner.

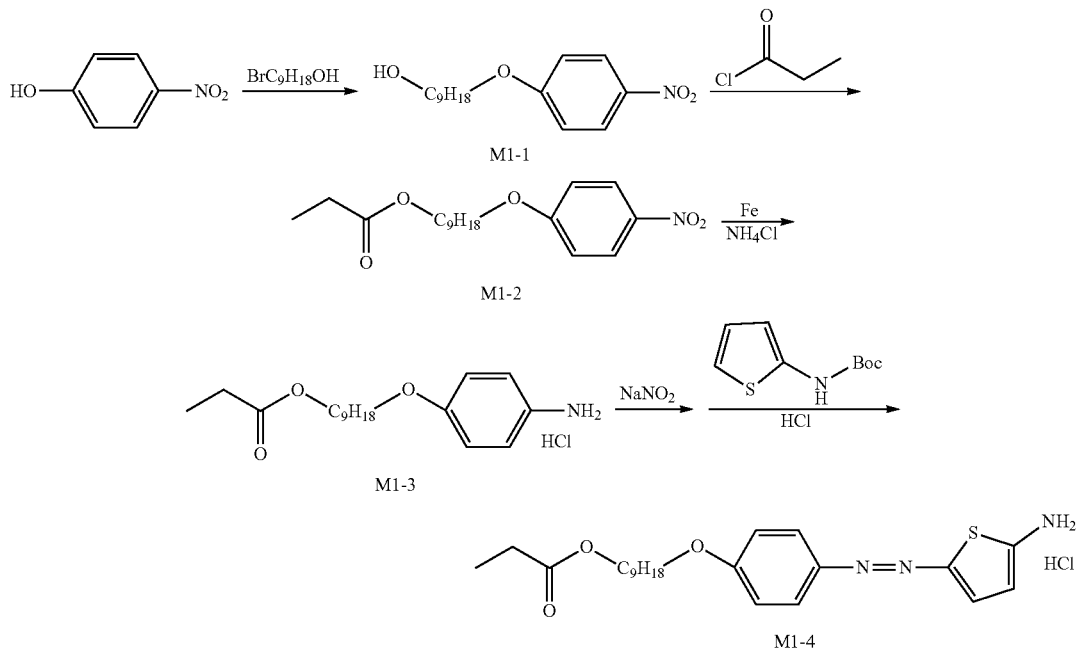

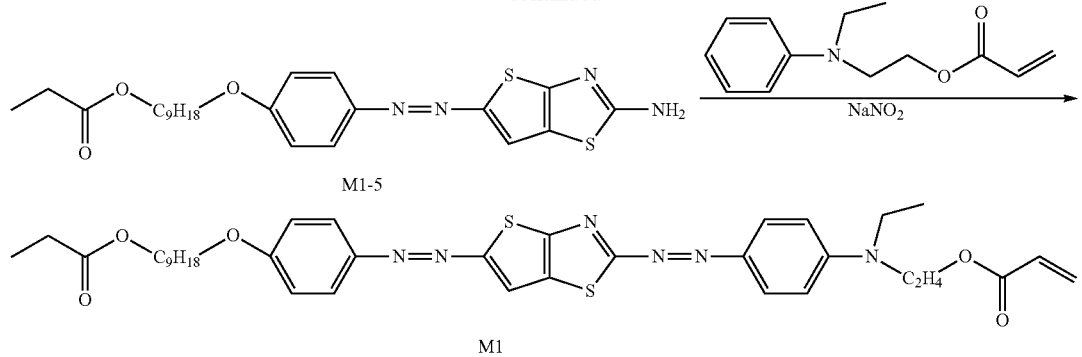

12.6 g of 4-nitrophenol, 20.0 g of 9-bromononanol, and 13.8 g of potassium carbonate were dissolved in 30 ml of N,N-dimethylacetamide (DMAc), and the solution was stirred at 105° C. for 2 hours. The temperature was lowered to room temperature, the solution was subjected to liquid separation and then washed with an ethyl acetate/10% ammonium chloride aqueous solution. The organic layer was dried over magnesium sulfate and then concentrated using a rotary evaporator, thereby obtaining a brown liquid (M1-1).

Next, 25 ml of DMAc was added to the obtained (M1-1), and the solution was stirred in an ice bath. The temperature of the reaction system was maintained at 15° C. or lower, 9.5 g of propionic acid chloride was added dropwise thereto, and the resulting solution was stirred at room temperature for 1 hour after the dropwise addition. An ethyl acetate/10% ammonium chloride aqueous solution was added thereto, and the solution was subjected to liquid separation and then washed. The solution was dried over magnesium sulfate and concentrated using a rotary evaporator, thereby obtaining a brown liquid (M1-2).

15.2 g of Fe powder, 7.2 g of ammonium chloride, 20 ml of 2-propanol, and 10 ml of water were mixed and refluxed at 105° C. A yellow solid (M1-2) which had been heated and dissolved in 30 ml of ethyl acetate was added dropwise to the refluxed system. After the dropwise addition, the solution was reacted for 30 minutes under reflux. The solution was cooled to room temperature, iron powder was removed by Celite filtration, the filtrate was separated into ethyl acetate and water, and the organic layer was washed with water three times.

The organic layer was concentrated using a rotary evaporator, and 15 ml of tetrahydrofuran (THF) and 15 ml of ethyl acetate were added thereto. A mixed solution of 240 ml of water and 20 ml of concentrated hydrochloric acid was added dropwise to the present solution to obtain 15.3 g of a target (M1-3).

NMR (Nuclear Magnetic Resonance) data (DMSO-d6) δ: 1.03 (t, 3H), 1.25-1.48 (m, 11H), 1.58 (m, 2H), 1.71 (m, 2H), 2.30 (m, 2H), 3.97 (m, 4H), 7.01 (d, 2H), 7.29 (d, 2H), 10.04 (br-s, 3H)

2-Aminothiophene hydrochloride was synthesized by 2-nitrothiophene according to the method described in the literature (Journal of Medicinal Chemistry, 2005, Vol. 48, pp. 5794).

6.2 g of (M1-3) obtained in the above-described manner was added to a mixed solution of 15 ml of 12 mol/L hydrochloric acid, 30 ml of water, and 30 ml of THF, the solution was cooled to an internal temperature of 5° C. or lower, and 1.4 g of sodium nitrite was dissolved in 9 ml of water and added dropwise to the solution. The solution was stirred at an internal temperature of 5° C. or lower for 1 hour to prepare a diazonium solution.

Next, 2.4 g of 2-aminothiophene hydrochloride was dissolved in 12 ml of water and 6 ml of hydrochloric acid, and the diazonium solution prepared above was added dropwise at an internal temperature of 0° C. The reaction solution was heated to room temperature and stirred for 2 hours.

The precipitated solid was separated by filtration and dried to obtain 6.3 g of a reddish orange solid (M1-4).

NMR data (DMSO-d6) δ: 1.01 (t, 3H), 1.29-1.40 (m, 11H), 1.55 (m, 2H) 1.69 (m, 2H), 2.29 (m, 2H), 3.17 (s, 2H), 3.97 (m, 4H), 6.88 (br-s, 1H), 6.97 (d, 2H), 7.39 (d, 2H), 7.85 (m, 1H)

In the formula, "Boc" represents a tert-butoxycarbonyl group.

5.6 g of (M1-4) obtained above was suspended and dissolved in 100 ml of acetic acid, and 1.5 g of sodium thiocyanate was added thereto at room temperature. 2.0 g of bromine was added dropwise to the solution while the solution was cooled with water and the internal temperature was maintained at 20° C. or lower.

After the resulting solution was stirred at room temperature for 2 hours, 100 ml of water was added thereto, and the obtained solid was separated by filtration and dried, thereby obtaining 5.3 g of a black solid (M1-5).

NMR data (CDCl₃) δ: 1.14 (t, 3H), 1.30-1.50 (m, 11H), 1.60 (m, 6H), 1.81 (m, 2H), 2.32 (q, 2H), 4.04 (m, 4H), 5.31 (br, 2H), 6.95 (d, 2H), 7.66 (s, 1H), 7.78 (d, 2H)

4.7 g of (M1-5) obtained above was added to 6 ml of hydrochloric acid and 6 ml of acetic acid, 5 ml of an aqueous solution containing 0.72 g of sodium nitrite was added dropwise thereto at 0° C. or lower under ice-cooling, the solution was stirred for 1 hour, and 0.52 mg of amidosulfuric acid was added thereto, thereby obtaining a diazonium solution.

The diazonium solution was added dropwise to a 10 ml methanol solution containing 2.2 g of N-ethyl-N-(2-acryloyloxyethyl)aniline while the methanol solution was maintained at 0° C. or lower. After the solution was heated to room temperature and stirred for 1 hour, 30 ml of water was added thereto, and the obtained solid was filtered. The resultant was purified by a column, thereby obtaining 0.6 g of a black-green solid compound (first dichroic material M1).

Further, N-ethyl-N-(2-acryloyloxyethyl)aniline was synthesized using N-ethyl aniline as a raw material according to U.S. Pat. No. 7,601,849B and a known method.

NMR data (solvent: CDCl₃) δ: 1.14 (t, 3H), 1.26 (t, 3H), 1.29 (br-s, 8H), 1.49 (m, 2H), 1.64 (m, 2H), 1.82 (m, 2H), 2.33 (m, 2H), 3.58 (m, 2H), 3.77 (m, 2H), 4.07 (m, 4H), 4.40

(m, 2H), 5.90 (dd, 1H), 6.15 (dd, 1H), 6.40 (dd, 1H), 6.82 (d, 2H), 7.00 (d, 2H), 7.88 (m, 3H), 7.95 (d, 2H)

Synthesis Example 2

The second dichroic dye compound O1 was synthesized as follows.

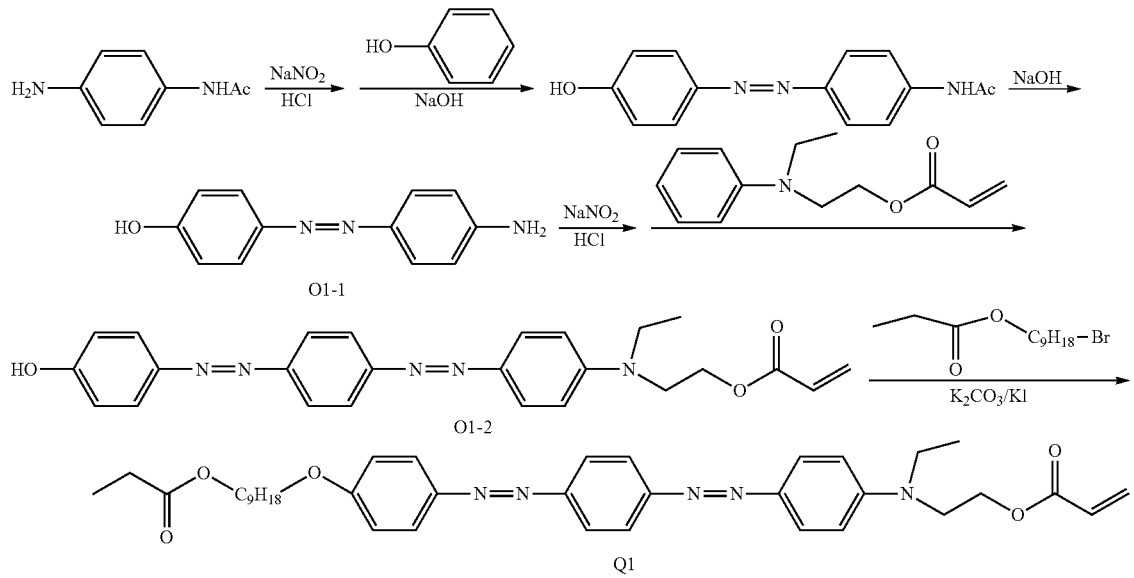

100 ml of water was added to 27 g of p-acetylaminoaniline, and the solution was cooled to 0° C. and stirred. 66 ml of concentrated hydrochloric acid was added dropwise to the solution. Next, an aqueous solution obtained by dissolving 12.5 g of sodium nitrite (manufactured by Wako Pure Chemical Industries, Ltd.) in 30 ml of water was added dropwise thereto. The internal temperature was maintained at 0° C. to 5° C. After the dropwise addition, the solution was stirred at 0° C. or lower for 1 hour to prepare a diazonium salt solution.

20 ml of methanol was added to 17.5 g of phenol and stirred for dissolution. An aqueous solution obtained by dissolving 28.8 g of NaOH in 150 ml of water was added to the solution, and the solution was cooled to 0° C. and stirred. The diazonium salt solution prepared by the above-described method was added dropwise to the solution at 0° C. to 5° C. After the dropwise addition, the solution was stirred at 5° C. for 1 hour and then stirred at room temperature for 1 hour to complete the reaction. Next, an aqueous solution obtained by dissolving 36.0 g of NaOH in 150 ml of water, and the solution was heated under reflux for 3 hours. After completion of the reaction, the solution was cooled to room temperature, the pH thereof was adjusted to 7.0 by adding a hydrochloric acid aqueous solution thereto, and the precipitated crystals were filtered, thereby obtaining 40.2 g of a compound O1-1 (yield: 87.2%, brown crystals).

Further, N-ethyl-N-(2-acryloyloxyethyl)aniline was synthesized using N-ethyl aniline as a raw material according to U.S. Pat. No. 7,601,849B and a known method.

100 ml of acetic acid, 10 ml of water, and 20 ml of methanol were added to 5.0 g of the compound O1-1, and the solution was cooled to 0° C. and stirred. 7 ml of concentrated hydrochloric acid was added dropwise to the solution. Next, an aqueous solution obtained by dissolving 1.8 g of sodium nitrite in 5 ml of water was added dropwise. The internal temperature was maintained at 0 to 5° C. After the dropwise addition, the solution was stirred at 0° C. or lower for 1 hour to prepare a diazonium salt solution.

7.7 g of sodium acetate, 100 ml of methanol, and 100 ml of water were added to 8.4 g of N-ethyl-N-(2-acryloyloxyethyl)aniline synthesized above, and the solution was stirred for dissolution, cooled to 0° C., and stirred. The diazonium salt solution prepared by the above-described method was added dropwise to the solution at 0° C. to 5° C. After the dropwise addition, the solution was stirred at 5° C. for 1 hour and then stirred at room temperature for 1 hour to complete the reaction. The precipitated crystals were separated by filtration, thereby obtaining 6.2 g of a compound O1-2 (yield: 86.8%, brown crystals).

50.0 g of 1-bromononanol was dissolved in 500 ml of ethyl acetate, 26.5 g of triethylamine was added dropwise thereto, and the resulting solution was stirred at 5° C. 22.8 g of propionyl chloride was added dropwise thereto, and the solution was stirred at room temperature for 1 hour to complete the reaction. After the completion of the reaction, 175 ml of water was added thereto, the solution was subjected to liquid separation, and 10 g of magnesium sulfate was added to the organic layer for dehydration. The obtained organic layer was concentrated using a rotary evaporator, thereby obtaining 9-bromononyl propionate (52 g, colorless transparent liquid).

72 ml of dimethylacetamide was added to the compound O1-2 (7.2 g), potassium carbonate (7.7 g, 0.014 mmol), and potassium iodide (0.15 g, 0.002 mol), and the solution was heated to 80° C. and stirred. 8.4 g of 9-bromononyl propionate synthesized above was added dropwise to the solution. After the dropwise addition, the solution was heated to 80° C. and stirred for 4 hours to complete the reaction. After the completion of the reaction, the reaction solution was poured into water, and the precipitated crystals were filtered and washed with water. The crystals were separated and purified by silica gel column chromatography (as an eluent, chloroform, and chloroform and ethyl acetate at a ratio of 50/1 were used in this order). Methanol was added to the residues, the precipitated crystals were filtered, and the resultant was washed with methanol and dried. In this manner, 5.5 g of a second dichroic material O1 (orange crystals) was obtained.

NMR data (solvent: CDCl$_3$) δ: 1.13 (t, 3H), 1.25 (t, 3H), 1.29 (br-s, 8H), 1.49 (m, 2H), 1.64 (m, 2H), 1.82 (m, 2H), 2.33 (q, 2H), 2.53 (m, 2H), 2.73 (t, 2H), 4.03 (q, 4H), 4.38 (t, 2H), 5.86 (d, 1H), 6.12 (dd, 1H), 6.43 (d, 1H), 6.83 (d, 2H), 7.00 (d, 2H), 7.94 (m, 8H)

Synthesis Example 3

A third dichroic material Y1 was synthesized in the following manner.

Further, the third dichroic material Y1 was synthesized according to the following route.

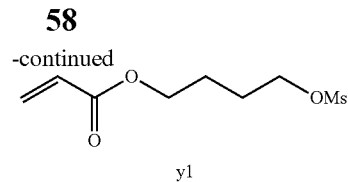
y1

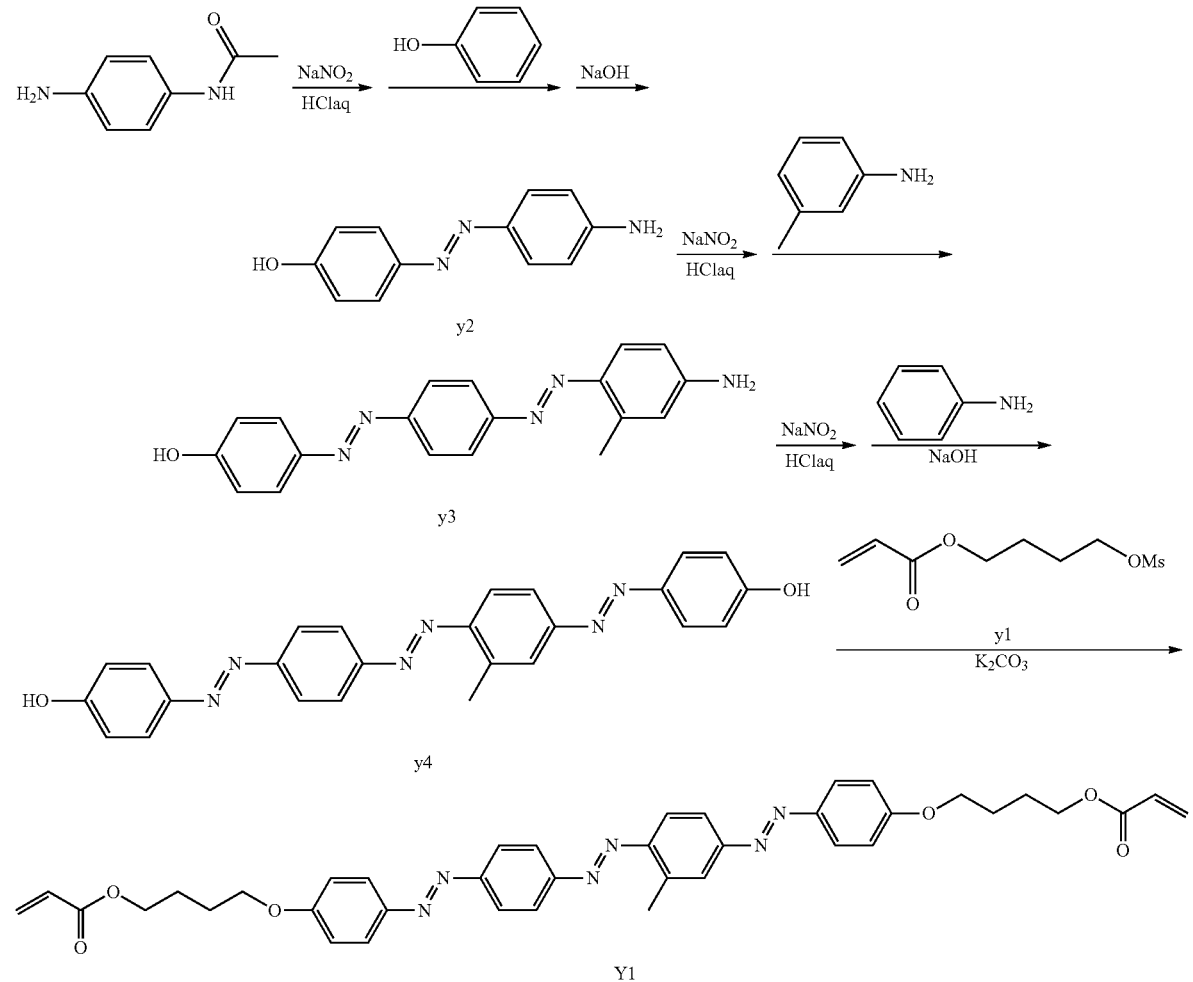

First, 4-hydroxybutyl acrylate (20 g) and mesyl chloride (16.8 g, MsCl) were dissolved in ethyl acetate (90 mL), and triethylamine (16.4 g, NEt$_3$) was added dropwise thereto while the solution was cooled in an ice bath. Thereafter, the resulting solution was stirred at room temperature for 2 hours, and 1 N HCl was added thereto to perform liquid separation. The obtained organic layer was distilled off under reduced pressure, thereby obtaining a compound y1 (30 g) with the following structure.

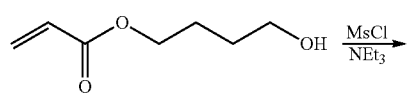

First, a compound y2 (10 g) was synthesized according to the literature (Chem. Eur. J. 2004. 10. 2011).

The compound y2 (10 g) was dissolved in water (300 mL) and hydrochloric acid (17 mL), the solution was cooled in an ice bath, sodium nitrite (3.3 g) was added thereto, and the resulting solution was stirred for 30 minutes. Further, m-toluidine (5.1 g) was added thereto after amidosulfuric acid (0.5 g) was further added thereto, and the solution was stirred at room temperature for 1 hour. After the solution was stirred, the solid obtained by neutralization with hydrochloric acid was collected by suction filtration, thereby obtaining a compound y2 (3.2 g).

The compound y2 (1 g) was dissolved in a THF solution consisting of tetrahydrofuran (30 mL, THF), water (10 mL), and hydrochloric acid (1.6 mL), the solution was cooled in an ice bath, sodium nitrite (0.3 g) was added thereto, the resulting solution was stirred for 30 minutes, and amidosulfuric acid (0.5 g) was further added thereto. Separately, phenol (0.4 g) was dissolved in potassium carbonate (2.76 g) and water (50 mL), the solution was cooled in an ice bath, the above-described THF solution was added dropwise thereto, and the resulting solution was stirred at room temperature for 1 hour. After the solution was stirred, water (200 mL) was added, and the obtained compound y3 (1.7 g) was suction-filtered.

The compound y3 (0.6 g), the compound y1 (0.8 g), and potassium carbonate (0.95 g) were dissolved in DMAc (30 mL, dimethylacetamide) and the solution was stirred at 90° C. for 3.5 hours. After the solution was stirred, water (300 mL) was added, the obtained solid was suction-filtered, thereby obtaining a third dichroic material Y1 (0.3 g).

Synthesis Example 4

The polymer liquid crystal compound L1 was prepared by the following procedures.

Synthesis of Compound L1-2

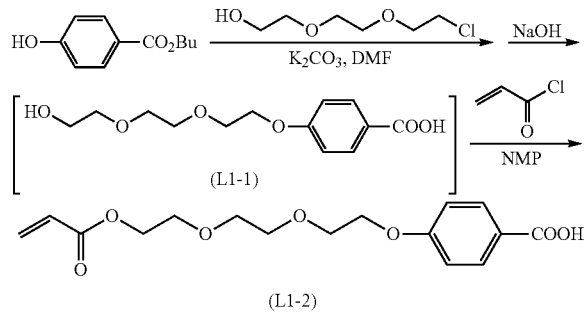

2-Chloroethoxyethoxyethanol (244 g) and potassium carbonate (200 g) were added to a solution of butylparaben (201 g) in N,N-dimethylformamide (DMF) (300 mL). The solution was stirred at 95° C. for 9 hours, toluene (262 mL) and water (660 mL) were added thereto, and concentrated hydrochloric acid (147 g) was added dropwise thereto. The reaction solution was stirred for 10 minutes, allowed to stand, and washed by performing a liquid separation operation. A 28 mass % sodium methoxide methanol solution (500 g) and water (402 mL) were added to the obtained organic layer, and the solution was stirred at 50° C. for 2 hours. Thereafter, the organic solvent was distilled off by concentration, water (402 mL) was added thereto, and the solution was concentrated again at 50° C. until the weight thereof reached 1.13 kg. Water (478 mL) was added to the obtained solution, and concentrated hydrochloric acid (278 g) was added dropwise thereto. Ethyl acetate (1.45 kg) was added thereto, and the solution was stirred at 30° C. for 10 minutes, and the aqueous layer was removed by performing the liquid separation operation. Next, a 20 mass % sodium chloride solution (960 mL) was added thereto, the solution was stirred at 30° C. for 10 minutes, and the aqueous layer was removed by performing the liquid separation operation. N-methylpyrrolidone (824 g) was added to the obtained organic layer, and a concentration operation was performed thereon at 70° C. for 4 hours to obtain 1.13 kg of a N-methylpyrrolidone solution containing the compound (L1-1). The next step was performed using 1085 g of the obtained N-methylpyrrolidone solution containing the obtained compound (L1-1).

N,N-dimethylaniline (189 g) and 2,2,6,6-tetramethylpiperazine (1.5 g) were added to the obtained N-methylpyrrolidone (NMP) solution (1085 g) containing the obtained compound (L1-1), the internal temperature was lowered, and acrylic acid chloride (122 g) was added dropwise thereto such that the internal temperature did not rise above 10° C. The solution was stirred at an internal temperature of 10° C. for 2 hours, methanol (81 g) was added dropwise thereto, and the resulting solution was stirred for 30 minutes. Ethyl acetate (1.66 kg), 10 mass % saline (700 mL), and 1 N aqueous hydrochloric acid (840 mL) were added thereto, and the aqueous layer was removed by performing the liquid separation operation. Next, a 10 mass % sodium chloride solution (800 mL) was added thereto, the solution was stirred at 30° C. for 10 minutes, and the aqueous layer was removed by performing the liquid separation operation. Next, a 20 mass % sodium chloride solution (800 mL) was added thereto, the solution was stirred at 30° C. for 10 minutes, and the aqueous layer was removed by performing the liquid separation operation. A mixed solvent of hexane/isopropyl alcohol (1780 mL/900 mL) was added to the obtained organic layer, and the solution was cooled to 5° C., stirred for 30 minutes, and then filtered, thereby obtaining 209 g of a white solid compound (L1-2) (3 steps, yield of 65%). In the structural formula, Bu represents a butyl group.

$^1$H-NMR (solvent: $CDCl_3$) δ (ppm): 3.67-3.78 (m, 6H), 3.87-3.92 (m, 2H), 4.18-4.23 (m, 2H), 4.31-4.35 (m, 2H), 5.80-5.85 (m, 1H), 6.11-6.19 (m, 1H), 6.40-6.46 (m, 1H), 6.93-6.98 (m, 2H), 8.02-8.07 (m, 2H)

Synthesis of Compound L1-3

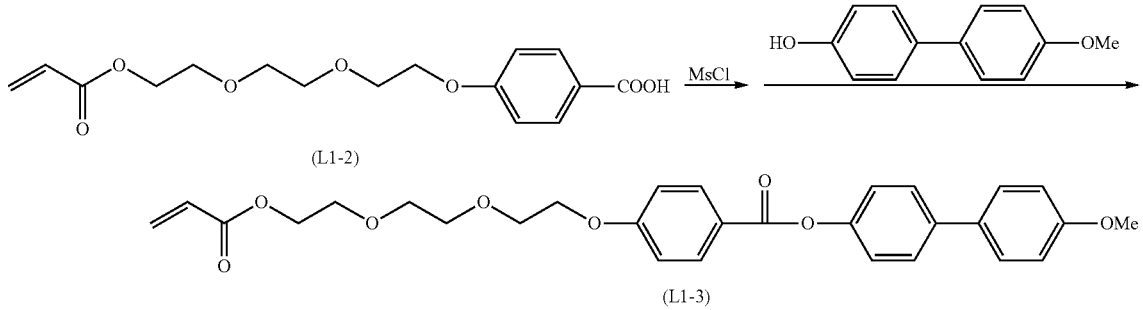

Dibutylhydroxytoluene (BHT) (200 mg) was added to a solution of methanesulfonyl chloride (MsCl) (73.4 mmol, 5.7 mL) in tetrahydrofuran (THF) (70 mL), and the internal temperature thereof was lowered to −5° C. A THF solution of the compound (L1-2) (66.7 mmol, 21.6 g) and diisopropylethylamine (DIPEA) (75.6 mmol, 13.0 mL) was added dropwise thereto such that the internal temperature thereof did not rise above 0° C. or higher. The solution was stirred at −5° C. for 30 minutes, N,N-dimethyl-4-aminopyridine (DMAP) (200 mg) was added thereto, and a solution of diisopropylethylamine (75.6 mmol, 13.0 mL) and 4-hydroxy-4'-methoxy biphenyl (60.6 mmol, 12.1 g) in tetrahydrofuran (THF) and dimethylacetamide (DMAc) was added dropwise thereto such that the internal temperature thereof did not rise above 0° C. or higher. Thereafter, the solution was stirred at room temperature for 4 hours. The reaction was stopped by adding methanol (5 mL) to the solution, water and ethyl acetate were added thereto. The solvent was removed from the organic layer extracted with ethyl acetate using a rotary evaporator, and the organic layer was purified by column chromatography using ethyl acetate and hexane, thereby obtaining 18.7 g (yield: 61%) of a compound (L1-3) as a white solid. In the structural formula, Me represents a methyl group.

$^1$H-NMR (solvent: CDCl$_3$) δ (ppm): 3.65-3.82 (m, 6H), 3.85 (s, 3H), 3.85-3.95 (m, 2H), 4.18-4.28 (m, 2H), 4.28-4.40 (m, 2H), 5.82 (dd, 1H), 6.15 (dd, 1H), 6.43 (dd, 1H), 6.90-7.05 (m, 4H), 7.20-7.30 (m, 2H), 7.45-7.65 (m, 4H), 8.10-8.20 (m, 2H)

The following compound (L1-b) was contained as an impurity.

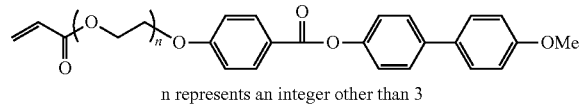

(L1-b)

n represents an integer other than 3

Synthesis of Compound L1-23

Methyl 4-(4-hydroxyphenyl)benzoate was synthesized according to the method described in Journal of Polymer Science, Part A: Polymer Chemistry, 2012, vol. 50, p. 3936 to 3943.

2,2,6,6-Tetramethylpiperidine 1-oxyl (68 mg) was added to a solution of methanesulfonyl chloride (MsCl) (54.8 mmol, 6.27 g) in ethyl acetate (44 mL), and the internal temperature thereof was lowered to −5° C. A THF solution of the compound (L1-2) (52.6 mmol, 17.1 g) synthesized in the above-described manner and diisopropylethylamine (DIPEA) (57.0 mol, 7.36 g) was added dropwise thereto such that the internal temperature thereof did not rise above 0° C. or higher. After the solution was stirred at −5° C. for 30 minutes, a solution of methyl 4-(4-hydroxyphenyl)benzoate (43.8 mmol, 10.0 g) in DMAc and N-methyl-imidazole (NMI) (1.8 g) were added thereto, and diisopropylethylamine (75.6 mmol, 13.0 mL) was added dropwise thereto such that the internal temperature thereof did not rise above 0° C. or higher. Thereafter, the solution was stirred at room temperature for 4 hours. The reaction was stopped by adding water and ethyl acetate to the solution. Liquid separation was performed so that the solvent was removed from the organic layer extracted with ethyl acetate using a rotary evaporator, and the organic layer was purified by column chromatography using ethyl acetate and hexane, thereby obtaining 20.4 g (yield of 87%) of a compound (L1-23) as a white solid.

$^1$H-NMR (solvent: CDCl$_3$) δ (ppm): 3.68-3.80 (m, 6H), 3.87-3.95 (m, 2H), 3.95 (s, 3H), 4.20-4.27 (m, 2H), 4.31-4.37 (m, 2H), 5.83 (dd, 1H), 6.16 (dd, 1H), 6.43 (dd, 1H), 6.97-7.05 (m, 2H), 7.28-7.35 (m, 2H), 7.64-7.72 (m, 4H), 8.08-8.20 (m, 4H)

The following compound (L1-b2) was contained as an impurity.

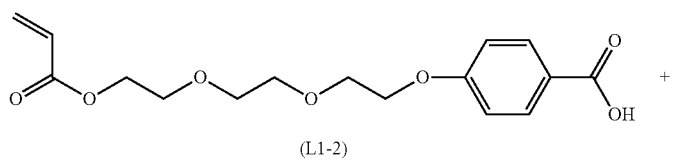

(L1-2)

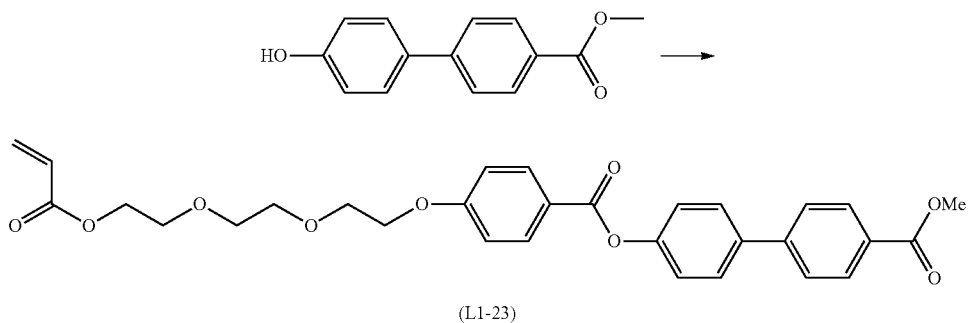

(L1-23)

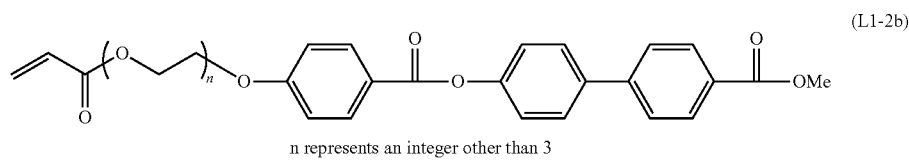

n represents an integer other than 3

Synthesis of Polymer Liquid Crystal Compound L1

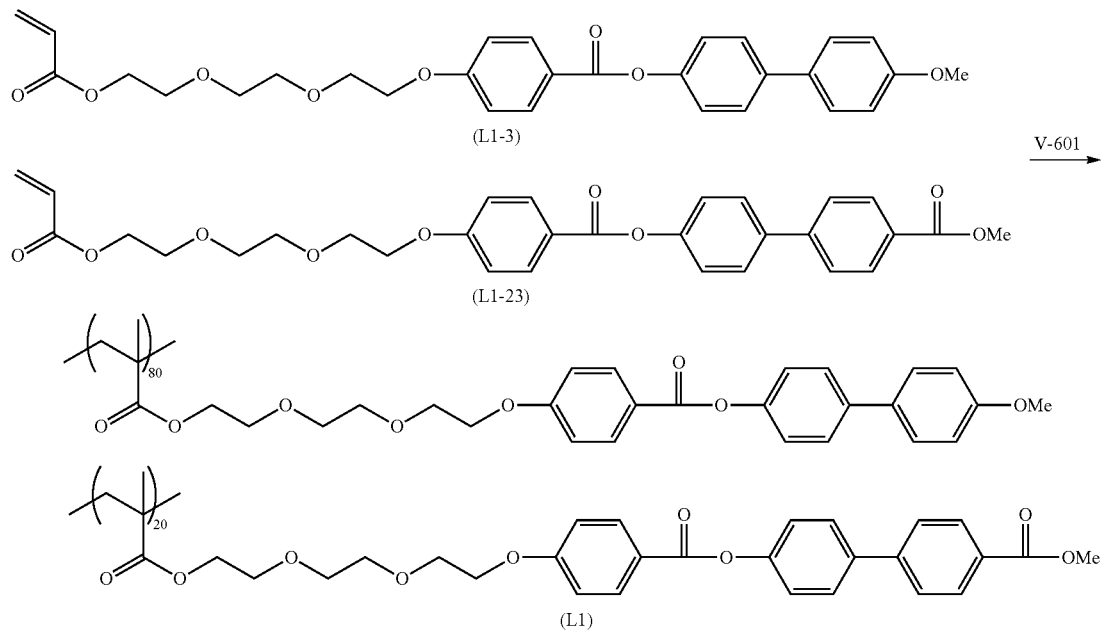

The compound (L1-3) (84 g), the compound (L1-23) (21 g), and dibutylhydroxytoluene (BHT) (158 mg) were dissolved in anisole (337 g). Dimethyl 2,2'-azobis(2-methylpropionate) (1660 mg) (trade name: "V-601") was added thereto at room temperature, and the solution was stirred. The obtained anisole solution was added dropwise to anisole (84 g) heated to 80° C. in a nitrogen atmosphere for 2 hours, and the resulting solution was stirred at 80° C. for 4 hours after the dropwise addition. The obtained reaction solution was added dropwise to methanol (1080 mL), and the precipitate was collected by a filtration operation, and the residue was washed with acetonitrile, thereby obtaining 100 g (yield of 95%) of a white solid compound (polymer liquid crystal compound L1). The weight-average molecular weight (Mw) of the obtained polymer liquid crystal compound L1 was 13300.

Further, the molecular weight was calculated by gel permeation chromatography (GPC) in terms of polystyrene, three of TOSOH TSKgel Super AWM-H (manufactured by Tosoh Corporation) were connected to each other and used as columns, and N-methylpyrrolidone was used as a solvent.

Example 1

[Preparation of Transparent Support 1]

A TAC base material (product name, "TG40", manufactured by FUJIFILM Corporation) having a thickness of 40 μm was continuously coated with an alignment film coating solution having the following composition using a #8 wire bar. Thereafter, the base material was dried with warm air at 100° C. for 2 minutes, thereby obtaining a transparent support 1 in which a polyvinyl alcohol (PVA) alignment film having a thickness of 0.8 μm was formed on the TAC base material.

Further, modified polyvinyl alcohol was added to the alignment film coating solution such that the concentration of solid contents was set to 4% by mass.

| Composition of coating solution for alignment film Modified polyvinyl alcohol shown below | |
|---|---|
| Water: | 70 parts by mass |
| Methanol: | 30 parts by mass |

Modified Polyvinyl Alcohol

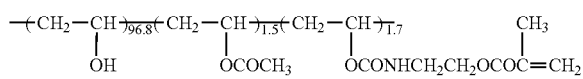

[Preparation of Alignment Film 1]

41.6 parts by mass of butoxyethanol, 41.6 parts by mass of dipropylene glycol monomethyl ether, and 15.8 parts by mass of pure water were added to 1 part by mass of a photo-alignment material E-1 having the following structure, and the obtained solution was filtered using a 0.45 μm membrane filter under pressure, thereby preparing a composition 1 for forming an alignment film.

Thereafter, the transparent support 1 was coated with the obtained composition 1 for forming an alignment film and dried at 60° C. for 1 minute. Next, the obtained coating film was irradiated with linearly polarized ultraviolet rays (illuminance of 4.5 mW, irradiation dose of 500 mJ/cm²) using a polarized ultraviolet ray exposure device, thereby preparing an alignment film 1 (noted as azo (E-1) in Tables 1A and 1B).

[Preparation of Polarizer 1]

The obtained alignment film 1 was continuously coated with the following polarizer-forming composition 1 using a #7 wire bar to form a coating film 1.

Next, the coating film 1 was heated at 140° C. for 90 seconds, and the coating film 1 was cooled to room temperature (23° C.).

Next, the coating film 1 was heated at 90° C. for 60 seconds and cooled to room temperature again.

Thereafter, the coating film 1 was irradiated under an irradiation condition of an illuminance of 28 mW/cm² for 60 seconds using a high-pressure mercury lamp, thereby preparing a polarizer 1 (film 1) on the alignment film 1.

| Composition of polarizer-forming composition 1 | |
|---|---|
| First dichroic material M1 shown below: | 0.555 parts by mass |
| Second dichroic material O1 shown below: | 0.205 parts by mass |
| Third dichroic material Y1 shown below: | 0.128 parts by mass |
| Polymer liquid crystal compound L1 shown below: | 4.032 parts by mass |
| Interface modifier F1 shown below: | 0.039 parts by mass |
| Polymerization initiator IRGACURE 819 (manufactured by BASF SE): | 0.043 parts by mass |
| Cyclopentanone: | 66.500 parts by mass |
| Tetrahydrofuran: | 28.500 parts by mass |

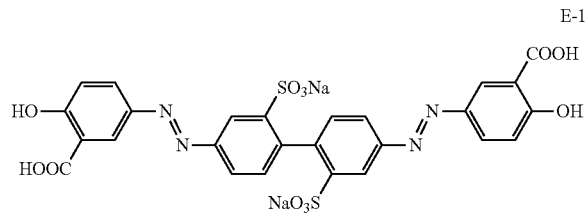

E-1

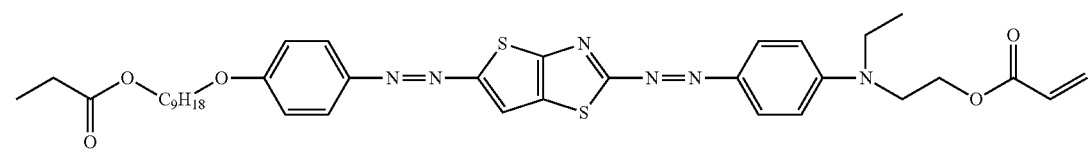

M1

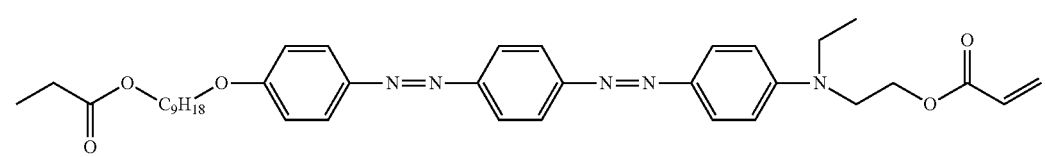

O1

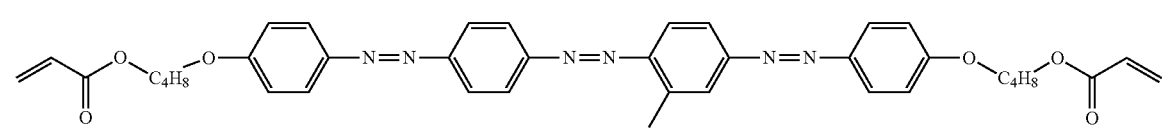

Y1

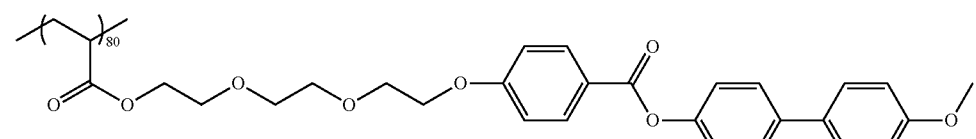

L1

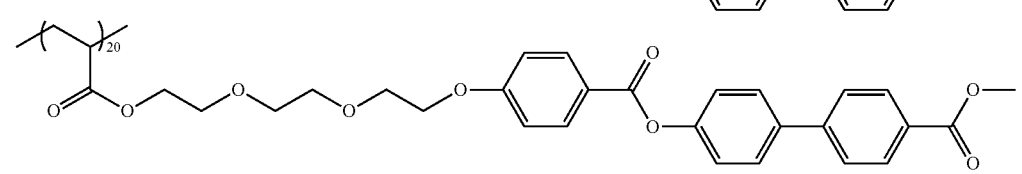

F1

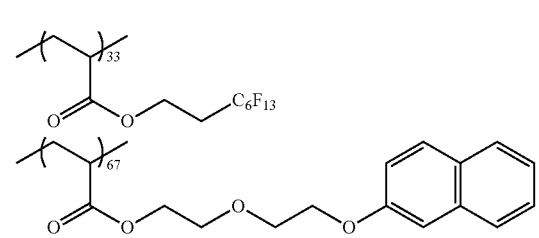

[Formation of Transparent Resin Layer (Barrier Layer) 1]

The polarizer 1 was continuously coated with the following curable composition 1 using a #2 wire bar and dried at 60° C. for 5 minutes.

Next, the polarizer 1 was irradiated under an irradiation condition of an illuminance of 28 mW/cm$^2$ for 60 seconds using a high-pressure mercury lamp so that the curable composition 1 was cured, thereby preparing a laminate in which a transparent resin layer (barrier layer) 1 was formed on the polarizer 1. In this manner, a laminate of Example 1 was obtained.

The cross section of the transparent resin layer 1 was cut using a microtome cutting machine, and the film thickness thereof was measured by observation with a scanning electron microscope (SEM), and the film thickness was approximately 1.0 μm.

| Curable composition 1 | |
|---|---|
| Polymerizable compound KAYARAD PET-30 (manufactured by Nippon Kayaku Co., Ltd.) | 29 parts by mass |
| Polymerization initiator IRGACURE 819 (manufactured by BASF SE) | 1 part by mass |
| Alumina ethanol sol A2K5-10 (manufactured by Kawaken Fine Chemicals Co., Ltd., colloid liquid obtained by dispersing columnar alumina hydrate particles in liquid) | 70 parts by mass |

Kayarad Pet-30

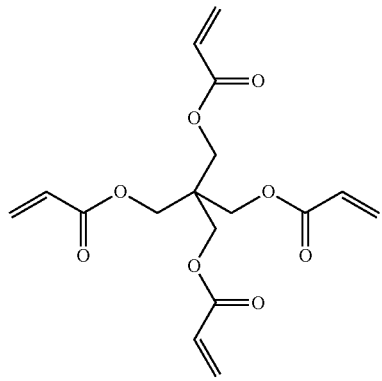

-continued

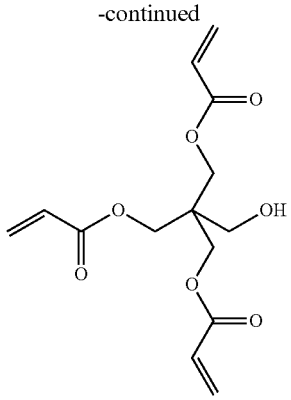

Examples 2 to 19 and Comparative Examples 1 and 2

Each laminate including a polarizer was prepared according to the same procedure as in Example 1 except that the polarizer-forming composition with the composition listed in Tables 1A and 1B was used in place of the polarizer-forming composition 1.

[Polymer Liquid Crystal Compound]

The components used in each example are collectively shown below.

L1

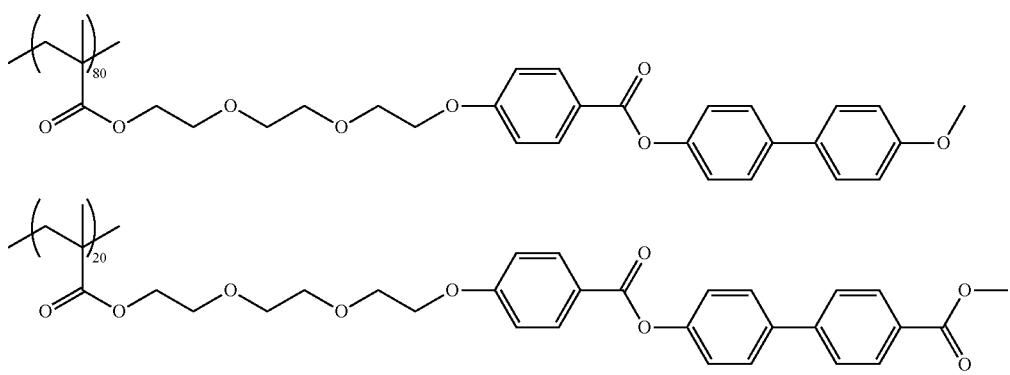

-continued
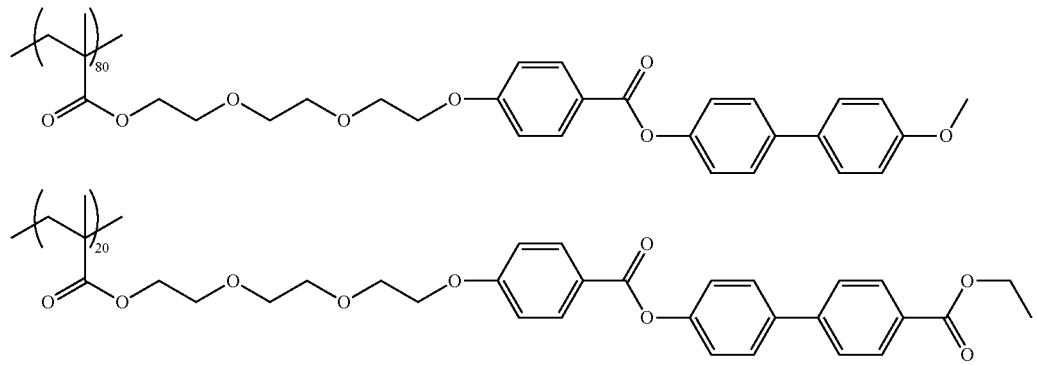
L2
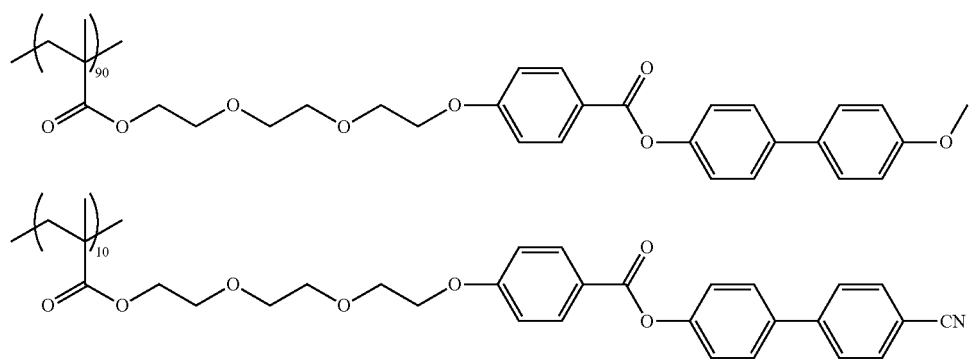
L3
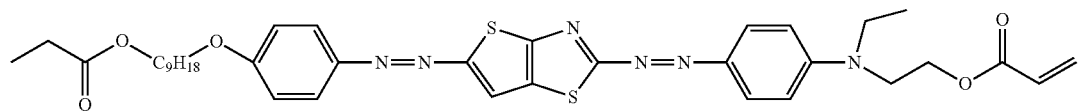
M1
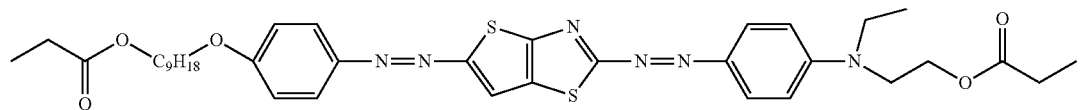
M2
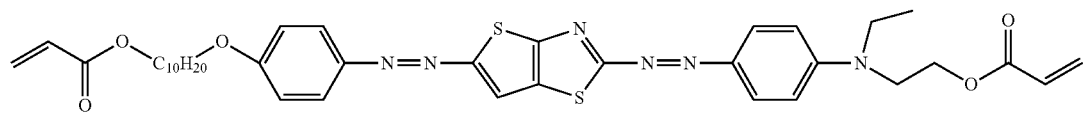
M3
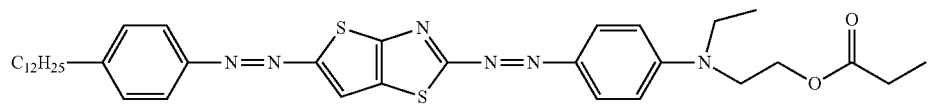
M4
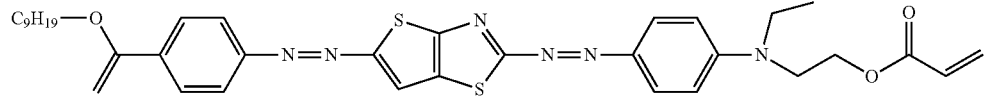
M5
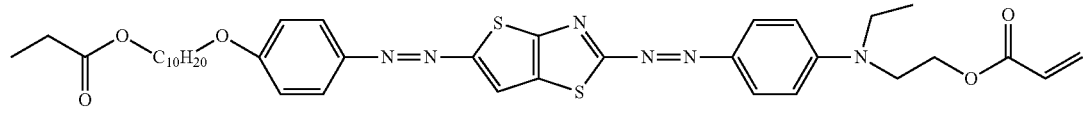
M6
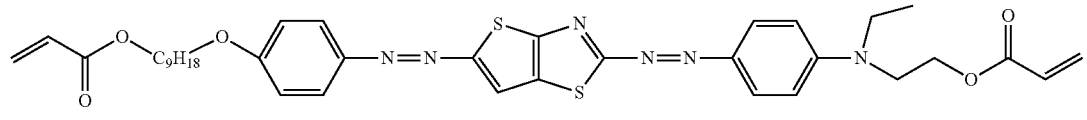
M7

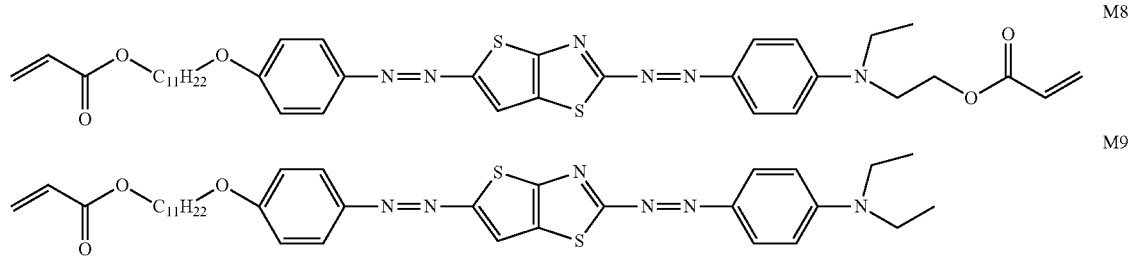
The maximum absorption wavelength of the first dichroic material M is shown below.
M1: 591 nm
M2: 591 nm
M3: 592 nm
M4: 589 nm
M5: 608 nm
M6: 592 nm
M7: 591 nm
M8: 590 nm
M9: 604 nm
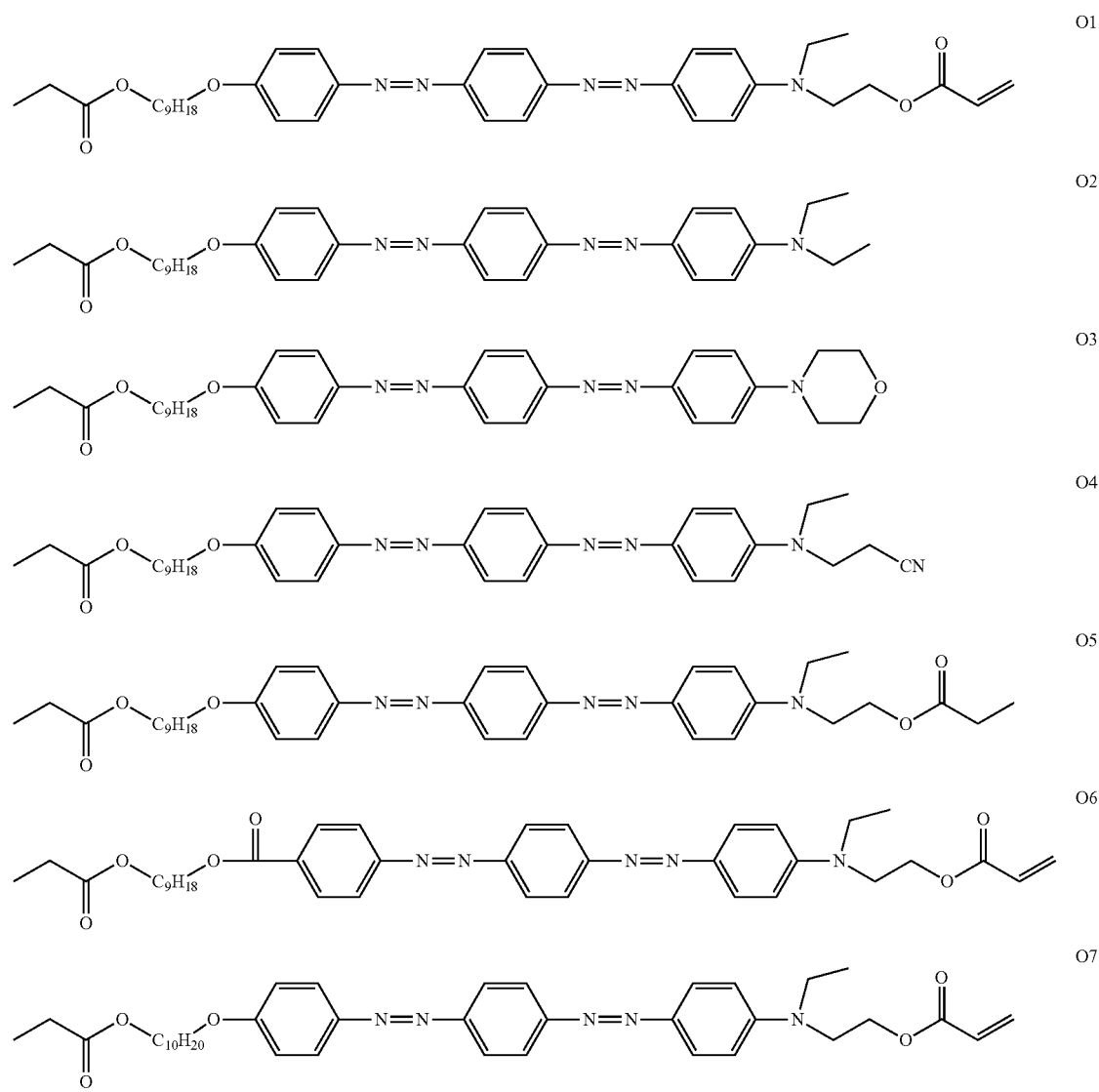

-continued
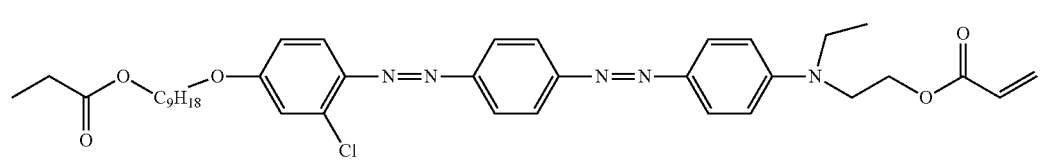
O8
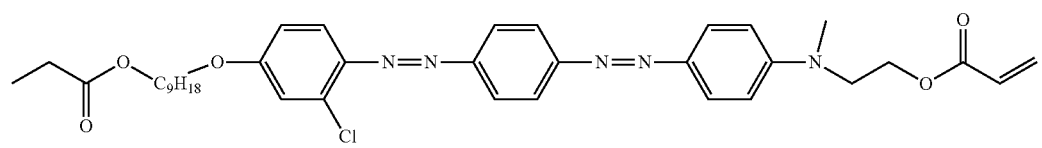
O9
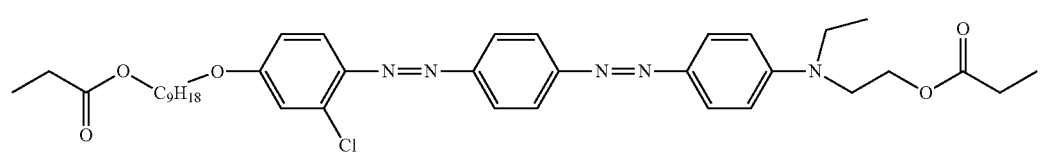
O10
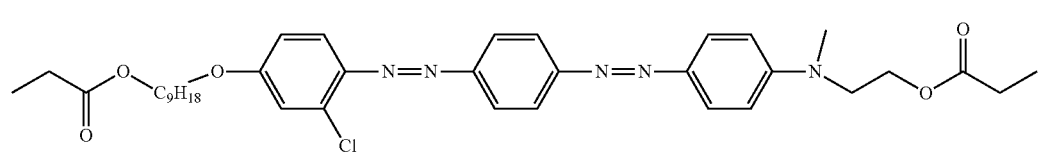
O11
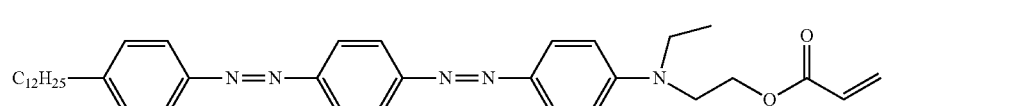
O12
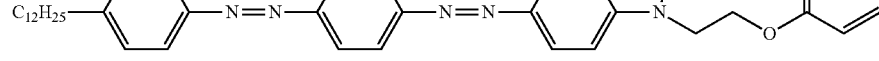
O13
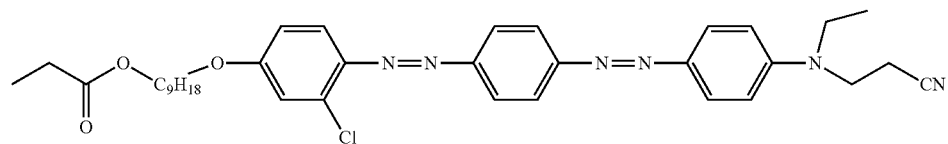
O14
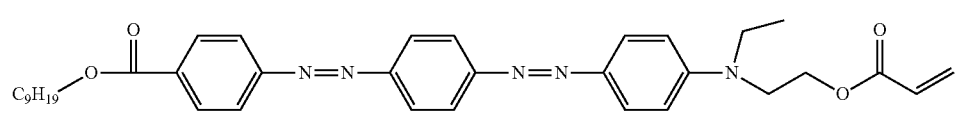
O15
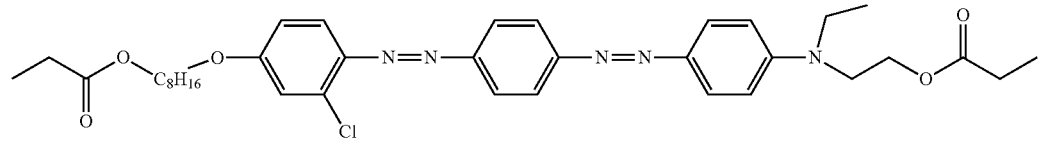
O16
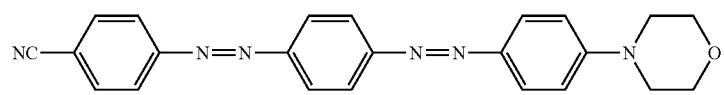
O17
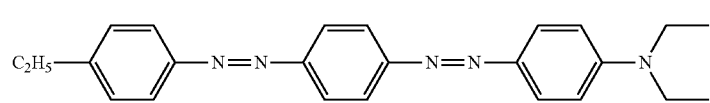
The maximum absorption wavelength of the second dichroic material M is shown below.
O1: 471 nm
O2: 484 nm
O3: 455 nm
O4: 459 nm
O5: 471 nm
O6: 488 nm
O7: 471 nm
O8: 478 nm
O9: 477 nm
O10: 479 nm
O11: 477 nm
O12: 472 nm
O13: 460 nm
O14: 467 nm
O15: 477 nm
O16: 460 nm
O17: 484 nm

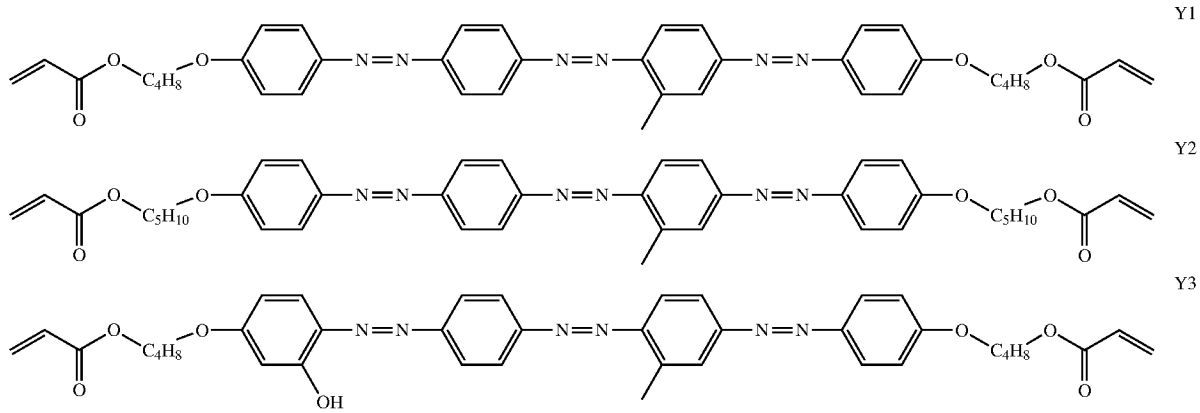

The maximum absorption wavelength of the third dichroic material Y is shown below.

Y1: 418 nm
Y2: 418 nm
Y3: 447 nm

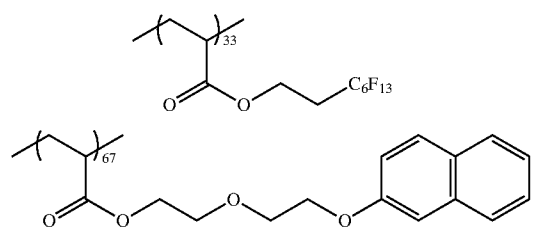

[Evaluation]

The following evaluations were performed on the polarizers of Examples and Comparative Examples obtained as described above.

[Alignment]

Each laminate prepared in the examples and the comparative examples was set on the sample table in a state in which a linear polarizer was inserted on a light source side of an optical microscope (product name, "ECLIPSE E600 POL", manufactured by Nikon Corporation), the absorbance of the polarizer in a wavelength range of 380 nm to 780 nm was measured at a pitch of 1 nm using a multi-channel spectrometer (product name, "QE65000", manufactured by Ocean Optics, Inc.), and an average value of the degrees of alignment in a wavelength range of 400 nm to 700 nm was calculated according to the following equation. The results are listed in Tables 1A and 1B.

Degree of alignment: $S = ((Az0/Ay0) - 1)/((Az0/Ay0) + 2)$

Az0: Absorbance of polarizer with respect to polarized light in absorption axis direction
Ay0: Absorbance of polarizer with respect to polarized light in polarization axis direction

[Maximum Absorption Wavelength]
<Maximum Absorption Wavelength of Example 1>
(Film 1-2)

The alignment film 1 obtained in the above-described manner was continuously coated with the following polarizer-forming composition 1-2 using a #7 wire bar to form a coating film 1-2.

Next, the coating film 1-2 was heated at 140° C. for 90 seconds, and the coating film 1-2 was cooled to room temperature (23° C.).

Subsequently, the coating film was heated at 80° C. for 60 seconds and cooled to room temperature again.

Thereafter, the coating film was irradiated with light for 60 seconds under an irradiation condition of an illuminance of 28 mW/cm² using a high-pressure mercury lamp to prepare a film 1-2.

The film 1-2 does not contain the first dichroic material M1.

| Composition of polarizer-forming composition 1-2 | |
|---|---|
| Second dichroic material O1 | 0.231 parts by mass |
| Third dichroic material Y1 | 0.144 parts by mass |
| Polymer liquid crystal compound L1 | 4.544 parts by mass |
| Interface modifier F1 | 0.039 parts by mass |
| Polymerization initiator IRGACURE 819 (manufactured by BASF SE) | 0.043 parts by mass |
| Cyclopentanone | 66.500 parts by mass |
| Tetrahydrofuran | 28.500 parts by mass |

(Film 1-4)

The alignment film 1 obtained in the above-described manner was continuously coated with the following polarizer-forming composition 1-4 using a #7 wire bar to form a coating film 1-4.

Next, the coating film 1-4 was heated at 140° C. for 90 seconds, and the coating film 1-2 was cooled to room temperature (23° C.).

Next, the coating film 1 was heated at 90° C. for 60 seconds and cooled to room temperature again.

Thereafter, the coating film was irradiated with light for 60 seconds under an irradiation condition of an illuminance of 28 mW/cm² using a high-pressure mercury lamp to prepare a film 1-4.

The film 1-4 does not contain the second dichroic material O1.

| Composition of polarizer-forming composition 1-4 | |
| --- | --- |
| First dichroic material M1 | 0.577 parts by mass |
| Third dichroic material Y1 | 0.143 parts by mass |
| Polymer liquid crystal compound L1 | 4.198 parts by mass |
| Interface modifier F1 | 0.039 parts by mass |
| Polymerization initiator IRGACURE 819 (manufactured by BASF SE) | 0.043 parts by mass |
| Cyclopentanone | 66.500 parts by mass |
| Tetrahydrofuran | 28.500 parts by mass |

(Method of Measuring Maximum Absorption Wavelength)

The absorption spectra of the polarizer 1 (film 1), the film 1-2, and the film 1-4 of Example 1 were respectively obtained by measuring the absorbances in a wavelength range of 380 to 800 nm at a pitch of 1 nm and calculating the absorbance (Abs) for every pitch of 1 nm according to the following equation.

$$Abs = Az0/(1 + 2 \times S)$$

Based on the obtained absorption spectra, the maximum absorption wavelength $\lambda 1$ of the absorption spectrum of the polarizer 1, the maximum absorption wavelength $\lambda 2$ of the absorption spectrum of the film 1-2, and the maximum absorption wavelength $\lambda 4$ of the absorption spectrum of the film 1-4 were acquired. Further, the maximum absorption wavelength $\lambda$ of the difference spectrum obtained by subtracting the absorption spectrum of the film 1-4 from the absorption spectrum of the polarizer 1 was acquired. The results are listed in Tables 1A and 1B.

<Maximum Absorption Wavelengths of Examples 2 to 31 and Comparative Examples 1 and 2>

The films corresponding to each example and each comparative example were prepared, and the maximum absorption wavelength $\lambda 1$, the maximum absorption wavelength $\lambda 2$, the maximum absorption wavelength $\lambda 4$, and the maximum absorption wavelength $\lambda$ of the difference spectrum were acquired in the same manner as in Example 1. The results are shown in Tables 1A-2B.

Examples 32 and 33 and Comparative Example 3

A glass base material (manufactured by Central Glass Co., Ltd., blue plate glass, size of 300 mm×300 mm, thickness of 1.1 mm) was washed with an alkaline detergent, pure water was poured thereinto, and the glass base material was dried.

The dried glass base material was coated with the following composition for forming an alignment film 2 using a #12 wire bar, and the applied composition 2 for forming an alignment film was dried at 110° C. for 2 minutes to form a coating film on the glass base material.

The obtained coating film was subjected to a rubbing treatment (roller rotation speed: 1000 rotations/spacer thickness of 2.9 mm, stage speed of 1.8 m/min) once to prepare an alignment film 2 on the glass base material.

| Composition of composition 1 for forming alignment film | |
| --- | --- |
| Modified vinyl alcohol (see Formula (PVA-1)) | 2.00 parts by mass |
| Water | 74.08 parts by mass |
| Methanol | 23.86 parts by mass |
| Photopolymerization initiator (IRGACURE 2959, manufactured by BASF SE) | 0.06 parts by mass |

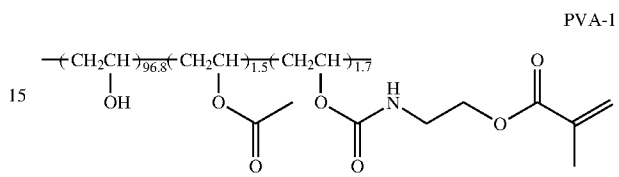

PVA-1

The obtained alignment film 2 was cut into a size of 30 mm×30 mm and spin-coated with the following polarizer-forming composition 32 (including the first dichroic material and the second dichroic material) in Tables 3A and 3B at 800 rotations to form a coating film.

The coating film was dried at room temperature for 30 seconds and further heated at 130° C. for 15 seconds.

Next, the coating film was cooled to room temperature, heated to 90° C., and cooled to room temperature, thereby preparing a polarizer 32 (film 32).

Further, a film 32-2 was prepared according to the same method as described above except that the polarizer-forming composition 32-2 (containing the second dichroic material but not containing the first dichroic material) listed in Tables 3A and 3B was used in place of the polarizer-forming composition 32.

Further, a film 32-4 was prepared according to the same method as described above except that the polarizer-forming composition 32-4 (containing the first dichroic material but not containing the second dichroic material) listed in Tables 3A and 3B was used in place of the polarizer-forming composition 32.

The laminate including the polarizer 33 of Example 33, the film 33-2 and the film 33-4 corresponding to the polarizer 33 (film 33), the laminate including the polarizer 3B (film 3B) of Comparative Example 3, and the films 3B-2 and 3B-4 corresponding to the polarizer 3B were prepared according to the same procedures as in Example 32 except that the polarizer-forming composition listed in Tables 3A and 3B was used.

Next, the maximum absorption wavelength $\lambda 1$, the maximum absorption wavelength $\lambda 2$, the maximum absorption wavelength $\lambda 4$, and the maximum absorption wavelength $\lambda$ of the difference spectrum were acquired. The results are listed in Tables 3A and 3B.

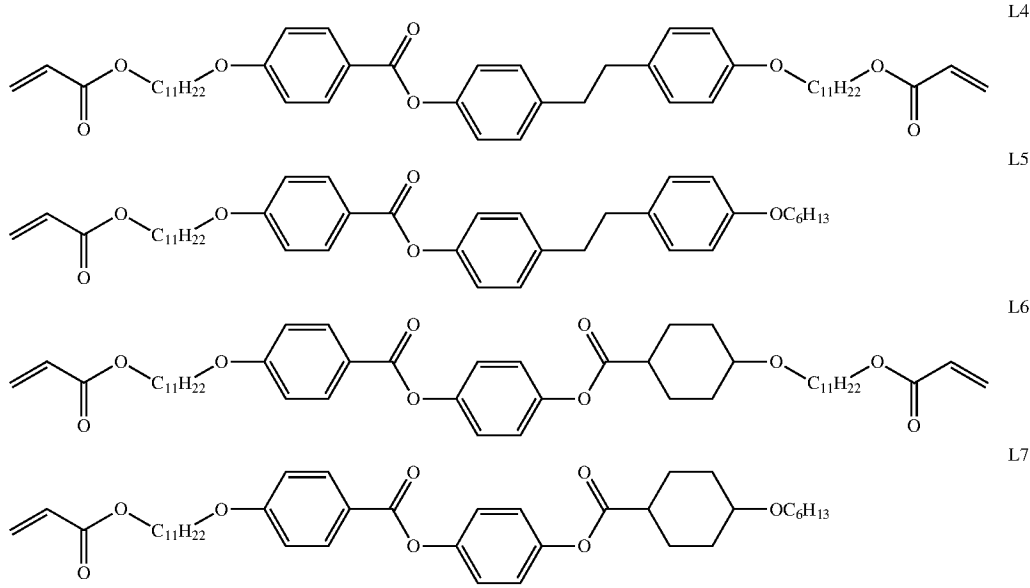

[Xrd Spectrum]
<XRD Spectrum of Example 1>

The film 1-2 and the film 1-3 were prepared in measurement of the XRD spectrum in Example 1. Further, the method of preparing the film 1-2 is as described in the measurement of the maximum absorption wavelength.
(Film 1-3)

The film 1-3 is a film prepared in the same manner as the polarizer 1 except that the following polarizer-forming composition 1-3 was used and does not contain the first dichroic material M1 nor the second dichroic material O1.

| Composition of polarizer-forming composition 1-3 | |
|---|---|
| Third dichroic material Y1 | 0.151 parts by mass |
| Polymer liquid crystal compound L1 | 4.768 parts by mass |
| Interface modifier F1 | 0.039 parts by mass |
| Polymerization initiator IRGACURE 819 (manufactured by BASF SE) | 0.043 parts by mass |
| Cyclopentanone | 66.500 parts by mass |
| Tetrahydrofuran | 28.500 parts by mass |

(Method of Measuring XRD Spectrum)

The XRD spectra of the polarizer 1, the film 1-2, and the film 1-3 of Example 1 were measured. The obtained film (polarizer) was cut into a size of 40 mm×40 mm, the surface of the polarizer was irradiated with X-rays using an X-ray diffractometer for evaluating a thin film (trade name: "SmartLab" manufactured by Rigaku Corporation) under the following conditions, and the in-plane XRD was performed.

Cu ray source (CuKα, output of 45 kV, 200 mA) was used
X-ray incidence angle of 0.2°
Optical system to be used: parallel optical system (cross beam optics (CBO)) (parallel beam (PB))
Incident side, incident slit: 0.2 mm, incident parallel slit in-plane parallel slit collimator (PSC), 0.5 degrees (deg), longitudinal limit slit: 10 mm
Light-receiving side, light-receiving slit: 20 mm, light-receiving parallel slit in-plane parallel slit analyzer (PSA), 0.5 deg
2θχ/φ Scan, scan conditions: 0.008 degrees/step, 2.0 degrees/min in range of 1 to 40 degrees
φ Scan, scan condition: 0.5 degree/step, 9.6 degree/min in range of −120 to 120 degrees A direction in which the polymer liquid crystal and the dichroic material were aligned in a major axis direction was set as an azimuthal angle (φ) of 0°, in-plane measurement (2θχ/φ Scan) was performed in all directions for every 15°, and the orientation in the substrate plane where the peak intensity was high was determined by φ scan performed with respect to the observed peak. Both measurements were performed using CuKα at an incidence angle of 0.20°. The period length was acquired from the relationship between the diffraction angle and the distance using the peaks obtained by the measurement in the alignment direction (the orientation determined as described above). The value was standardized as a film thickness corresponding to the X-ray penetration length at an X-ray incidence angle of 0.2°, and the peak intensity was calculated (cps notation).

$$d = \lambda/(2\times\sin\theta)(d\text{: distance, }\lambda\text{: incident X-ray wavelength }(CuK\alpha; 1.54\text{ Å}))$$

In the film 1-3, peaks were observed at positions where 2θ was 2.8° (period length: 31.6 Å), 4.9° (period length: 18.1 Å), and 7.9° (period length: 11.6 Å) in the direction of 0° (the orientation determined as described above) (see FIG. 5). Meanwhile, in the film 1-2, peaks were observed at positions where 2θ was 6.0° (period length: 14.7 Å) in addition to the peaks at positions where 2θ was 2.8° (period length: 31.6 Å), 4.9° (period length: 18.1 Å), and 7.9° (period length: 11.6 Å) in the direction of 0° (the orientation determined as described above) (see FIG. 4). Therefore, it was found that the peak at 6.0° is the peak derived from the second dichroic material O1. The peak intensity of this peak was 530.

Meanwhile, in the polarizer 1, peaks were observed at positions where 2θ was 2.8° (period length: 31.6 Å), 4.9° (period length: 18.1 Å), and 7.9° (period length: 11.6 Å) (see FIG. 6), but the peak at 6.0° observed in the case of the film 1-2 was not observed.

Therefore, it is assumed that the first dichroic material and the second dichroic material formed an array structure (specifically, a crystal structure) in the polarizer 1 and thus the peaks of the second dichroic material O1 disappeared.

XRD Spectra of Examples 2 to 31 and Comparative Examples 1 and 2

The films of each example and each comparative example were prepared in the same manner as in Example 1 and the states of the peaks derived from the second dichroic material O in the polarizer were observed.

As a result, in the polarizers of Examples 2 to 31, peaks derived from the second dichroic material O disappeared or the peak intensities thereof were smaller than the peak intensities of the peaks derived from the second dichroic material O in the films (that is, the films containing the second dichroic material O but not containing the first dichroic material M) corresponding thereto. Therefore, it is assumed that the first dichroic material and the second dichroic material formed an array structure (specifically, a crystal structure) in the polarizers of Examples 2 to 31.

Meanwhile, in the polarizers of Comparative Examples 1 and 2, the peak intensities of the peaks derived from the second dichroic material O were the same as the peak intensities of the peaks derived from the second dichroic material O in the films (that is, the films containing the second dichroic material O but not containing the first dichroic material M) corresponding thereto. Therefore, it is assumed that the first dichroic material and the second dichroic material formed an array structure in the polarizers of the comparative examples.

Next, a film 2-4 was prepared in the same manner as that for the polarizer 1 except that the following polarizer-forming composition 2-4 was used. The film 2-4 contains the first dichroic material M1 but does not contain the second dichroic material O1.

| Composition of polarizer-forming composition 2-4 | |
|---|---|
| First dichroic material M1 | 0.540 parts by mass |
| Third dichroic material Y1 | 0.153 parts by mass |
| Polymer liquid crystal compound L1 | 5.210 parts by mass |
| Interface modifier F1 | 0.047 parts by mass |

| Composition of polarizer-forming composition 2-4 | |
|---|---|
| Polymerization initiator IRGACURE 819 (manufactured by BASF SE) | 0.051 parts by mass |
| Cyclopentanone | 66.500 parts by mass |
| Tetrahydrofuran | 28.500 parts by mass |

In-plane measurement ($2\theta\chi/\varphi$ scan) was performed on the obtained film 2, film 2-2, film 2-3, and film 2-4 in all directions for every 15° in the same manner as described above, and the orientation in the substrate plane where the peak intensity was high was determined by $\varphi$ scan performed on the observed peaks.

In the film 2-4 (the film containing the second dichroic material but not containing the first dichroic material), the film 2-2 (the film containing the second dichroic material but not containing the first dichroic material), and the film 2-3 (the film not containing the first dichroic material nor the second dichroic material) in a direction of 57° (the orientation determined as described above), peaks were not observed at $2\theta$ of 17° or less (see FIGS. 7, 8, and 9).

Meanwhile, in the film 2 (the film containing the first dichroic material and the second dichroic material), a peak was observed at a position where $2\theta$ was 3.1° (period length: 28.4 Å) (see FIG. 10). The peak intensity of this peak was 560.

Accordingly, it can be determined that the peak at a position where $2\theta$ was 3.1° (period length: 28.4 Å) was a peak of the crystal structure of the first dichroic material and the second dichroic material. Therefore, from this viewpoint, it is assumed that the first dichroic material and the second dichroic material form an array structure (specifically, a crystal structure) in the film 2.

[Stabilization Energy]

In the polarizers of Examples 1, 4 to 7, 12 to 15, and 20 to 31 and Comparative Example 1, the stabilization energy (unit: kcal/mol) and the stabilization energy ratio were calculated using AMBER 11 according to the above-described calculation method. As the stabilization energy decreases, the first dichroic material and the second dichroic material easily form a satisfactory array structure. The calculation results of the stabilization energy and the stabilization energy ratio are listed in Table 4.

In the above-described calculation method, the first dichroic material corresponds to the dichroic material A, and the second dichroic material corresponds to the dichroic material B.

TABLE 1A

| | Liquid crystal compound | | First dichroic material M | | | Second dichroic material O | | | Difference in logP Side chain | Third dichroic material Y | |
|---|---|---|---|---|---|---|---|---|---|---|---|
| | Type | Parts by mass | Type | Parts by mass | logP of side chain | Type | Parts by mass | logP of side chain | | Type | Parts by mass |
| Example 1 | L1 | 4.032 | M1 | 0.555 | 3.67 | O1 | 0.205 | 3.67 | 0 | Y1 | 0.128 |
| Example 2 | L1 | 4.73 | M1 | 0.54 | 3.67 | O1 | 0.48 | 3.67 | 0 | Y1 | 0.153 |
| Example 3 | L2 | 4.026 | M2 | 0.552 | 3.67 | O1 | 0.209 | 3.67 | 0 | Y1 | 0.133 |
| Example 4 | L2 | 4.038 | M1 | 0.546 | 3.67 | O2 | 0.204 | 3.67 | 0 | Y1 | 0.131 |
| Example 5 | L2 | 4.028 | M1 | 0.552 | 3.67 | O3 | 0.206 | 3.67 | 0 | Y1 | 0.133 |
| Example 6 | L1 | 4.018 | M1 | 0.557 | 3.67 | O4 | 0.208 | 3.67 | 0 | Y1 | 0.134 |
| Example 7 | L2 | 4.018 | M1 | 0.557 | 3.67 | O5 | 0.208 | 3.67 | 0 | Y2 | 0.134 |
| Example 8 | L2 | 4.018 | M2 | 0.557 | 3.67 | O6 | 0.208 | 4.09 | −0.42 | Y1 | 0.134 |
| Example 9 | L3 | 3.98 | M3 | 0.594 | 3.73 | O1 | 0.233 | 3.67 | 0.06 | Y3 | 0.109 |
| Example 10 | L1 | 3.999 | M3 | 0.576 | 3.73 | O7 | 0.216 | 3.94 | −0.21 | Y1 | 0.125 |
| Example 11 | L3 | 3.967 | M3 | 0.587 | 3.73 | O4 | 0.219 | 3.67 | 0.06 | Y2 | 0.141 |
| Example 12 | L1 | 4.028 | M1 | 0.552 | 3.67 | O8 | 0.206 | 3.67 | 0 | Y1 | 0.133 |
| Example 13 | L1 | 4.035 | M1 | 0.552 | 3.67 | O9 | 0.205 | 3.67 | 0 | Y1 | 0.127 |
| Example 14 | L1 | 4.032 | M1 | 0.555 | 3.67 | O10 | 0.205 | 3.67 | 0 | Y1 | 0.125 |
| Example 15 | L1 | 4.034 | M1 | 0.554 | 3.67 | O11 | 0.205 | 3.67 | 0 | Y1 | 0.125 |

TABLE 1A-continued

| | Liquid crystal compound | | First dichroic material M | | | Second dichroic material O | | | Difference in logP Side chain | Third dichroic material Y | |
|---|---|---|---|---|---|---|---|---|---|---|---|
| | Type | Parts by mass | Type | Parts by mass | logP of side chain | Type | Parts by mass | logP of side chain | | Type | Parts by mass |
| Example 16 | L3 | 4.018 | M4 | 0.55 | 6.39 | O12 | 0.206 | 6.39 | 0 | Y2 | 0.124 |
| Example 17 | L3 | 4.287 | M2 | 0.396 | 3.67 | O13 | 0.148 | 3.67 | 0 | Y2 | 0.095 |
| Example 18 | L1 | 4.287 | M5 | 0.396 | 3.93 | O14 | 0.148 | 3.93 | 0 | Y1 | 0.095 |
| Example 19 | L1 | 4.061 | M6 | 0.532 | 3.94 | O15 | 0.187 | 2.89 | 1.05 | Y2 | 0.126 |

TABLE 1B

| | Interface modifier | | Polarization initiator | | Tetrahydro-furan | Cyclo-pentanone | Maximum absorption wavelength (nm) | | | | Degree of alignment |
|---|---|---|---|---|---|---|---|---|---|---|---|
| | Type | Parts by mass | Type | Parts by mass | Parts by mass | Parts by mass | λ2 | λ4 | λ1 | λ | |
| Example 1 | F1 | 0.039 | Irgacure 819 | 0.043 | 66.5 | 28.5 | 450 | 618 | 605 | 523 | 0.944 |
| Example 2 | F1 | 0.047 | Irgacure 819 | 0.051 | 65.8 | 28.5 | 445 | 618 | 605 | 523 | 0.941 |
| Example 3 | F1 | 0.039 | Irgacure 819 | 0.042 | 66.5 | 28.5 | 450 | 617 | 606 | 525 | 0.945 |
| Example 4 | F1 | 0.038 | Irgacure 819 | 0.042 | 66.5 | 28.5 | 484 | 617 | 602 | 515 | 0.951 |
| Example 5 | F1 | 0.039 | Irgacure 819 | 0.042 | 66.5 | 28.5 | 450 | 617 | 604 | 460 | 0.954 |
| Example 6 | F1 | 0.039 | Irgacure 819 | 0.043 | 66.5 | 28.5 | 440 | 618 | 610 | 495 | 0.951 |
| Example 7 | F1 | 0.039 | Irgacure 819 | 0.043 | 66.5 | 28.5 | 454 | 617 | 605 | 524 | 0.954 |
| Example 8 | F1 | 0.039 | Irgacure 819 | 0.043 | 66.5 | 28.5 | 488 | 617 | 607 | 500 | 0.938 |
| Example 9 | F1 | 0.04 | Irgacure 819 | 0.044 | 66.5 | 28.5 | 450 | 619 | 606 | 524 | 0.942 |
| Example 10 | F1 | 0.041 | Irgacure 819 | 0.044 | 66.5 | 28.5 | 448 | 617 | 609 | 522 | 0.94 |
| Example 11 | F1 | 0.041 | Irgacure 819 | 0.045 | 66.5 | 28.5 | 440 | 619 | 607 | 496 | 0.94 |
| Example 12 | F1 | 0.039 | Irgacure 819 | 0.042 | 66.5 | 28.5 | 454 | 617 | 604 | 528 | 0.948 |
| Example 13 | F1 | 0.039 | Irgacure 819 | 0.042 | 66.5 | 28.5 | 488 | 618 | 605 | 525 | 0.947 |
| Example 14 | F1 | 0.039 | Irgacure 819 | 0.043 | 66.5 | 28.5 | 456 | 617 | 605 | 521 | 0.95 |
| Example 15 | F1 | 0.039 | Irgacure 819 | 0.042 | 66.5 | 28.5 | 490 | 618 | 604 | 521 | 0.949 |
| Example 16 | F1 | 0.06 | Irgacure 819 | 0.042 | 66.5 | 28.5 | 486 | 625 | 614 | 530 | 0.942 |
| Example 17 | F1 | 0.043 | Irgacure 819 | 0.03 | 66.5 | 28.5 | 466 | 615 | 607 | 494 | 0.942 |
| Example 18 | F1 | 0.043 | Irgacure 819 | 0.03 | 66.5 | 28.5 | 487 | 625 | 613 | 528 | 0.945 |
| Example 19 | F1 | 0.054 | Irgacure 819 | 0.038 | 66.5 | 28.5 | 451 | 617 | 605 | 520 | 0.935 |

TABLE 2A

| | Liquid crystal compound | | First dichroic material M | | | Second dichroic material O | | | Difference in logP Side chain | Third dichroic material Y | |
|---|---|---|---|---|---|---|---|---|---|---|---|
| | Type | Parts by mass | Type | Parts by mass | logP of side chain | Type | Parts by mass | logP of side chain | | Type | Parts by mass |
| Example 20 | L3 | 3.778 | M8 | 0.661 | 4.27 | O1 | 0.247 | 3.67 | 0.6 | Y1 | 0.236 |
| Example 21 | L1 | 3.806 | M8 | 0.662 | 4.27 | O2 | 0.250 | 3.67 | 0.6 | Y1 | 0.214 |
| Example 22 | L2 | 3.85 | M8 | 0.572 | 4.27 | O3 | 0.245 | 3.67 | 0.6 | Y2 | 0.255 |
| Example 23 | L1 | 3.89 | M8 | 0.576 | 4.27 | O4 | 0.228 | 3.67 | 0.6 | Y2 | 0.228 |
| Example 24 | L2 | 3.894 | M8 | 0.556 | 4.27 | O5 | 0.26 | 3.67 | 0.6 | Y1 | 0.202 |
| Example 25 | L1 | 3.875 | M9 | 0.64 | 4.27 | O1 | 0.226 | 3.67 | 0.6 | Y1 | 0.167 |
| Example 26 | L3 | 4.076 | M9 | 0.503 | 4.27 | O2 | 0.195 | 3.67 | 0.6 | Y1 | 0.163 |
| Example 27 | L1 | 4.123 | M9 | 0.532 | 4.27 | O3 | 0.155 | 3.67 | 0.6 | Y2 | 0.124 |
| Example 28 | L1 | 4.114 | M9 | 0.541 | 4.27 | O4 | 0.148 | 3.67 | 0.6 | Y1 | 0.13 |
| Example 29 | L2 | 4.111 | M9 | 0.539 | 4.27 | O5 | 0.15 | 3.67 | 0.6 | Y2 | 0.133 |
| Example 30 | L2 | 4.108 | M8 | 0.464 | 4.27 | O16 | 0.163 | 1.28 | 2.99 | Y3 | 0.199 |
| Example 31 | L3 | 4.123 | M9 | 0.465 | 4.27 | O16 | 0.175 | 1.28 | 2.99 | Y3 | 0.171 |
| Comparative Example 1 | L2 | 4.092 | M1 | 0.209 | 3.67 | O16 | 0.487 | 1.28 | 2.39 | Y1 | 0.132 |
| Comparative Example 2 | L2 | 4.085 | M7 | 0.216 | 3.67 | O17 | 0.505 | −0.71 | 4.38 | Y1 | 0.115 |

TABLE 2B

| | Interface modifier | | Ploarization initiator | | Tetra-hydrofuran | Cyclo-pentanone | Maximum absorption wavelength (nm) | | | | Degree of alignment |
|---|---|---|---|---|---|---|---|---|---|---|---|
| | Type | Parts by mass | Type | Parts by mass | Parts by mass | Parts by mass | λ2 | λ4 | λ1 | λ | |
| Example 20 | F1 | 0.042 | Irgacure 819 | 0.037 | 66.5 | 28.5 | 450 | 619 | 605 | 520 | 0.952 |
| Example 21 | F1 | 0.036 | Irgacure 819 | 0.031 | 66.5 | 28.5 | 445 | 619 | 604 | 514 | 0.953 |
| Example 22 | F1 | 0.042 | Irgacure 819 | 0.036 | 66.5 | 28.5 | 450 | 619 | 608 | 461 | 0.941 |
| Example 23 | F1 | 0.036 | Irgacure 819 | 0.041 | 66.5 | 28.5 | 440 | 619 | 609 | 496 | 0.942 |
| Example 24 | F1 | 0.042 | Irgacure 819 | 0.047 | 66.5 | 28.5 | 454 | 619 | 610 | 525 | 0.944 |
| Example 25 | F1 | 0.048 | Irgacure 819 | 0.043 | 66.5 | 28.5 | 450 | 628 | 614 | 524 | 0.953 |
| Example 26 | F1 | 0.032 | Irgacure 819 | 0.032 | 66.5 | 28.5 | 445 | 628 | 613 | 516 | 0.954 |
| Example 27 | F1 | 0.035 | Irgacure 819 | 0.030 | 66.5 | 28.5 | 450 | 628 | 614 | 464 | 0.951 |
| Example 28 | F1 | 0.036 | Irgacure 819 | 0.031 | 66.5 | 28.5 | 440 | 628 | 613 | 495 | 0.953 |
| Example 29 | F1 | 0.035 | Irgacure 819 | 0.031 | 66.5 | 28.5 | 454 | 628 | 613 | 522 | 0.952 |
| Example 30 | F1 | 0.040 | Irgacure 819 | 0.027 | 66.5 | 28.5 | 460 | 628 | 604 | 469 | 0.937 |
| Example 31 | F1 | 0.039 | Irgacure 819 | 0.026 | 66.5 | 28.5 | 460 | 628 | 617 | 472 | 0.941 |
| Comparative Example 1 | F1 | 0.038 | Irgacure 819 | 0.041 | 66.5 | 28.5 | 460 | 617 | 615 | 461 | 0.919 |
| Comparative Example 2 | F1 | 0.037 | Irgacure 819 | 0.041 | 66.5 | 28.5 | 484 | 618 | 616 | 486 | 0.918 |

TABLE 3A

| | | Liquid crystal compound | | Liquid crystal compound | | First dichroic material M | | | Second dichroic material O | | | Difference in logP Side chain |
|---|---|---|---|---|---|---|---|---|---|---|---|---|
| | Polarizer | Type | Parts by mass | Type | Parts by mass | Type | Parts by mass | logP of side | Type | Parts by mass | logP of side chain | |
| Example 32 | Film 32 | L4 | 4.398 | L5 | 1.466 | M1 | 0.793 | 3.67 | O1 | 0.293 | 3.67 | 0 |
| | Film 32-2 | L4 | 4.96 | L5 | 1.653 | — | — | — | O1 | 0.331 | 3.67 | — |
| | Film 32-4 | L4 | 4.59 | L5 | 1.530 | M1 | 0.828 | 3.67 | — | — | — | — |
| Example 33 | Film 33 | L5 | 4.398 | L7 | 1.466 | M1 | 0.793 | 3.67 | O1 | 0.293 | 3.67 | 0 |
| | Film 33-2 | L6 | 4.96 | L7 | 1.653 | — | — | — | O1 | 0.331 | 3.67 | — |
| | Film 33-4 | L7 | 4.59 | L7 | 1.530 | M1 | 0.828 | 3.67 | — | — | — | — |
| Comparative Example 3 | Film 3B | L4 | 4.398 | L5 | 1.466 | M1 | 0.793 | 3.67 | O16 | 0.293 | 1.28 | 2.39 |
| | Film 3B-2 | L4 | 4.960 | L5 | 1.653 | — | — | — | O1 | 0.331 | 1.28 | — |
| | Film 3B-4 | L4 | 4.59 | L5 | 1.530 | M1 | 0.828 | 3.67 | — | — | — | — |

TABLE 3B

| | Interface modifier | | Polymerization initiator | | Chlroform | Maximum absorption wavelength (nm) | | | | Degree of alignment |
|---|---|---|---|---|---|---|---|---|---|---|
| | Type | Parts by mass | Type | Parts by mass | Parts by mass | λ2 | λ4 | λ1 | λ | |
| Example 32 | F1 | 0.025 | Irgacure 819 | 0.025 | 93 | 470 | 568 | 600 | 480 | 0.933 |
| | F1 | 0.028 | Irgacure 819 | 0.028 | 93 | | | | | — |
| | F1 | 0.026 | Irgacure 819 | 0.026 | 93 | | | | | — |
| Example 33 | F1 | 0.025 | Irgacure 819 | 0.025 | 93 | 472 | 570 | 602 | 482 | 0.935 |
| | F1 | 0.028 | Irgacure 819 | 0.028 | 93 | | | | | — |
| | F1 | 0.026 | Irgacure 819 | 0.026 | 93 | | | | | — |
| Comparative Example 3 | F1 | 0.025 | Irgacure 819 | 0.025 | 93 | 490 | 567 | 565 | 492 | 0.919 |
| | F1 | 0.028 | Irgacure 819 | 0.028 | 93 | | | | | — |
| | F1 | 0.026 | Irgacure 819 | 0.026 | 93 | | | | | — |

TABLE 4

| | Stabilization energy (kcal/mol) | Stabilization energy ratio |
|---|---|---|
| Example 1 | 14.8 | 0.84 |
| Example 4 | 34.4 | 0.62 |
| Example 5 | 28.1 | 0.69 |

TABLE 4-continued

| | Stabilization energy (kcal/mol) | Stabilization energy ratio |
|---|---|---|
| Example 6 | 21.8 | 0.76 |
| Example 7 | 14.8 | 0.84 |
| Example 12 | 15.9 | 0.83 |

TABLE 4-continued

| | Stabilization energy (kcal/mol) | Stabilization energy ratio |
|---|---|---|
| Example 13 | 15.6 | 0.83 |
| Example 14 | 16.5 | 0.82 |
| Example 15 | 16.8 | 0.82 |
| Example 20 | 34.2 | 0.62 |
| Example 21 | 18.8 | 0.79 |
| Example 22 | 42.5 | 0.52 |
| Example 23 | 40.5 | 0.54 |
| Example 24 | 36.6 | 0.59 |
| Example 25 | 5.9 | 0.92 |
| Example 26 | −8.2 | 1.19 |
| Example 27 | −11.3 | 1.03 |
| Example 28 | 13.4 | 0.73 |
| Example 29 | −3.1 | 1.25 |
| Example 30 | 58.6 | 0.34 |
| Example 31 | 43.5 | 0.43 |
| Comparative Example 1 | 72.4 | 0.21 |

The log P difference in Tables 1A-2B indicates a difference in log P value between the group corresponding to R1 in Formula (1) and the group corresponding to R4 in Formula (2) in a case where the first dichroic material M has a structure represented by Formula (1) and the second dichroic material O has a structure represented by Formula (2).

According to the results obtained by measuring the maximum absorption wavelength described above, it is assumed that the first dichroic material and the second dichroic material form an associate in the polarizers of the examples. Further, according to the results obtained by measuring the XRD spectrum, it is assumed that the first dichroic material and the second dichroic material form a crystal structure in the polarizers of the examples. Therefore, it can be said that the first dichroic material and the second dichroic material form an array structure in the polarizers of the examples. As described above, according to the polarizers of the examples in which the first dichroic material and the second dichroic material form an array structure, as shown in the evaluation results of Tables 1A and 1B, the polarizers of the examples have higher degrees of alignment than those of the polarizers of the comparative examples.

EXPLANATION OF REFERENCES

P: polarizer
M: molecule of (first dichroic material)
O: molecule of (second dichroic material)
L: molecule of (liquid crystal compound)
G: aggregate
w: width
a: angle

What is claimed is:
1. A polarizer which is formed of a polarizer-forming composition containing a liquid crystal compound, a first dichroic material comprising one or more molecules, and a second dichroic material that is different from the first dichroic material, comprising one or more molecules,
wherein the first dichroic material is a compound represented by Formula (1),
the second dichroic material is a compound represented by Formula (2), and
when a sum of an energy in a state in which one molecule of the first dichroic material in a super cell of the first dichroic material is replaced with one molecule of the second dichroic material, and an energy of one molecule of the first dichroic material, is set to X1, and
when a sum of an energy of a super cell formed of only the first dichroic material before one molecule of the first dichroic material in the super cell is replaced with one molecule of the second dichroic material, and an energy of one molecule of the second dichroic material, is set to X2,
a stabilization energy ratio, which is a ratio of the X1 to the X2, is 0.22 to 1.50,

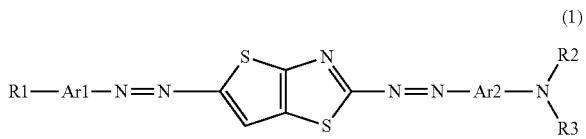

(1)

in Formula (1),
Ar1 and Ar2 each independently represent a phenylene group which may have a substituent or a naphthylene group which may have a substituent,
R1 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group,
R2 and R3 each independently represent a linear or branched alkyl group having 1 to 20 carbo atoms which may be substituted with an acryloyloxy group,

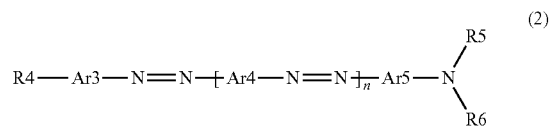

(2)

in Formula (2),
n represents 1 or 2,
Ar3, and Ar4 each independently represent a phenylene group which may have a substituent,
Ar5 represents a phenylene group which may have a substituent, a naphthylene group which may have a substituent, or a heterocyclic group which may have a substituent,
R4 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, R5 and R6 each independently represent a hydrogen atom, a linear or branched alkyl group having 1 to 20 carbon atoms which may have a substituent, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, R5 and R6 may be bonded to each other to form a ring, when R4 represents an alkyl group, at least one carbon atom of the alkyl group in R4 is substituted with —O—, —CO—, —C(O)—O—, —O—C(O)—, —Si(CH$_3$)$_2$—O—Si(CH$_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O, R1' represents a hydrogen atom or a linear or branched alkyl group having 1 to 6 carbon atoms, and when a plurality of (R1')'s are present in each group, these may be the same as or different from one another.

2. The polarizer according to claim 1,
wherein an absolute value of a difference between a maximum absorption wavelength λ2 in an absorption spectrum of a film formed of a composition that contains the second dichroic material and the liquid crystal compound but does not contain the first dichroic material and
a maximum absorption wavelength λ in a difference spectrum between an absorption spectrum of the polarizer and an absorption spectrum of the film formed of the composition that contains the first dichroic material and the liquid crystal compound but does not contain the second dichroic material is greater than 2 nm.

3. The polarizer according to claim 1,
wherein an absolute value of a difference between a maximum absorption wavelength λ4 in an absorption spectrum of a film formed of the composition that contains the first dichroic material and the liquid crystal compound but does not contain the second dichroic material and
a maximum absorption wavelength λ1 in an absorption spectrum of the polarizer is greater than 2 nm.

4. The polarizer according to claim 1,
wherein an intensity of a peak O1 of a periodic structure derived from the second dichroic material in an X-ray diffraction spectrum of the polarizer is different from an intensity of a peak O2 of the periodic structure derived from the second dichroic material in an X-ray diffraction spectrum of a film formed of the composition that contains the second dichroic material and the liquid crystal compound but does not contain the first dichroic material.

5. The polarizer according to claim 4,
wherein a ratio of the intensity of the peak O1 to the intensity of the peak O2 is less than 1.

6. The polarizer according to claim 1,
wherein in a case where an X-ray diffraction spectrum of the polarizer is measured, a peak OM of a periodic structure derived from the first dichroic material and the second dichroic material is detected at a diffraction angle which is different from both a diffraction angle at which a peak M2 of the periodic structure derived from the first dichroic material is detected in the X-ray diffraction spectrum of the film formed of the composition that contains the first dichroic material and the liquid crystal compound but does not contain the second dichroic material and a diffraction angle at which the peak O2 of the periodic structure derived from the second dichroic material is detected in the X-ray diffraction spectrum of the film formed of the composition that contains the second dichroic material and the liquid crystal compound but does not contain the first dichroic material.

7. The polarizer according to claim 1,
wherein a stabilization energy indicating an energy loss when one dichroic material of the first dichroic material and the second dichroic material is incorporated into a structure singly formed of the other dichroic material that is arranged therein is less than 72 kcal/mol.

8. The polarizer according to claim 7,
wherein the stabilization energy is 55 kcal/mol or less.

9. The polarizer according to claim 7,
wherein the stabilization energy is 35 kcal/mol or less.

10. The polarizer according to claim 1,
wherein the first dichroic material is a dichroic material having a maximum absorption wavelength in a range of 560 nm to 700 nm, and
the second dichroic material is a dichroic material having a maximum absorption wavelength at 455 nm or greater and less than 560 nm.

11. The polarizer according to claim 1,
wherein an absolute value of a difference between a log P value of a side chain of the first dichroic material and a log P value of a side chain of the second dichroic material is 2.30 or less.

12. The polarizer according to claim 1,
wherein the polarizer further contains a third dichroic material having a maximum absorption wavelength at 380 nm or greater and less than 455 nm.

13. An image display device comprising:
the polarizer according to claim 1.

* * * * *